United States Patent
Kallai et al.

(10) Patent No.: US 10,063,202 B2
(45) Date of Patent: Aug. 28, 2018

(54) INTELLIGENTLY MODIFYING THE GAIN PARAMETER OF A PLAYBACK DEVICE

(71) Applicant: Sonos, Inc., Santa Barbara, CA (US)

(72) Inventors: Christopher Kallai, Santa Barbara, CA (US); Mike Chamness, Gloucester, MA (US); Michael Darrell Andrew Ericson, Santa Barbara, CA (US)

(73) Assignee: SONOS, INC., Santa Barbara, CA (US)

( * ) Notice: Subject to any disclaimer, the term of this patent is extended or adjusted under 35 U.S.C. 154(b) by 0 days.

(21) Appl. No.: 15/670,769

(22) Filed: Aug. 7, 2017

(65) Prior Publication Data

US 2017/0346459 A1 Nov. 30, 2017

Related U.S. Application Data

(63) Continuation of application No. 13/458,558, filed on Apr. 27, 2012, now Pat. No. 9,729,115.

(51) Int. Cl.
| | |
|---|---|
| *H03G 3/00* | (2006.01) |
| *H03G 3/10* | (2006.01) |
| *H03G 3/30* | (2006.01) |
| *H04R 3/14* | (2006.01) |
| *H04R 5/00* | (2006.01) |

(52) U.S. Cl.
CPC ............. *H03G 3/10* (2013.01); *H03G 3/3005* (2013.01); *H04R 3/14* (2013.01); *H04R 5/00* (2013.01)

(58) Field of Classification Search
None
See application file for complete search history.

(56) References Cited

U.S. PATENT DOCUMENTS

| | | | |
|---|---|---|---|
| 3,956,591 | A | 5/1976 | Gates, Jr. |
| 4,105,974 | A | 8/1978 | Rogers |
| D260,764 | S | 9/1981 | Castagna et al. |
| 4,296,278 | A | 10/1981 | Cullison et al. |
| 4,306,114 | A | 12/1981 | Callahan |
| 4,382,158 | A | 5/1983 | Ohshita et al. |
| 4,509,211 | A | 4/1985 | Robbins |
| D279,779 | S | 7/1985 | Taylor |
| 4,530,091 | A | 7/1985 | Crockett |

(Continued)

FOREIGN PATENT DOCUMENTS

| | | |
|---|---|---|
| CA | 2320451 A1 | 3/2001 |
| CN | 1598767 A | 3/2005 |

(Continued)

OTHER PUBLICATIONS

"884+ Automatic Matrix Mixer Control System," Ivie Technologies, Inc., 2000, pp. 1-4.

(Continued)

*Primary Examiner* — James Mooney

(57) ABSTRACT

Techniques for optimizing a player based on the addition of a second player are disclosed. In an embodiment, when a first player no longer needs to play certain audio frequencies due to the addition of a second player, the gain of the first player is automatically increased as part of the setup process. In another embodiment, when a first player needs to play certain audio frequencies, for example due to the removal of a second player, the gain of the first player is automatically decreased. Many other embodiments are disclosed.

20 Claims, 8 Drawing Sheets

(56) References Cited

U.S. PATENT DOCUMENTS

| | | |
|---|---|---|
| 4,696,037 A | 9/1987 | Fierens |
| 4,701,629 A | 10/1987 | Citroen |
| 4,712,105 A | 12/1987 | Koehler |
| D293,671 S | 1/1988 | Beaumont |
| 4,731,814 A | 3/1988 | Becker et al. |
| 4,816,989 A | 3/1989 | Finn et al. |
| 4,824,059 A | 4/1989 | Butler |
| D301,037 S | 5/1989 | Matsuda |
| 4,845,751 A | 7/1989 | Schwab |
| D304,443 S | 11/1989 | Grinyer et al. |
| D313,023 S | 12/1990 | Kolenda et al. |
| D313,398 S | 1/1991 | Gilchrist |
| D313,600 S | 1/1991 | Weber |
| 4,994,908 A | 2/1991 | Kuban et al. |
| 4,995,778 A | 2/1991 | Bruessel |
| D320,598 S | 10/1991 | Auerbach et al. |
| D322,609 S | 12/1991 | Patton |
| 5,086,385 A | 2/1992 | Launey et al. |
| D326,450 S | 5/1992 | Watanabe |
| D327,060 S | 6/1992 | Wachob et al. |
| 5,151,922 A | 9/1992 | Weiss |
| 5,153,579 A | 10/1992 | Fisch et al. |
| D331,388 S | 12/1992 | Dahnert et al. |
| 5,182,552 A | 1/1993 | Paynting |
| D333,135 S | 2/1993 | Wachob et al. |
| 5,185,680 A | 2/1993 | Kakubo |
| 5,237,327 A | 8/1993 | Saitoh et al. |
| 5,239,458 A | 8/1993 | Suzuki |
| 5,272,757 A | 12/1993 | Scofield et al. |
| 5,299,266 A | 3/1994 | Lumsden |
| D350,531 S | 9/1994 | Tsuji |
| D350,962 S | 9/1994 | Reardon et al. |
| 5,361,381 A | 11/1994 | Short |
| 5,372,441 A | 12/1994 | Louis |
| D354,059 S | 1/1995 | Hendricks |
| D354,751 S | 1/1995 | Hersh et al. |
| D356,093 S | 3/1995 | McCauley et al. |
| D356,312 S | 3/1995 | Althans |
| D357,024 S | 4/1995 | Tokiyama et al. |
| 5,406,634 A | 4/1995 | Anderson et al. |
| 5,430,485 A | 7/1995 | Lankford et al. |
| 5,440,644 A | 8/1995 | Farinelli et al. |
| D362,446 S | 9/1995 | Gasiorek et al. |
| 5,457,448 A | 10/1995 | Totsuka et al. |
| D363,933 S | 11/1995 | Starck |
| 5,467,342 A | 11/1995 | Logston et al. |
| D364,877 S | 12/1995 | Tokiyama et al. |
| D364,878 S | 12/1995 | Green et al. |
| D365,102 S | 12/1995 | Gioscia |
| D366,044 S | 1/1996 | Hara et al. |
| 5,481,251 A | 1/1996 | Buys et al. |
| 5,491,839 A | 2/1996 | Schotz |
| 5,515,345 A | 5/1996 | Barreira et al. |
| 5,519,641 A | 5/1996 | Beers et al. |
| 5,533,021 A | 7/1996 | Branstad et al. |
| D372,716 S | 8/1996 | Thorne |
| 5,553,147 A | 9/1996 | Pineau |
| 5,553,222 A | 9/1996 | Milne et al. |
| 5,553,314 A | 9/1996 | Grube et al. |
| D377,651 S | 1/1997 | Biasotti et al. |
| 5,596,696 A | 1/1997 | Tindell et al. |
| 5,602,992 A | 2/1997 | Danneels |
| 5,623,483 A | 4/1997 | Agrawal et al. |
| 5,625,350 A | 4/1997 | Fukatsu et al. |
| D379,816 S | 6/1997 | Laituri et al. |
| 5,640,388 A | 6/1997 | Woodhead et al. |
| D380,752 S | 7/1997 | Hanson |
| 5,652,749 A | 7/1997 | Davenport et al. |
| D382,271 S | 8/1997 | Akwiwu |
| 5,661,665 A | 8/1997 | Glass et al. |
| 5,668,884 A | 9/1997 | Clair, Jr. et al. |
| 5,673,323 A | 9/1997 | Schotz et al. |
| D384,940 S | 10/1997 | Kono et al. |
| D387,352 S | 12/1997 | Kaneko et al. |
| 5,696,896 A | 12/1997 | Badovinatz et al. |
| D388,792 S | 1/1998 | Nykerk |
| D389,143 S | 1/1998 | Wicks |
| D392,641 S | 3/1998 | Fenner |
| 5,726,989 A | 3/1998 | Dokic |
| D393,628 S | 4/1998 | Ledbetter et al. |
| 5,740,235 A | 4/1998 | Lester et al. |
| 5,742,623 A | 4/1998 | Nuber et al. |
| D394,659 S | 5/1998 | Biasotti et al. |
| 5,751,819 A | 5/1998 | Dorrough |
| 5,761,320 A | 6/1998 | Farinelli et al. |
| 5,774,016 A | 6/1998 | Ketterer |
| D395,889 S | 7/1998 | Gerba et al. |
| 5,787,249 A | 7/1998 | Badovinatz et al. |
| 5,790,543 A | 8/1998 | Cloutier |
| D397,996 S | 9/1998 | Smith |
| 5,808,662 A | 9/1998 | Kinney et al. |
| 5,812,201 A | 9/1998 | Yoo |
| 5,815,689 A | 9/1998 | Shaw et al. |
| 5,818,948 A | 10/1998 | Gulick |
| D401,587 S | 11/1998 | Rudolph |
| 5,832,024 A | 11/1998 | Schotz et al. |
| 5,848,152 A | 12/1998 | Slipy et al. |
| 5,852,722 A | 12/1998 | Hamilton |
| D404,741 S | 1/1999 | Schumaker et al. |
| D405,071 S | 2/1999 | Gambaro |
| 5,867,691 A | 2/1999 | Shiraishi |
| 5,875,233 A | 2/1999 | Cox |
| 5,875,354 A | 2/1999 | Charlton et al. |
| D406,847 S | 3/1999 | Gerba et al. |
| D407,071 S | 3/1999 | Keating |
| 5,887,143 A | 3/1999 | Saito et al. |
| 5,905,768 A | 5/1999 | Maturi et al. |
| D410,927 S | 6/1999 | Yamagishi |
| 5,910,991 A | 6/1999 | Farrar |
| D412,337 S | 7/1999 | Hamano |
| 5,923,869 A | 7/1999 | Kashiwagi et al. |
| 5,923,902 A | 7/1999 | Inagaki |
| 5,946,343 A | 8/1999 | Schotz et al. |
| 5,956,025 A | 9/1999 | Goulden et al. |
| 5,956,088 A | 9/1999 | Shen et al. |
| 5,960,006 A | 9/1999 | Maturi et al. |
| D415,496 S | 10/1999 | Gerba et al. |
| D416,021 S | 11/1999 | Godette et al. |
| 5,984,512 A | 11/1999 | Jones et al. |
| 5,987,611 A | 11/1999 | Freund |
| 5,990,884 A | 11/1999 | Douma et al. |
| 5,991,307 A | 11/1999 | Komuro et al. |
| 5,999,906 A | 12/1999 | Mercs et al. |
| 6,009,457 A | 12/1999 | Moller |
| 6,018,376 A | 1/2000 | Nakatani |
| D420,006 S | 2/2000 | Tonino |
| 6,026,150 A | 2/2000 | Frank et al. |
| 6,029,196 A | 2/2000 | Lenz |
| 6,031,818 A | 2/2000 | Lo et al. |
| 6,032,202 A | 2/2000 | Lea et al. |
| 6,038,614 A | 3/2000 | Chan et al. |
| 6,046,550 A | 4/2000 | Ference et al. |
| 6,061,457 A | 5/2000 | Stockhamer |
| 6,078,725 A | 6/2000 | Tanaka |
| 6,081,266 A | 6/2000 | Sciammarella |
| 6,088,063 A | 7/2000 | Shiba |
| D429,246 S | 8/2000 | Holma |
| D430,143 S | 8/2000 | Renk |
| 6,101,195 A | 8/2000 | Lyons et al. |
| 6,108,485 A | 8/2000 | Kim |
| 6,108,686 A | 8/2000 | Williams, Jr. |
| 6,122,668 A | 9/2000 | Teng et al. |
| D431,552 S | 10/2000 | Backs et al. |
| D432,525 S | 10/2000 | Beecroft |
| 6,127,941 A | 10/2000 | Van Ryzin |
| 6,128,318 A | 10/2000 | Sato |
| 6,148,205 A | 11/2000 | Cotton |
| 6,157,957 A | 12/2000 | Berthaud |
| 6,163,647 A | 12/2000 | Terashima et al. |
| 6,169,725 B1 | 1/2001 | Gibbs et al. |
| 6,175,872 B1 | 1/2001 | Neumann et al. |
| 6,181,383 B1 | 1/2001 | Fox et al. |
| 6,185,737 B1 | 2/2001 | Northcutt et al. |
| 6,195,435 B1 | 2/2001 | Kitamura |

(56) References Cited

U.S. PATENT DOCUMENTS

| | | |
|---|---|---|
| 6,195,436 B1 | 2/2001 | Scibora et al. |
| 6,199,169 B1 | 3/2001 | Voth |
| 6,212,282 B1 | 4/2001 | Mershon |
| 6,246,701 B1 | 6/2001 | Slattery |
| 6,253,293 B1 | 6/2001 | Rao et al. |
| D444,475 S | 7/2001 | Levey et al. |
| 6,255,961 B1 | 7/2001 | Van Ryzin et al. |
| 6,256,554 B1 | 7/2001 | Dilorenzo |
| 6,269,406 B1 | 7/2001 | Dutcher et al. |
| 6,301,012 B1 | 10/2001 | White et al. |
| 6,308,207 B1 | 10/2001 | Tseng et al. |
| 6,310,652 B1 | 10/2001 | Li et al. |
| 6,313,879 B1 | 11/2001 | Kubo et al. |
| 6,321,252 B1 | 11/2001 | Bhola et al. |
| 6,324,586 B1 | 11/2001 | Johnson |
| D452,520 S | 12/2001 | Gotham et al. |
| 6,332,147 B1 | 12/2001 | Moran et al. |
| 6,343,028 B1 | 1/2002 | Kuwaoka |
| 6,349,285 B1 | 2/2002 | Liu et al. |
| 6,349,339 B1 | 2/2002 | Williams |
| 6,351,821 B1 | 2/2002 | Voth |
| 6,353,172 B1 | 3/2002 | Fay et al. |
| 6,356,871 B1 | 3/2002 | Hemkumar et al. |
| 6,404,811 B1 | 6/2002 | Cvetko et al. |
| 6,418,150 B1 | 7/2002 | Staats |
| 6,430,353 B1 | 8/2002 | Honda et al. |
| 6,442,443 B1 | 8/2002 | Fujii et al. |
| D462,339 S | 9/2002 | Allen et al. |
| D462,340 S | 9/2002 | Allen et al. |
| D462,945 S | 9/2002 | Skulley |
| 6,449,642 B2 | 9/2002 | Bourke-Dunphy et al. |
| 6,449,653 B2 | 9/2002 | Klemets et al. |
| 6,456,783 B1 | 9/2002 | Ando et al. |
| 6,463,474 B1 | 10/2002 | Fuh et al. |
| 6,466,832 B1 | 10/2002 | Zuqert et al. |
| 6,469,633 B1 | 10/2002 | Wachter |
| D466,108 S | 11/2002 | Glodava et al. |
| 6,487,296 B1 | 11/2002 | Allen et al. |
| 6,493,832 B1 | 12/2002 | Itakura et al. |
| D468,297 S | 1/2003 | Ikeda |
| 6,522,886 B1 | 2/2003 | Youngs et al. |
| 6,526,325 B1 | 2/2003 | Sussman et al. |
| 6,535,121 B2 | 3/2003 | Matheny et al. |
| D474,763 S | 5/2003 | Tozaki et al. |
| D475,993 S | 6/2003 | Meyer |
| D476,643 S | 7/2003 | Yamagishi |
| D477,310 S | 7/2003 | Moransais |
| 6,587,127 B1 | 7/2003 | Leeke et al. |
| 6,598,172 B1 | 7/2003 | Vandeusen et al. |
| D478,051 S | 8/2003 | Sagawa |
| D478,069 S | 8/2003 | Beck et al. |
| D478,896 S | 8/2003 | Summers |
| 6,604,023 B1 | 8/2003 | Brown et al. |
| 6,611,537 B1 | 8/2003 | Edens et al. |
| D479,520 S | 9/2003 | De |
| D481,056 S | 10/2003 | Kawasaki et al. |
| 6,631,410 B1 | 10/2003 | Kowalski et al. |
| 6,636,269 B1 | 10/2003 | Baldwin |
| 6,653,899 B2 | 11/2003 | Organvidez et al. |
| 6,654,720 B1 | 11/2003 | Graham et al. |
| 6,654,956 B1 | 11/2003 | Trinh et al. |
| 6,658,091 B1 | 12/2003 | Naidoo et al. |
| 6,674,803 B1 | 1/2004 | Kesselring |
| 6,684,060 B1 | 1/2004 | Curtin |
| D486,145 S | 2/2004 | Kaminski et al. |
| 6,687,664 B1 | 2/2004 | Sussman et al. |
| 6,704,421 B1 | 3/2004 | Kitamura |
| 6,741,961 B2 | 5/2004 | Lim |
| D491,925 S | 6/2004 | Griesau et al. |
| 6,757,517 B2 | 6/2004 | Chang |
| D493,148 S | 7/2004 | Shibata et al. |
| 6,763,274 B1 | 7/2004 | Gilbert |
| D495,333 S | 8/2004 | Borsboom |
| 6,778,073 B2 | 8/2004 | Lutter et al. |
| 6,778,493 B1 | 8/2004 | Ishii |
| 6,778,869 B2 | 8/2004 | Champion |
| D496,003 S | 9/2004 | Spira |
| D496,005 S | 9/2004 | Wang |
| D496,335 S | 9/2004 | Spira |
| D497,363 S | 10/2004 | Olson et al. |
| 6,803,964 B1 | 10/2004 | Post et al. |
| 6,809,635 B1 | 10/2004 | Kaaresoja |
| D499,086 S | 11/2004 | Polito |
| 6,816,510 B1 | 11/2004 | Banerjee |
| 6,816,818 B2 | 11/2004 | Wolf et al. |
| 6,823,225 B1 | 11/2004 | Sass |
| 6,826,283 B1 | 11/2004 | Wheeler et al. |
| D499,395 S | 12/2004 | Hsu |
| D499,718 S | 12/2004 | Chen |
| D500,015 S | 12/2004 | Gubbe |
| 6,836,788 B2 | 12/2004 | Kim et al. |
| 6,839,752 B1 | 1/2005 | Miller et al. |
| D501,477 S | 2/2005 | Hall |
| 6,859,460 B1 | 2/2005 | Chen |
| 6,859,538 B1 | 2/2005 | Voltz |
| 6,873,862 B2 | 3/2005 | Reshefsky |
| 6,882,335 B2 | 4/2005 | Saarinen |
| D504,872 S | 5/2005 | Uehara et al. |
| D504,885 S | 5/2005 | Zhang et al. |
| 6,889,207 B2 | 5/2005 | Slemmer et al. |
| 6,898,642 B2 | 5/2005 | Chafle et al. |
| 6,901,439 B1 | 5/2005 | Bonasia et al. |
| D506,463 S | 6/2005 | Daniels |
| 6,907,458 B2 | 6/2005 | Tomassetti et al. |
| 6,912,610 B2 | 6/2005 | Spencer |
| 6,915,347 B2 | 7/2005 | Hanko et al. |
| 6,916,980 B2 | 7/2005 | Ishida et al. |
| 6,917,592 B1 | 7/2005 | Ramankutty et al. |
| 6,919,771 B2 | 7/2005 | Nakajima |
| 6,920,373 B2 | 7/2005 | Xi et al. |
| 6,931,134 B1 | 8/2005 | Waller, Jr. et al. |
| 6,931,557 B2 | 8/2005 | Togawa |
| 6,934,766 B1 | 8/2005 | Russell |
| 6,937,988 B1 | 8/2005 | Hemkumar |
| 6,970,482 B2 | 11/2005 | Kim |
| 6,985,694 B1 | 1/2006 | De Bonet et al. |
| 6,987,767 B2 | 1/2006 | Saito |
| 6,987,947 B2 | 1/2006 | Richenstein et al. |
| D515,072 S | 2/2006 | Lee |
| D515,557 S | 2/2006 | Okuley |
| 7,007,106 B1 | 2/2006 | Flood et al. |
| 7,020,791 B1 | 3/2006 | Aweya et al. |
| D518,475 S | 4/2006 | Yang et al. |
| 7,043,477 B2 | 5/2006 | Mercer et al. |
| 7,043,651 B2 | 5/2006 | Aweya et al. |
| 7,046,677 B2 | 5/2006 | Monta et al. |
| 7,047,308 B2 | 5/2006 | Deshpande |
| 7,054,888 B2 | 5/2006 | Lachapelle et al. |
| 7,058,889 B2 | 6/2006 | Trovato et al. |
| 7,068,596 B1 | 6/2006 | Mou |
| D524,296 S | 7/2006 | Kita |
| 7,072,477 B1 | 7/2006 | Kincaid |
| D527,375 S | 8/2006 | Flora et al. |
| 7,092,528 B2 | 8/2006 | Patrick et al. |
| 7,092,694 B2 | 8/2006 | Griep et al. |
| 7,096,169 B2 | 8/2006 | Crutchfield et al. |
| 7,113,999 B2 | 9/2006 | Pestoni et al. |
| 7,115,017 B1 | 10/2006 | Laursen et al. |
| 7,120,168 B2 | 10/2006 | Zimmermann |
| 7,130,316 B2 | 10/2006 | Kovacevic |
| 7,130,368 B1 | 10/2006 | Aweya et al. |
| 7,130,608 B2 | 10/2006 | Hollstrom et al. |
| 7,130,616 B2 | 10/2006 | Janik |
| 7,136,934 B2 | 11/2006 | Carter et al. |
| 7,139,981 B2 | 11/2006 | Mayer et al. |
| 7,143,141 B1 | 11/2006 | Morgan et al. |
| 7,143,939 B2 | 12/2006 | Henzerling |
| 7,146,260 B2 | 12/2006 | Preston et al. |
| 7,158,488 B2 | 1/2007 | Fujimori |
| 7,161,939 B2 | 1/2007 | Israel et al. |
| 7,162,315 B2 | 1/2007 | Gilbert |
| 7,171,010 B2 | 1/2007 | Martin et al. |
| 7,185,090 B2 | 2/2007 | Kowalski et al. |
| 7,187,947 B1 | 3/2007 | White et al. |

(56) References Cited

U.S. PATENT DOCUMENTS

| | | |
|---|---|---|
| 7,197,148 B2 | 3/2007 | Nourse et al. |
| 7,206,367 B1 | 4/2007 | Moore |
| 7,206,618 B2 | 4/2007 | Latto et al. |
| 7,206,967 B1 | 4/2007 | Marti et al. |
| 7,209,795 B2 | 4/2007 | Sullivan et al. |
| 7,218,708 B2 | 5/2007 | Berezowski et al. |
| 7,236,739 B2 | 6/2007 | Chang |
| 7,236,773 B2 | 6/2007 | Thomas |
| 7,257,398 B1 | 8/2007 | Ukita et al. |
| 7,260,616 B1 | 8/2007 | Cook |
| 7,263,110 B2 | 8/2007 | Fujishiro |
| 7,277,547 B1 | 10/2007 | Delker et al. |
| 7,286,652 B1 | 10/2007 | Azriel et al. |
| 7,289,631 B2 | 10/2007 | Ishidoshiro |
| 7,293,060 B2 | 11/2007 | Komsi |
| 7,295,548 B2 | 11/2007 | Blank et al. |
| 7,302,468 B2 | 11/2007 | Wijeratne |
| 7,305,694 B2 | 12/2007 | Commons et al. |
| 7,308,188 B2 | 12/2007 | Namatame |
| 7,310,334 B1 | 12/2007 | Fitzgerald et al. |
| 7,312,785 B2 | 12/2007 | Tsuk et al. |
| 7,313,593 B1 | 12/2007 | Pulito et al. |
| 7,319,764 B1 | 1/2008 | Reid et al. |
| 7,324,857 B2 | 1/2008 | Goddard |
| 7,330,875 B1 | 2/2008 | Parasnis et al. |
| 7,333,519 B2 | 2/2008 | Sullivan et al. |
| 7,346,332 B2 | 3/2008 | McCarty et al. |
| 7,356,011 B1 | 4/2008 | Waters et al. |
| 7,359,006 B1 | 4/2008 | Xiang et al. |
| 7,366,206 B2 | 4/2008 | Lockridge et al. |
| 7,372,846 B2 | 5/2008 | Zwack |
| 7,391,791 B2 | 6/2008 | Balassanian et al. |
| 7,392,102 B2 | 6/2008 | Sullivan et al. |
| 7,392,481 B2 | 6/2008 | Gewickey et al. |
| 7,400,644 B2 | 7/2008 | Sakamoto et al. |
| 7,412,499 B2 | 8/2008 | Chang et al. |
| 7,424,267 B2 | 9/2008 | Eisenbach |
| 7,428,310 B2 | 9/2008 | Park |
| 7,430,181 B1 | 9/2008 | Hong |
| 7,457,948 B1 | 11/2008 | Bilicksa et al. |
| 7,472,058 B2 | 12/2008 | Tseng et al. |
| 7,474,677 B2 | 1/2009 | Trott |
| 7,483,538 B2 | 1/2009 | McCarty et al. |
| 7,483,540 B2 | 1/2009 | Rabinowitz et al. |
| 7,483,958 B1 | 1/2009 | Elabbady et al. |
| 7,490,044 B2 | 2/2009 | Kulkarni |
| 7,492,912 B2 | 2/2009 | Chung et al. |
| 7,505,889 B2 | 3/2009 | Salmonsen et al. |
| 7,509,181 B2 | 3/2009 | Champion |
| 7,519,188 B2 | 4/2009 | Berardi et al. |
| 7,519,667 B1 | 4/2009 | Capps |
| 7,539,551 B2 | 5/2009 | Komura et al. |
| 7,548,744 B2 | 6/2009 | Oesterling et al. |
| 7,548,851 B2 | 6/2009 | Lau et al. |
| 7,558,224 B1 | 7/2009 | Surazski et al. |
| 7,558,635 B1 | 7/2009 | Thiel et al. |
| 7,561,932 B1 | 7/2009 | Holmes et al. |
| 7,571,014 B1 | 8/2009 | Lambourne et al. |
| 7,574,274 B2 | 8/2009 | Holmes |
| 7,599,685 B2 | 10/2009 | Goldberg et al. |
| 7,606,174 B2 | 10/2009 | Ochi et al. |
| 7,626,952 B2 | 12/2009 | Slemmer et al. |
| 7,627,825 B2 | 12/2009 | Kakuda |
| 7,630,500 B1 | 12/2009 | Beckman et al. |
| 7,630,501 B2 | 12/2009 | Blank et al. |
| 7,631,119 B2 | 12/2009 | Moore et al. |
| 7,643,894 B2 | 1/2010 | Braithwaite et al. |
| 7,653,344 B1 | 1/2010 | Feldman et al. |
| 7,657,224 B2 | 2/2010 | Goldberg et al. |
| 7,657,644 B1 | 2/2010 | Zheng |
| 7,657,910 B1 | 2/2010 | McAulay et al. |
| 7,665,115 B2 | 2/2010 | Gallo et al. |
| 7,668,990 B2 | 2/2010 | Krzyzanowski et al. |
| 7,669,113 B1 | 2/2010 | Moore et al. |
| 7,669,219 B2 | 2/2010 | Scott, III |
| 7,672,470 B2 | 3/2010 | Lee |
| 7,675,943 B2 | 3/2010 | Mosig et al. |
| 7,676,044 B2 | 3/2010 | Sasaki et al. |
| 7,676,142 B1 | 3/2010 | Hung |
| 7,688,306 B2 | 3/2010 | Wehrenberg et al. |
| 7,689,304 B2 | 3/2010 | Sasaki |
| 7,689,305 B2 | 3/2010 | Kreifeldt et al. |
| 7,702,279 B2 | 4/2010 | Ko et al. |
| 7,702,403 B1 | 4/2010 | Gladwin et al. |
| 7,710,941 B2 | 5/2010 | Rietschel et al. |
| 7,711,774 B1 | 5/2010 | Rothschild |
| 7,720,096 B2 | 5/2010 | Klemets |
| 7,721,032 B2 | 5/2010 | Bushell et al. |
| 7,742,740 B2 | 6/2010 | Goldberg et al. |
| 7,742,832 B1 | 6/2010 | Feldman et al. |
| 7,743,009 B2 | 6/2010 | Hangartner et al. |
| 7,746,906 B2 | 6/2010 | Jinzaki et al. |
| 7,761,176 B2 | 7/2010 | Ben-Yaacov et al. |
| 7,765,315 B2 | 7/2010 | Batson et al. |
| RE41,608 E | 8/2010 | Blair et al. |
| 7,792,311 B1 * | 9/2010 | Holmgren ............... H04S 7/308 381/17 |
| 7,793,206 B2 | 9/2010 | Lim et al. |
| 7,804,972 B2 | 9/2010 | Melanson |
| 7,805,210 B2 | 9/2010 | Cucos et al. |
| 7,817,960 B2 | 10/2010 | Tan et al. |
| 7,827,259 B2 | 11/2010 | Heller et al. |
| 7,831,054 B2 | 11/2010 | Ball et al. |
| 7,835,689 B2 | 11/2010 | Goldberg et al. |
| 7,849,181 B2 | 12/2010 | Slemmer et al. |
| 7,853,341 B2 | 12/2010 | McCarty et al. |
| 7,865,137 B2 | 1/2011 | Goldberg et al. |
| 7,882,234 B2 | 2/2011 | Watanabe et al. |
| 7,885,622 B2 | 2/2011 | Krampf et al. |
| 7,907,819 B2 | 3/2011 | Ando et al. |
| 7,916,877 B2 | 3/2011 | Goldberg et al. |
| 7,917,082 B2 | 3/2011 | Goldberg et al. |
| 7,933,418 B2 | 4/2011 | Morishima |
| 7,934,239 B1 | 4/2011 | Dagman |
| 7,945,636 B2 | 5/2011 | Nelson et al. |
| 7,945,708 B2 | 5/2011 | Ohkita |
| 7,958,441 B2 | 6/2011 | Heller et al. |
| 7,962,482 B2 | 6/2011 | Handman et al. |
| 7,966,388 B1 | 6/2011 | Pugaczewski et al. |
| 7,987,294 B2 | 7/2011 | Bryce et al. |
| 7,995,732 B2 | 8/2011 | Koch et al. |
| 7,996,566 B1 | 8/2011 | Sylvain et al. |
| 7,996,588 B2 | 8/2011 | Subbiah et al. |
| 8,014,423 B2 | 9/2011 | Thaler et al. |
| 8,015,306 B2 | 9/2011 | Bowman |
| 8,020,023 B2 | 9/2011 | Millington et al. |
| 8,023,663 B2 | 9/2011 | Goldberg |
| 8,028,038 B2 | 9/2011 | Weel |
| 8,028,323 B2 | 9/2011 | Weel |
| 8,041,062 B2 | 10/2011 | Cohen et al. |
| 8,045,721 B2 | 10/2011 | Burgan et al. |
| 8,045,952 B2 | 10/2011 | Qureshey et al. |
| 8,050,203 B2 | 11/2011 | Jacobsen et al. |
| 8,050,652 B2 | 11/2011 | Qureshey et al. |
| 8,054,987 B2 | 11/2011 | Seydoux |
| 8,055,364 B2 | 11/2011 | Champion |
| 8,063,698 B2 | 11/2011 | Howard |
| 8,074,253 B1 | 12/2011 | Nathan |
| 8,086,287 B2 | 12/2011 | Mooney et al. |
| 8,086,752 B2 | 12/2011 | Millington et al. |
| 8,090,317 B2 | 1/2012 | Burge et al. |
| 8,103,009 B2 | 1/2012 | McCarty et al. |
| 8,111,132 B2 | 2/2012 | Allen et al. |
| 8,112,032 B2 | 2/2012 | Ko et al. |
| 8,116,476 B2 | 2/2012 | Inohara |
| 8,126,172 B2 | 2/2012 | Horbach et al. |
| 8,131,389 B1 | 3/2012 | Hardwick et al. |
| 8,131,390 B2 | 3/2012 | Braithwaite et al. |
| 8,135,141 B2 | 3/2012 | Shiba |
| 8,139,774 B2 | 3/2012 | Berardi et al. |
| 8,144,883 B2 | 3/2012 | Pedersen et al. |
| 8,148,622 B2 | 4/2012 | Rothkopf et al. |
| 8,150,079 B2 | 4/2012 | Maeda et al. |
| 8,160,281 B2 | 4/2012 | Kim et al. |

(56) References Cited

U.S. PATENT DOCUMENTS

| | | |
|---|---|---|
| 8,169,938 B2 | 5/2012 | Duchscher et al. |
| 8,170,222 B2 | 5/2012 | Dunko |
| 8,170,260 B2 | 5/2012 | Reining et al. |
| 8,175,292 B2 | 5/2012 | Aylward et al. |
| 8,175,297 B1 | 5/2012 | Ho et al. |
| 8,185,674 B2 | 5/2012 | Moore et al. |
| 8,189,824 B2 | 5/2012 | Strauss et al. |
| 8,194,874 B2 | 6/2012 | Starobin et al. |
| 8,204,890 B1 | 6/2012 | Gogan |
| 8,208,653 B2 | 6/2012 | Eo et al. |
| 8,214,447 B2 | 7/2012 | Deslippe et al. |
| 8,214,740 B2 | 7/2012 | Johnson |
| 8,214,873 B2 | 7/2012 | Weel |
| 8,218,790 B2 | 7/2012 | Bull et al. |
| 8,229,125 B2 | 7/2012 | Short |
| 8,230,099 B2 | 7/2012 | Weel |
| 8,233,029 B2 | 7/2012 | Yoshida et al. |
| 8,233,632 B1 | 7/2012 | MacDonald et al. |
| 8,233,635 B2 | 7/2012 | Shiba |
| 8,233,648 B2 | 7/2012 | Sorek et al. |
| 8,234,395 B2 | 7/2012 | Millington et al. |
| 8,238,578 B2 | 8/2012 | Aylward |
| 8,239,559 B2 | 8/2012 | Rajapakse |
| 8,239,748 B1 | 8/2012 | Moore et al. |
| 8,243,961 B1 | 8/2012 | Morrill |
| 8,265,310 B2 | 9/2012 | Berardi et al. |
| 8,279,709 B2 | 10/2012 | Choisel et al. |
| 8,281,001 B2 | 10/2012 | Busam et al. |
| 8,285,404 B1 | 10/2012 | Kekki |
| 8,290,185 B2 | 10/2012 | Kim |
| 8,290,603 B1 | 10/2012 | Lambourne |
| 8,300,845 B2 | 10/2012 | Zurek et al. |
| 8,306,235 B2 | 11/2012 | Mahowald |
| 8,311,226 B2 | 11/2012 | Lorgeoux et al. |
| 8,315,555 B2 | 11/2012 | Ko et al. |
| 8,316,147 B2 | 11/2012 | Batson et al. |
| 8,325,931 B2 | 12/2012 | Howard et al. |
| 8,325,935 B2 | 12/2012 | Rutschman |
| 8,331,585 B2 | 12/2012 | Hagen et al. |
| 8,340,330 B2 | 12/2012 | Yoon et al. |
| 8,345,709 B2 | 1/2013 | Nitzpon et al. |
| 8,364,295 B2 | 1/2013 | Beckmann et al. |
| 8,370,678 B2 | 2/2013 | Millington et al. |
| 8,374,595 B2 | 2/2013 | Chien et al. |
| 8,391,501 B2 | 3/2013 | Khawand et al. |
| 8,407,623 B2 | 3/2013 | Kerr et al. |
| 8,411,883 B2 | 4/2013 | Matsumoto |
| 8,423,659 B2 | 4/2013 | Millington |
| 8,423,893 B2 | 4/2013 | Ramsay et al. |
| 8,432,851 B2 | 4/2013 | Xu et al. |
| 8,433,076 B2 | 4/2013 | Zurek et al. |
| 8,442,239 B2 | 5/2013 | Bruelle-Drews et al. |
| 8,452,020 B2 | 5/2013 | Gregg et al. |
| 8,457,334 B2 | 6/2013 | Yoon et al. |
| 8,463,184 B2 | 6/2013 | Dua |
| 8,463,875 B2 | 6/2013 | Katz et al. |
| 8,473,844 B2 | 6/2013 | Kreifeldt et al. |
| 8,477,958 B2 | 7/2013 | Moeller et al. |
| 8,483,853 B1 | 7/2013 | Lambourne |
| 8,498,726 B2 | 7/2013 | Kim et al. |
| 8,509,211 B2 | 8/2013 | Trotter et al. |
| 8,520,870 B2 | 8/2013 | Sato et al. |
| 8,565,455 B2 | 10/2013 | Worrell et al. |
| 8,577,045 B2 | 11/2013 | Gibbs |
| 8,577,048 B2 | 11/2013 | Chaikin et al. |
| 8,588,432 B1 | 11/2013 | Simon |
| 8,588,949 B2 | 11/2013 | Lambourne et al. |
| 8,600,075 B2 | 12/2013 | Lim |
| 8,600,084 B1 | 12/2013 | Garrett |
| 8,611,559 B2 | 12/2013 | Sanders |
| 8,615,091 B2 | 12/2013 | Terwal |
| 8,620,006 B2 | 12/2013 | Berardi et al. |
| 8,639,830 B2 | 1/2014 | Bowman |
| 8,654,995 B2 | 2/2014 | Silber et al. |
| 8,672,744 B1 | 3/2014 | Gronkowski et al. |
| 8,683,009 B2 | 3/2014 | Ng et al. |
| 8,700,730 B2 | 4/2014 | Rowe |
| 8,731,206 B1 | 5/2014 | Park |
| 8,750,282 B2 | 6/2014 | Gelter et al. |
| 8,751,026 B2 | 6/2014 | Sato et al. |
| 8,762,565 B2 | 6/2014 | Togashi et al. |
| 8,775,546 B2 | 7/2014 | Millington |
| 8,788,080 B1 | 7/2014 | Kallai et al. |
| 8,818,538 B2 | 8/2014 | Sakata |
| 8,819,554 B2 | 8/2014 | Basso et al. |
| 8,843,224 B2 | 9/2014 | Holmgren et al. |
| 8,843,228 B2 | 9/2014 | Lambourne |
| 8,843,586 B2 | 9/2014 | Pantos et al. |
| 8,855,319 B2 | 10/2014 | Liu et al. |
| 8,861,739 B2 | 10/2014 | Ojanpera |
| 8,879,761 B2 | 11/2014 | Johnson et al. |
| 8,885,851 B2 | 11/2014 | Westenbroek |
| 8,886,347 B2 | 11/2014 | Lambourne |
| 8,904,066 B2 | 12/2014 | Moore et al. |
| 8,914,559 B2 | 12/2014 | Kalayjian et al. |
| 8,917,877 B2 | 12/2014 | Haaff et al. |
| 8,923,997 B2 | 12/2014 | Kallai et al. |
| 8,930,006 B2 | 1/2015 | Haatainen |
| 8,934,647 B2 | 1/2015 | Joyce et al. |
| 8,934,655 B2 | 1/2015 | Breen et al. |
| 8,942,252 B2 | 1/2015 | Balassanian et al. |
| 8,942,395 B2 | 1/2015 | Lissaman et al. |
| 8,954,177 B2 | 2/2015 | Sanders |
| 8,965,544 B2 | 2/2015 | Ramsay |
| 8,965,546 B2 | 2/2015 | Visser et al. |
| 8,966,394 B2 | 2/2015 | Gates et al. |
| 8,977,974 B2 | 3/2015 | Kraut |
| 8,984,442 B2 | 3/2015 | Pirnack et al. |
| 9,020,153 B2 | 4/2015 | Britt, Jr. |
| 9,042,556 B2 | 5/2015 | Kallai et al. |
| 9,137,602 B2 | 9/2015 | Mayman et al. |
| 9,160,965 B2 | 10/2015 | Redmann et al. |
| 9,219,959 B2 | 12/2015 | Kallai et al. |
| 9,226,073 B2 | 12/2015 | Ramos et al. |
| 9,245,514 B2 | 1/2016 | Donaldson |
| 9,325,286 B1 | 4/2016 | Yang |
| 9,524,098 B2 | 12/2016 | Griffiths et al. |
| 9,607,624 B2 | 3/2017 | Baumgarte et al. |
| 9,608,588 B2 | 3/2017 | Baumgarte et al. |
| 2001/0001160 A1 | 5/2001 | Shoff et al. |
| 2001/0009604 A1 | 7/2001 | Ando et al. |
| 2001/0022823 A1 | 9/2001 | Renaud |
| 2001/0027498 A1 | 10/2001 | Van De Meulenhof et al. |
| 2001/0032188 A1 | 10/2001 | Miyabe et al. |
| 2001/0042107 A1 | 11/2001 | Palm |
| 2001/0043456 A1 | 11/2001 | Atkinson |
| 2001/0046235 A1 | 11/2001 | Trevitt et al. |
| 2001/0047377 A1 | 11/2001 | Sincaglia et al. |
| 2001/0050991 A1 | 12/2001 | Eves |
| 2002/0002039 A1 | 1/2002 | Qureshey et al. |
| 2002/0002562 A1 | 1/2002 | Moran et al. |
| 2002/0002565 A1 | 1/2002 | Ohyama |
| 2002/0003548 A1 | 1/2002 | Krusche et al. |
| 2002/0015003 A1 | 2/2002 | Kato et al. |
| 2002/0022453 A1 | 2/2002 | Balog et al. |
| 2002/0026442 A1 | 2/2002 | Lipscomb et al. |
| 2002/0034374 A1 | 3/2002 | Barton |
| 2002/0042844 A1 | 4/2002 | Chiazzese |
| 2002/0049843 A1 | 4/2002 | Barone et al. |
| 2002/0062406 A1 | 5/2002 | Chang et al. |
| 2002/0065926 A1 | 5/2002 | Hackney et al. |
| 2002/0067909 A1 | 6/2002 | Iivonen |
| 2002/0072816 A1 | 6/2002 | Shdema et al. |
| 2002/0072817 A1 | 6/2002 | Champion |
| 2002/0073228 A1 | 6/2002 | Cognet et al. |
| 2002/0078161 A1 | 6/2002 | Cheng |
| 2002/0078293 A1 | 6/2002 | Kou et al. |
| 2002/0080783 A1 | 6/2002 | Fujimori |
| 2002/0090914 A1 | 7/2002 | Kang et al. |
| 2002/0093478 A1 | 7/2002 | Yeh |
| 2002/0095460 A1 | 7/2002 | Benson |
| 2002/0098878 A1 | 7/2002 | Mooney et al. |
| 2002/0101357 A1 | 8/2002 | Gharapetian |
| 2002/0103635 A1 | 8/2002 | Mesarovic et al. |

(56) References Cited

U.S. PATENT DOCUMENTS

| | | |
|---|---|---|
| 2002/0109710 A1 | 8/2002 | Holtz et al. |
| 2002/0112244 A1 | 8/2002 | Liou et al. |
| 2002/0114354 A1 | 8/2002 | Sinha et al. |
| 2002/0114359 A1 | 8/2002 | Ibaraki et al. |
| 2002/0124097 A1 | 9/2002 | Isely et al. |
| 2002/0129156 A1 | 9/2002 | Yoshikawa |
| 2002/0131398 A1 | 9/2002 | Taylor |
| 2002/0131761 A1 | 9/2002 | Kawasaki et al. |
| 2002/0136335 A1 | 9/2002 | Liou et al. |
| 2002/0137505 A1 | 9/2002 | Eiche et al. |
| 2002/0143547 A1 | 10/2002 | Fay et al. |
| 2002/0143998 A1 | 10/2002 | Rajagopal et al. |
| 2002/0159596 A1 | 10/2002 | Durand et al. |
| 2002/0163361 A1 | 11/2002 | Parkin |
| 2002/0165721 A1 | 11/2002 | Chang et al. |
| 2002/0165921 A1 | 11/2002 | Sapieyevski |
| 2002/0168938 A1 | 11/2002 | Chang |
| 2002/0173273 A1 | 11/2002 | Spurgat et al. |
| 2002/0177411 A1 | 11/2002 | Yajima et al. |
| 2002/0181355 A1 | 12/2002 | Shikunami et al. |
| 2002/0184310 A1 | 12/2002 | Traversat et al. |
| 2002/0188762 A1 | 12/2002 | Tomassetti et al. |
| 2002/0194309 A1 | 12/2002 | Carter et al. |
| 2002/0196951 A1 | 12/2002 | Tsai |
| 2003/0002609 A1 | 1/2003 | Faller et al. |
| 2003/0002689 A1 | 1/2003 | Folio |
| 2003/0008616 A1 | 1/2003 | Anderson |
| 2003/0014486 A1 | 1/2003 | May |
| 2003/0018797 A1 | 1/2003 | Dunning et al. |
| 2003/0020763 A1 | 1/2003 | Mayer et al. |
| 2003/0023741 A1 | 1/2003 | Tomassetti et al. |
| 2003/0031333 A1 | 2/2003 | Cohen et al. |
| 2003/0035072 A1 | 2/2003 | Hagg |
| 2003/0035444 A1 | 2/2003 | Zwack |
| 2003/0041173 A1 | 2/2003 | Hoyle |
| 2003/0041174 A1 | 2/2003 | Wen et al. |
| 2003/0043856 A1 | 3/2003 | Lakaniemi et al. |
| 2003/0043924 A1 | 3/2003 | Haddad et al. |
| 2003/0055892 A1 | 3/2003 | Huitema et al. |
| 2003/0061428 A1 | 3/2003 | Garney et al. |
| 2003/0063755 A1 | 4/2003 | Nourse et al. |
| 2003/0066094 A1 | 4/2003 | Van Der Schaar et al. |
| 2003/0067437 A1 | 4/2003 | McClintock et al. |
| 2003/0073432 A1 | 4/2003 | Meade |
| 2003/0091322 A1 | 5/2003 | Van Der Schaar |
| 2003/0097478 A1 | 5/2003 | King |
| 2003/0099212 A1 | 5/2003 | Anjum et al. |
| 2003/0099221 A1 | 5/2003 | Rhee |
| 2003/0101253 A1 | 5/2003 | Saito et al. |
| 2003/0103088 A1 | 6/2003 | Dresti et al. |
| 2003/0110329 A1 | 6/2003 | Higaki et al. |
| 2003/0126211 A1 | 7/2003 | Anttila et al. |
| 2003/0135822 A1 | 7/2003 | Evans |
| 2003/0157951 A1 | 8/2003 | Hasty |
| 2003/0161479 A1 | 8/2003 | Yang et al. |
| 2003/0167335 A1 | 9/2003 | Alexander |
| 2003/0172123 A1 | 9/2003 | Polan et al. |
| 2003/0177889 A1 | 9/2003 | Koseki et al. |
| 2003/0179780 A1 | 9/2003 | Walker et al. |
| 2003/0185400 A1 | 10/2003 | Yoshizawa et al. |
| 2003/0195964 A1 | 10/2003 | Mane |
| 2003/0198254 A1 | 10/2003 | Sullivan et al. |
| 2003/0198255 A1 | 10/2003 | Sullivan et al. |
| 2003/0198257 A1 | 10/2003 | Sullivan et al. |
| 2003/0200001 A1 | 10/2003 | Goddard |
| 2003/0204273 A1 | 10/2003 | Dinker et al. |
| 2003/0204509 A1 | 10/2003 | Dinker et al. |
| 2003/0210796 A1 | 11/2003 | McCarty et al. |
| 2003/0212802 A1 | 11/2003 | Rector et al. |
| 2003/0219007 A1 | 11/2003 | Barrack et al. |
| 2003/0227478 A1 | 12/2003 | Chatfield |
| 2003/0229900 A1 | 12/2003 | Reisman |
| 2003/0231208 A1 | 12/2003 | Hanon et al. |
| 2003/0231871 A1 | 12/2003 | Ushimaru |
| 2003/0235304 A1 | 12/2003 | Evans et al. |
| 2004/0001106 A1 | 1/2004 | Deutscher et al. |
| 2004/0001484 A1 | 1/2004 | Ozguner |
| 2004/0001591 A1 | 1/2004 | Mani et al. |
| 2004/0008852 A1 | 1/2004 | Also et al. |
| 2004/0010727 A1 | 1/2004 | Fujinami |
| 2004/0012620 A1 | 1/2004 | Buhler et al. |
| 2004/0014426 A1 | 1/2004 | Moore |
| 2004/0015252 A1 | 1/2004 | Aiso et al. |
| 2004/0019497 A1 | 1/2004 | Volk et al. |
| 2004/0019807 A1 | 1/2004 | Freund et al. |
| 2004/0019911 A1 | 1/2004 | Gates et al. |
| 2004/0023697 A1 | 2/2004 | Komura |
| 2004/0024478 A1 | 2/2004 | Hans et al. |
| 2004/0024925 A1 | 2/2004 | Cypher et al. |
| 2004/0027166 A1 | 2/2004 | Mangum et al. |
| 2004/0032348 A1 | 2/2004 | Lai et al. |
| 2004/0032421 A1 | 2/2004 | Williamson et al. |
| 2004/0037433 A1 | 2/2004 | Chen |
| 2004/0041836 A1 | 3/2004 | Zaner et al. |
| 2004/0042629 A1 | 3/2004 | Mellone et al. |
| 2004/0044742 A1 | 3/2004 | Evron et al. |
| 2004/0048569 A1 | 3/2004 | Kawamura |
| 2004/0059842 A1 | 3/2004 | Hanson et al. |
| 2004/0059965 A1 | 3/2004 | Marshall et al. |
| 2004/0066736 A1 | 4/2004 | Kroeger |
| 2004/0071299 A1 | 4/2004 | Yoshino |
| 2004/0075767 A1 | 4/2004 | Neuman et al. |
| 2004/0078383 A1 | 4/2004 | Mercer et al. |
| 2004/0080671 A1 | 4/2004 | Siemens et al. |
| 2004/0093096 A1 | 5/2004 | Huang et al. |
| 2004/0098754 A1 | 5/2004 | Vella et al. |
| 2004/0111473 A1 | 6/2004 | Lysenko et al. |
| 2004/0117044 A1 | 6/2004 | Konetski |
| 2004/0117462 A1 | 6/2004 | Bodin et al. |
| 2004/0128701 A1 | 7/2004 | Kaneko et al. |
| 2004/0131192 A1 | 7/2004 | Metcalf |
| 2004/0133689 A1 | 7/2004 | Vasisht |
| 2004/0143368 A1 | 7/2004 | May et al. |
| 2004/0143852 A1 | 7/2004 | Meyers |
| 2004/0147224 A1 | 7/2004 | Lee |
| 2004/0148237 A1 | 7/2004 | Bittmann et al. |
| 2004/0168081 A1 | 8/2004 | Ladas et al. |
| 2004/0170383 A1 | 9/2004 | Mazur |
| 2004/0171346 A1 | 9/2004 | Lin |
| 2004/0177167 A1 | 9/2004 | Iwamura et al. |
| 2004/0179554 A1 | 9/2004 | Tsao |
| 2004/0183827 A1 | 9/2004 | Putterman et al. |
| 2004/0185773 A1 | 9/2004 | Gerber et al. |
| 2004/0203354 A1 | 10/2004 | Yue |
| 2004/0203378 A1 | 10/2004 | Powers |
| 2004/0203590 A1 | 10/2004 | Shteyn |
| 2004/0208158 A1 | 10/2004 | Fellman et al. |
| 2004/0213230 A1 | 10/2004 | Douskalis et al. |
| 2004/0220687 A1 | 11/2004 | Klotz et al. |
| 2004/0223622 A1 | 11/2004 | Lindemann et al. |
| 2004/0224638 A1 | 11/2004 | Fadell et al. |
| 2004/0225389 A1 | 11/2004 | Ledoux et al. |
| 2004/0228367 A1 | 11/2004 | Mosig et al. |
| 2004/0248601 A1 | 12/2004 | Chang |
| 2004/0249490 A1 | 12/2004 | Sakai |
| 2004/0249965 A1 | 12/2004 | Huggins et al. |
| 2004/0249982 A1 | 12/2004 | Arnold et al. |
| 2004/0252400 A1 | 12/2004 | Blank et al. |
| 2004/0253969 A1 | 12/2004 | Nguyen et al. |
| 2005/0002535 A1 | 1/2005 | Liu et al. |
| 2005/0010691 A1 | 1/2005 | Oyadomari et al. |
| 2005/0011388 A1 | 1/2005 | Kouznetsov |
| 2005/0013394 A1 | 1/2005 | Rausch et al. |
| 2005/0015551 A1 | 1/2005 | Eames et al. |
| 2005/0021470 A1 | 1/2005 | Martin et al. |
| 2005/0021590 A1 | 1/2005 | Debique et al. |
| 2005/0027821 A1 | 2/2005 | Alexander et al. |
| 2005/0031135 A1 | 2/2005 | Devantier et al. |
| 2005/0047605 A1 | 3/2005 | Lee et al. |
| 2005/0058149 A1 | 3/2005 | Howe |
| 2005/0060435 A1 | 3/2005 | Xue et al. |
| 2005/0062637 A1 | 3/2005 | El Zabadani et al. |
| 2005/0069153 A1 | 3/2005 | Hall et al. |
| 2005/0081213 A1 | 4/2005 | Suzuoki et al. |

(56) References Cited

U.S. PATENT DOCUMENTS

| | | |
|---|---|---|
| 2005/0100174 A1 | 5/2005 | Howard et al. |
| 2005/0105052 A1 | 5/2005 | McCormick et al. |
| 2005/0114538 A1 | 5/2005 | Rose |
| 2005/0120128 A1 | 6/2005 | Willes et al. |
| 2005/0125222 A1 | 6/2005 | Brown et al. |
| 2005/0125357 A1 | 6/2005 | Saadat et al. |
| 2005/0131558 A1 | 6/2005 | Braithwaite et al. |
| 2005/0144284 A1 | 6/2005 | Ludwig et al. |
| 2005/0147261 A1 | 7/2005 | Yeh |
| 2005/0154766 A1 | 7/2005 | Huang et al. |
| 2005/0159833 A1 | 7/2005 | Giaimo et al. |
| 2005/0160270 A1 | 7/2005 | Goldberg et al. |
| 2005/0166135 A1 | 7/2005 | Burke et al. |
| 2005/0168630 A1 | 8/2005 | Yamada et al. |
| 2005/0177256 A1 | 8/2005 | Shintani et al. |
| 2005/0177643 A1 | 8/2005 | Xu |
| 2005/0181348 A1 | 8/2005 | Carey et al. |
| 2005/0195205 A1 | 9/2005 | Abrams |
| 2005/0195823 A1 | 9/2005 | Chen et al. |
| 2005/0197725 A1 | 9/2005 | Alexander et al. |
| 2005/0198574 A1 | 9/2005 | Lamkin et al. |
| 2005/0201549 A1 | 9/2005 | Dedieu et al. |
| 2005/0216556 A1 | 9/2005 | Manion et al. |
| 2005/0254505 A1 | 11/2005 | Chang et al. |
| 2005/0262217 A1 | 11/2005 | Nonaka et al. |
| 2005/0266798 A1 | 12/2005 | Moloney et al. |
| 2005/0266826 A1 | 12/2005 | Vlad |
| 2005/0281255 A1 | 12/2005 | Davies et al. |
| 2005/0283820 A1 | 12/2005 | Richards et al. |
| 2005/0288805 A1 | 12/2005 | Moore et al. |
| 2005/0289224 A1 | 12/2005 | Deslippe et al. |
| 2005/0289244 A1 | 12/2005 | Sahu et al. |
| 2006/0041616 A1 | 2/2006 | Ludwig et al. |
| 2006/0041639 A1 | 2/2006 | Lamkin et al. |
| 2006/0072489 A1 | 4/2006 | Toyoshima |
| 2006/0095516 A1 | 5/2006 | Wijeratne |
| 2006/0098936 A1 | 5/2006 | Ikeda et al. |
| 2006/0119497 A1 | 6/2006 | Miller et al. |
| 2006/0143236 A1 | 6/2006 | Wu |
| 2006/0149402 A1 | 7/2006 | Chung |
| 2006/0155721 A1 | 7/2006 | Grunwald et al. |
| 2006/0173844 A1 | 8/2006 | Zhang et al. |
| 2006/0179160 A1 | 8/2006 | Uehara et al. |
| 2006/0193454 A1 | 8/2006 | Abou-Chakra et al. |
| 2006/0193482 A1 | 8/2006 | Harvey et al. |
| 2006/0199538 A1 | 9/2006 | Eisenbach |
| 2006/0205349 A1 | 9/2006 | Passier et al. |
| 2006/0222186 A1 | 10/2006 | Paige et al. |
| 2006/0227985 A1 | 10/2006 | Kawanami |
| 2006/0229752 A1 | 10/2006 | Chung |
| 2006/0259649 A1 | 11/2006 | Hsieh et al. |
| 2006/0270395 A1 | 11/2006 | Dhawan et al. |
| 2006/0294569 A1 | 12/2006 | Chung |
| 2007/0003067 A1 | 1/2007 | Gierl et al. |
| 2007/0003075 A1 | 1/2007 | Cooper et al. |
| 2007/0022207 A1 | 1/2007 | Millington et al. |
| 2007/0038999 A1 | 2/2007 | Millington et al. |
| 2007/0043847 A1 | 2/2007 | Carter et al. |
| 2007/0047712 A1 | 3/2007 | Gross et al. |
| 2007/0048713 A1 | 3/2007 | Plastina et al. |
| 2007/0054680 A1 | 3/2007 | Mo et al. |
| 2007/0071255 A1* | 3/2007 | Schobben ............ H04R 3/007 381/98 |
| 2007/0087686 A1 | 4/2007 | Holm et al. |
| 2007/0142022 A1 | 6/2007 | Madonna et al. |
| 2007/0142944 A1 | 6/2007 | Goldberg et al. |
| 2007/0143493 A1 | 6/2007 | Mullig et al. |
| 2007/0169115 A1 | 7/2007 | Ko et al. |
| 2007/0180137 A1 | 8/2007 | Rajapakse |
| 2007/0189544 A1 | 8/2007 | Rosenberg |
| 2007/0192156 A1 | 8/2007 | Gauger |
| 2007/0206829 A1 | 9/2007 | Weinans et al. |
| 2007/0223725 A1 | 9/2007 | Neumann et al. |
| 2007/0249295 A1 | 10/2007 | Ukita et al. |
| 2007/0265031 A1 | 11/2007 | Koizumi et al. |
| 2007/0271388 A1 | 11/2007 | Bowra et al. |
| 2007/0288610 A1 | 12/2007 | Saint Clair et al. |
| 2007/0299778 A1 | 12/2007 | Haveson et al. |
| 2008/0002836 A1 | 1/2008 | Moeller et al. |
| 2008/0007649 A1 | 1/2008 | Bennett |
| 2008/0007650 A1 | 1/2008 | Bennett |
| 2008/0007651 A1 | 1/2008 | Bennett |
| 2008/0018785 A1 | 1/2008 | Bennett |
| 2008/0022320 A1 | 1/2008 | Ver Steeg |
| 2008/0025535 A1 | 1/2008 | Rajapakse |
| 2008/0045140 A1 | 2/2008 | Korhonen |
| 2008/0065232 A1 | 3/2008 | Igoe |
| 2008/0066094 A1 | 3/2008 | Igoe |
| 2008/0066120 A1 | 3/2008 | Igoe |
| 2008/0072816 A1 | 3/2008 | Riess et al. |
| 2008/0075295 A1 | 3/2008 | Mayman et al. |
| 2008/0077261 A1 | 3/2008 | Baudino et al. |
| 2008/0077619 A1 | 3/2008 | Gilley et al. |
| 2008/0077620 A1 | 3/2008 | Gilley et al. |
| 2008/0086318 A1 | 4/2008 | Gilley et al. |
| 2008/0091771 A1 | 4/2008 | Allen et al. |
| 2008/0092204 A1 | 4/2008 | Bryce et al. |
| 2008/0120429 A1 | 5/2008 | Millington et al. |
| 2008/0126943 A1 | 5/2008 | Parasnis et al. |
| 2008/0144861 A1 | 6/2008 | Melanson et al. |
| 2008/0144864 A1 | 6/2008 | Huon |
| 2008/0146289 A1 | 6/2008 | Korneluk et al. |
| 2008/0152165 A1 | 6/2008 | Zacchi |
| 2008/0159545 A1 | 7/2008 | Takumai et al. |
| 2008/0162668 A1 | 7/2008 | Miller |
| 2008/0189272 A1 | 8/2008 | Powers et al. |
| 2008/0205070 A1 | 8/2008 | Osada |
| 2008/0212786 A1 | 9/2008 | Park |
| 2008/0215169 A1 | 9/2008 | Debettencourt et al. |
| 2008/0242222 A1 | 10/2008 | Bryce et al. |
| 2008/0247554 A1 | 10/2008 | Caffrey |
| 2008/0263010 A1 | 10/2008 | Roychoudhuri et al. |
| 2008/0303947 A1 | 12/2008 | Ohnishi et al. |
| 2009/0011798 A1 | 1/2009 | Yamada |
| 2009/0017868 A1 | 1/2009 | Ueda et al. |
| 2009/0031336 A1 | 1/2009 | Chavez et al. |
| 2009/0060219 A1 | 3/2009 | Inohara |
| 2009/0070434 A1 | 3/2009 | Himmelstein |
| 2009/0089327 A1 | 4/2009 | Kalaboukis et al. |
| 2009/0097672 A1 | 4/2009 | Buil et al. |
| 2009/0100189 A1 | 4/2009 | Bahren et al. |
| 2009/0124289 A1 | 5/2009 | Nishida |
| 2009/0157905 A1 | 6/2009 | Davis |
| 2009/0164655 A1 | 6/2009 | Pettersson et al. |
| 2009/0169030 A1 | 7/2009 | Inohara |
| 2009/0180632 A1 | 7/2009 | Goldberg et al. |
| 2009/0193345 A1 | 7/2009 | Wensley et al. |
| 2009/0222115 A1 | 9/2009 | Malcolm et al. |
| 2009/0228919 A1 | 9/2009 | Zott et al. |
| 2009/0232326 A1 | 9/2009 | Gordon et al. |
| 2009/0251604 A1 | 10/2009 | Iyer |
| 2010/0004983 A1 | 1/2010 | Dickerson et al. |
| 2010/0010651 A1 | 1/2010 | Kirkeby et al. |
| 2010/0031366 A1 | 2/2010 | Knight et al. |
| 2010/0049835 A1 | 2/2010 | Ko et al. |
| 2010/0052843 A1 | 3/2010 | Cannistraro |
| 2010/0067716 A1 | 3/2010 | Katayama |
| 2010/0087089 A1 | 4/2010 | Struthers et al. |
| 2010/0142735 A1 | 6/2010 | Yoon et al. |
| 2010/0153097 A1 | 6/2010 | Hotho et al. |
| 2010/0228740 A1 | 9/2010 | Cannistraro et al. |
| 2010/0272270 A1 | 10/2010 | Chaikin et al. |
| 2010/0284389 A1 | 11/2010 | Ramsay et al. |
| 2010/0290643 A1 | 11/2010 | Mihelich et al. |
| 2010/0299639 A1 | 11/2010 | Ramsay et al. |
| 2011/0001632 A1 | 1/2011 | Hohorst |
| 2011/0002487 A1 | 1/2011 | Panther et al. |
| 2011/0044476 A1 | 2/2011 | Burlingame et al. |
| 2011/0066943 A1 | 3/2011 | Brillon et al. |
| 2011/0110533 A1 | 5/2011 | Choi et al. |
| 2011/0170710 A1 | 7/2011 | Son |
| 2011/0228944 A1 | 9/2011 | Croghan et al. |
| 2011/0299696 A1 | 12/2011 | Holmgren et al. |
| 2011/0316768 A1 | 12/2011 | McRae |

(56) References Cited

U.S. PATENT DOCUMENTS

| | | |
|---|---|---|
| 2012/0029671 A1 | 2/2012 | Millington |
| 2012/0030366 A1 | 2/2012 | Collart et al. |
| 2012/0047435 A1 | 2/2012 | Holladay et al. |
| 2012/0051558 A1 | 3/2012 | Kim et al. |
| 2012/0051567 A1 | 3/2012 | Castor-Perry |
| 2012/0060046 A1 | 3/2012 | Millington |
| 2012/0127831 A1 | 5/2012 | Gicklhorn et al. |
| 2012/0129446 A1 | 5/2012 | Ko et al. |
| 2012/0148075 A1* | 6/2012 | Goh .................... H04S 7/301 381/303 |
| 2012/0185771 A1 | 7/2012 | Rothkopf et al. |
| 2012/0192071 A1 | 7/2012 | Millington |
| 2012/0207290 A1 | 8/2012 | Moyers et al. |
| 2012/0237054 A1 | 9/2012 | Eo et al. |
| 2012/0263325 A1 | 10/2012 | Freeman et al. |
| 2012/0281058 A1 | 11/2012 | Laney et al. |
| 2012/0290621 A1 | 11/2012 | Heitz, III et al. |
| 2013/0010970 A1 | 1/2013 | Hegarty et al. |
| 2013/0018960 A1 | 1/2013 | Knysz et al. |
| 2013/0028443 A1 | 1/2013 | Pance et al. |
| 2013/0031475 A1 | 1/2013 | Maor et al. |
| 2013/0038726 A1 | 2/2013 | Kim |
| 2013/0041954 A1 | 2/2013 | Kim et al. |
| 2013/0047084 A1 | 2/2013 | Sanders et al. |
| 2013/0051572 A1 | 2/2013 | Goh et al. |
| 2013/0052940 A1 | 2/2013 | Brillhart et al. |
| 2013/0070093 A1 | 3/2013 | Rivera et al. |
| 2013/0080599 A1 | 3/2013 | Ko et al. |
| 2013/0094670 A1 | 4/2013 | Millington |
| 2013/0124664 A1 | 5/2013 | Fonseca, Jr. et al. |
| 2013/0129122 A1 | 5/2013 | Johnson et al. |
| 2013/0132837 A1 | 5/2013 | Mead et al. |
| 2013/0159126 A1 | 6/2013 | Elkady |
| 2013/0167029 A1 | 6/2013 | Friesen et al. |
| 2013/0174100 A1 | 7/2013 | Seymour et al. |
| 2013/0174223 A1 | 7/2013 | Dykeman et al. |
| 2013/0179163 A1 | 7/2013 | Herbig et al. |
| 2013/0191454 A1 | 7/2013 | Oliver et al. |
| 2013/0197682 A1 | 8/2013 | Millington |
| 2013/0208911 A1 | 8/2013 | Millington |
| 2013/0208921 A1 | 8/2013 | Millington |
| 2013/0226323 A1 | 8/2013 | Millington |
| 2013/0230175 A1 | 9/2013 | Bech et al. |
| 2013/0232416 A1 | 9/2013 | Millington |
| 2013/0243199 A1 | 9/2013 | Kallai et al. |
| 2013/0253679 A1 | 9/2013 | Lambourne |
| 2013/0253934 A1 | 9/2013 | Parekh et al. |
| 2013/0259254 A1 | 10/2013 | Xiang et al. |
| 2013/0279706 A1 | 10/2013 | Marti |
| 2013/0287186 A1 | 10/2013 | Quady |
| 2013/0290504 A1 | 10/2013 | Quady |
| 2013/0293345 A1 | 11/2013 | Lambourne |
| 2014/0006483 A1 | 1/2014 | Garmark et al. |
| 2014/0016784 A1 | 1/2014 | Sen et al. |
| 2014/0016786 A1 | 1/2014 | Sen |
| 2014/0016802 A1 | 1/2014 | Sen |
| 2014/0023196 A1 | 1/2014 | Xiang et al. |
| 2014/0037097 A1 | 2/2014 | Labosco |
| 2014/0064501 A1 | 3/2014 | Olsen et al. |
| 2014/0075308 A1 | 3/2014 | Sanders et al. |
| 2014/0075311 A1 | 3/2014 | Boettcher et al. |
| 2014/0079242 A1 | 3/2014 | Nguyen et al. |
| 2014/0108929 A1 | 4/2014 | Garmark et al. |
| 2014/0112481 A1 | 4/2014 | Li et al. |
| 2014/0123005 A1 | 5/2014 | Forstall et al. |
| 2014/0140530 A1 | 5/2014 | Gomes-Casseres et al. |
| 2014/0161265 A1 | 6/2014 | Chaikin et al. |
| 2014/0181569 A1 | 6/2014 | Millington et al. |
| 2014/0219456 A1 | 8/2014 | Morrell et al. |
| 2014/0226823 A1 | 8/2014 | Sen et al. |
| 2014/0242913 A1 | 8/2014 | Pang |
| 2014/0256260 A1 | 9/2014 | Ueda et al. |
| 2014/0267148 A1 | 9/2014 | Luna et al. |
| 2014/0270202 A1 | 9/2014 | Ivanov et al. |
| 2014/0273859 A1 | 9/2014 | Luna et al. |
| 2014/0279889 A1 | 9/2014 | Luna |
| 2014/0285313 A1 | 9/2014 | Luna et al. |
| 2014/0286496 A1 | 9/2014 | Luna et al. |
| 2014/0294200 A1 | 10/2014 | Baumgarte et al. |
| 2014/0298174 A1 | 10/2014 | Ikonomov |
| 2014/0323036 A1 | 10/2014 | Daley et al. |
| 2014/0344689 A1 | 11/2014 | Scott et al. |
| 2014/0355768 A1 | 12/2014 | Sen et al. |
| 2014/0355794 A1 | 12/2014 | Morrell et al. |
| 2014/0378056 A1 | 12/2014 | Liu |
| 2015/0019670 A1 | 1/2015 | Redmann |
| 2015/0026613 A1 | 1/2015 | Kwon et al. |
| 2015/0032844 A1 | 1/2015 | Tarr et al. |
| 2015/0043736 A1 | 2/2015 | Olsen et al. |
| 2015/0049248 A1 | 2/2015 | Wang et al. |
| 2015/0063610 A1 | 3/2015 | Mossner |
| 2015/0074527 A1 | 3/2015 | Sevigny et al. |
| 2015/0074528 A1 | 3/2015 | Sakalowsky et al. |
| 2015/0098576 A1 | 4/2015 | Sundaresan et al. |
| 2015/0139210 A1 | 5/2015 | Marin et al. |
| 2015/0146886 A1 | 5/2015 | Baumgarte |
| 2015/0201274 A1 | 7/2015 | Ellner et al. |
| 2015/0256954 A1 | 9/2015 | Carlsson et al. |
| 2015/0281866 A1 | 10/2015 | Williams et al. |
| 2015/0304288 A1 | 10/2015 | Balasaygun et al. |
| 2015/0365987 A1 | 12/2015 | Weel |

FOREIGN PATENT DOCUMENTS

| | | |
|---|---|---|
| CN | 101292500 A | 10/2008 |
| EP | 0251584 A2 | 1/1988 |
| EP | 0672985 A1 | 9/1995 |
| EP | 0772374 A2 | 5/1997 |
| EP | 1111527 A2 | 6/2001 |
| EP | 1122931 A2 | 8/2001 |
| EP | 1133896 B1 | 8/2002 |
| EP | 1312188 A1 | 5/2003 |
| EP | 1389853 A1 | 2/2004 |
| EP | 2713281 | 4/2004 |
| EP | 1517464 A2 | 3/2005 |
| EP | 0895427 A3 | 1/2006 |
| EP | 1416687 B1 | 8/2006 |
| EP | 1410686 | 3/2008 |
| EP | 2043381 A2 | 4/2009 |
| EP | 2161950 A2 | 3/2010 |
| EP | 1825713 B1 | 10/2012 |
| EP | 0742674 B1 | 4/2014 |
| EP | 2591617 B1 | 6/2014 |
| EP | 2860992 A1 | 4/2015 |
| GB | 2284327 A | 5/1995 |
| GB | 2338374 | 12/1999 |
| GB | 2379533 A | 3/2003 |
| GB | 2486183 | 6/2012 |
| JP | 63269633 | 11/1988 |
| JP | 07-210129 | 8/1995 |
| JP | 2000149391 A | 5/2000 |
| JP | 2001034951 | 2/2001 |
| JP | 2002111817 | 4/2002 |
| JP | 2002123267 A | 4/2002 |
| JP | 2002358241 A | 12/2002 |
| JP | 2003037585 | 2/2003 |
| JP | 2003506765 A | 2/2003 |
| JP | 2003101958 | 4/2003 |
| JP | 2003169089 A | 6/2003 |
| JP | 2005108427 | 4/2005 |
| JP | 2005136457 | 5/2005 |
| JP | 2007241652 A | 9/2007 |
| JP | 2009506603 A | 2/2009 |
| JP | 2009135750 | 6/2009 |
| JP | 2009218888 | 9/2009 |
| JP | 2009535708 | 10/2009 |
| JP | 2009538006 A | 10/2009 |
| JP | 2011010183 A | 1/2011 |
| JP | 2011130496 | 6/2011 |
| JP | 2011176581 | 9/2011 |
| TW | 439027 | 6/2001 |
| WO | 199525313 | 9/1995 |
| WO | 1999023560 | 5/1999 |
| WO | 199961985 | 12/1999 |

(56) References Cited

FOREIGN PATENT DOCUMENTS

| WO | 0019693 | A1 | 4/2000 |
|---|---|---|---|
| WO | 2000019693 | A1 | 4/2000 |
| WO | 0110125 | A1 | 2/2001 |
| WO | 200153994 | | 7/2001 |
| WO | 02073851 | | 9/2002 |
| WO | 03093950 | A2 | 11/2003 |
| WO | 2003093950 | A2 | 11/2003 |
| WO | 2005013047 | A2 | 2/2005 |
| WO | 2007023120 | A1 | 3/2007 |
| WO | 2007127485 | | 11/2007 |
| WO | 2007131555 | | 11/2007 |
| WO | 2007135581 | A2 | 11/2007 |
| WO | 2008082350 | A1 | 7/2008 |
| WO | 2008114389 | A1 | 9/2008 |
| WO | 2012050927 | | 4/2012 |
| WO | 2012137190 | A1 | 10/2012 |
| WO | 2013012582 | | 1/2013 |
| WO | 2014004182 | | 1/2014 |
| WO | 2014149533 | A2 | 9/2014 |
| WO | 2015024881 | A1 | 2/2015 |

OTHER PUBLICATIONS

Advanced Driver Tab User Interface WaveLan GUI Guide, AVAGO0009, Agere Systems, Feb. 2004, 4 pages.
Advisory Action dated Feb. 2, 2016, issued in connection with U.S. Appl. No. 13/848,921, filed Mar. 22, 2013, 8 pages.
Advisory Action dated Sep. 18, 2008, issued in connection with U.S. Appl. No. 10/816,217, filed Apr. 1, 2004, 8 pages.
Advisory Action dated Feb. 1, 2016, issued in connection with U.S. Appl. No. 13/864,247, filed Apr. 17, 2013, 6 pages.
Advisory Action dated Jun. 1, 2015, issued in connection with U.S. Appl. No. 14/516,867, filed Oct. 17, 2014, 11 pages.
Advisory Action dated Mar. 2, 2015, issued in connection with U.S. Appl. No. 13/848,932, filed Mar. 22, 2013, 3 pages.
Advisory Action dated Jan. 5, 2012, issued in connection with U.S. Appl. No. 12/035,112, filed Feb. 21, 2008, 3 pages.
Advisory Action dated Oct. 5, 2015, issued in connection with U.S. Appl. No. 13/458,558, filed Apr. 27, 2012, 4 pages.
Advisory Action dated Sep. 5, 2014, issued in connection with U.S. Appl. No. 13/907,666, filed May 31, 2013, 3 pages.
Advisory Action dated Oct. 6, 2016, issued in connection with U.S. Appl. No. 13/458,558, filed Apr. 27, 2012, 4 pages.
Advisory Action dated Jan. 8, 2015, issued in connection with U.S. Appl. No. 13/705,176, filed Dec. 5, 2012, 4 pages.
Advisory Action dated Jun. 9, 2016, issued in connection with U.S. Appl. No. 13/871,795, filed Apr. 25, 2013, 3pages.
Advisory Action dated Feb. 10, 2016, issued in connection with U.S. Appl. No. 13/871,795, filed Apr. 26, 2013, 3 pages.
Advisory Action dated Nov. 12, 2014, issued in connection with U.S. Appl. No. 13/907,666, filed May 31, 2013, 6 pages.
Advisory Action dated Apr. 15, 2015, issued in connection with U.S. Appl. No. 14/184,526, filed Feb. 19, 2014, 9 pages.
Advisory Action dated Apr. 15, 2015, issued in connection with U.S. Appl. No. 14/184,935, filed Feb. 20, 2014, 9 pages.
Advisory Action dated Dec. 22, 2011, issued in connection with U.S. Appl. No. 11/853,790, filed Sep. 11, 2007, 2 pages.
Advisory Action dated Mar. 25, 2015, issued in connection with U.S. Appl. No. 13/533,105, filed Jun. 26, 2012, 5 pages.
Advisory Action dated Feb. 26, 2015, issued in connection with U.S. Appl. No. 14/184,528, filed Feb. 19, 2014, 3 pages.
Advisory Action dated Nov. 26, 2014, issued in connection with U.S. Appl. No. 14/186,850, filed Feb. 21, 2014, 9 pages.
Advisory Action dated Jul. 28, 2015, issued in connection with U.S. Appl. No. 14/184,522, filed Feb. 19, 2014, 7 pages.
Advisory Action dated Sep. 28, 2009, issued in connection with U.S. Appl. No. 10/816,217, filed Apr. 1, 2004, 4 pages.
Agere Systems' Voice-over-Wireless LAN (VoWLAN) Station Quality of Service, AVAGO0015, Agere Systems, Jan. 2005, 5 pages.

Akyildiz et al., "Multimedia Group Synchronization Protocols for Integrated Services Networks," IEEE Journal on Selected Areas in Communications, 1996 pp. 162-173, vol. 14, No. 1.
Anonymous, "Information technology—Generic coding of moving pictures and associated audio information—Part 3: Audio," ISO/IEC 13818-3, Apr. 1998, pp. 11.
Anonymous, "Transmission Control Protocol," RFC: 793, USC/Information Sciences Institute, Sep. 1981, 91 pages.
Audio Authority: How to Install and Use the Model 1154 Signal Sensing Auto Selector, 2002, 4 pages.
Audio Authority: Model 1154B High Definition AV Auto Selector, 2008, 8 pages.
AudioSource: AMP 100 User Manual, 2003, 4 pages.
AudioTron Quick Start Guide, Version 1.0, Mar. 2001, 24 pages.
AudioTron Reference Manual, Version 3.0, May 2002, 70 pages.
AudioTron Setup Guide, Version 3.0, May 2002, 38 pages.
Automatic Profile Hunting Functional Description, AVAGO0013, Agere Systems, Feb. 2004, 2 pages.
"A/V Surround Receiver AVR-5800," Denon Electronics, 2000, 2 pages.
"A/V System Controleer, Owner's Manual," B&K Compontents, Ltd., 1998, 52 pages.
AVTransport:1 Service Template Version 1.01 for UPnP, Version 1.0 (Jun. 25, 2002) (66 pages).
AXIS Communication: AXIS P8221 Network I/O Audio Module, 2009, 41 pages.
Baldwin, Roberto. "How-To: Setup iTunes DJ on Your Max and iPhone", available at http://www.maclife.com/article/howtos/howto_setup_itunes_dj_your_mac_and_iphone, archived on Mar. 17, 2009, 4 pages.
Balfanz et al., "Network-in-a-Box: How to Set Up a Secure Wireless Network in Under a Minute," 13th USENIX Security Symposium—Technical Paper, 2002, 23 pages.
Balfanz et al., "Talking to Strangers: Authentication in Ad-Hoc Wireless Networks," Xerox Palo Alto Research Center, 2002, 13 pages.
Barham et al., "Wide Area Audio Synchronisation," University of Cambridge Computer Laboratory, 1995, 5 pages.
Baudisch et al., "Flat Volume Control: Improving Usability by Hiding the Volume Control Hierarchy in the User Interface," 2004, 8 pages.
Benslimane Abderrahim, "A Multimedia Synchronization Protocol for Multicast Groups," Proceedings of the 26th Euromicro Conference, 2000, pp. 456-463, vol. 1.
Biersack et al., "Intra- and Inter-Stream Synchronization for Stored Multimedia Streams," IEEE International Conference on Multimedia Computing and Systems, 1996, pp. 372-381.
Blakowski G. et al., "A Media Synchronization Survey: Reference Model, Specification, and Case Studies," Jan. 1996, pp. 5-35, vol. 14, No. 1.
Bluetooth. "Specification of the Bluetooth System: The ad hoc SCATTERNET for affordable and highly functional wireless connectivity," Core, Version 1.0 A, Jul. 26, 1999, 1068 pages.
Bluetooth. "Specification of the Bluetooth System: Wireless connections made easy," Core, Version 1.0 B, Dec. 1, 1999, 1076 pages.
Bogen Communications, Inc., ProMatrix Digitally Matrixed Amplifier Model PM3180, Copyright1996, 2 pages.
Brassil et al., "Enhancing Internet Streaming Media with Cueing Protocols," 2000, 9 pages.
Notice of Allowance dated Mar. 10, 2016, issued in connection with U.S. Appl. No. 14/937,523, filed Nov. 10, 2015, 5 pages.
Notice of Allowance dated Nov. 10, 2011, issued in connection with U.S. Appl. No. 11/906,702, filed Oct. 2, 2007, 17 pages.
Notice of Allowance dated Sep. 10, 2014, issued in connection with U.S. Appl. No. 13/892,230, filed May 10, 2013, 5 pages.
Notice of Allowance dated Apr. 11, 2016, issued in connection with U.S. Appl. No. 13/864,247, filed Apr. 17, 2013, 21 pages.
Notice of Allowance dated Jan. 11, 2016, issued in connection with U.S. Appl. No. 14/564,544, filed Dec. 9, 2014, 5 pages.
Notice of Allowance dated Aug. 12, 2015, issued in connection with U.S. Appl. No. 13/435,739, filed Mar. 30, 2012, 27 pages.
Notice of Allowance dated Jun. 12, 2014, issued in connection with U.S. Appl. No. 13/896,829, filed May 17, 2013, 5 pages.

(56) References Cited

OTHER PUBLICATIONS

Notice of Allowance dated Jul. 13, 2015, issued in connection with U.S. Appl. No. 14/184,526, filed Feb. 19, 2014, 22 pages.
Notice of Allowance dated May 13, 2015, issued in connection with U.S. Appl. No. 14/299,847, filed Jun. 9, 2014, 10 pages.
Notice of Allowance dated Nov. 13, 2013, issued in connection with U.S. Appl. No. 13/724,048, Dec. 21, 2012, 7 pages.
Notice of Allowance dated Oct. 13, 2015, issued in connection with U.S. Appl. No. 13/864,251, filed Apr. 17, 2013, 7 pages.
Notice of Allowance dated Jul. 14, 2017, issued in connection with U.S. Appl. No. 15/343,000, filed Nov. 3, 2016, 5 pages.
Notice of Allowance dated Jun. 14, 2012, issued in connection with U.S. Appl. No. 12/035,112, filed Feb. 21, 2008, 9 pages.
Notice of Allowance dated Jul. 15, 2015, issued in connection with U.S. Appl. No. 13/705,174, filed Dec. 5, 2012, 18 pages.
Notice of Allowance dated Mar. 15, 2016, issued in connection with U.S. Appl. No. 14/937,571, filed Nov. 10, 2015, 5 pages.
Notice of Allowance dated Jun. 16, 2009, issued in connection with U.S. Appl. No. 10/861,653, filed Jun. 5, 2004, 11 pages.
Notice of Allowance dated May 16, 2017, issued in connection with U.S. Appl. No. 15/228,685, filed Aug. 4, 2016, 10 pages.
Notice of Allowance dated Jul. 17, 2015, issued in connection with U.S. Appl. No. 13/864,251, filed Apr. 17, 2013, 20 pages.
Notice of Allowance dated Aug. 19, 2016, issued in connection with U.S. Appl. No. 14/619,813, filed Feb. 11, 2015, 9 pages.
Notice of Allowance dated May 19, 2015, issued in connection with U.S. Appl. No. 13/907,666, filed May 31, 2013, 7 pages.
Notice of Allowance dated Oct. 19, 2016, issued in connection with U.S. Appl. No. 14/290,493, filed May 29, 2014, 14 pages.
Notice of Allowance dated Jan. 20, 2016, issued in connection with U.S. Appl. No. 14/465,457, filed Aug. 21, 2014, 10 pages.
Notice of Allowance dated Oct. 21, 2015, issued in connection with U.S. Appl. No. 14/174,244, filed Feb. 6, 2014, 5 pages.
Notice of Allowance dated Oct. 21, 2015, issued in connection with U.S. Appl. No. 14/174,253, filed Feb. 6, 2014, 6 pages.
Notice of Allowance dated Sep. 21, 2015, issued in connection with U.S. Appl. No. 13/297,000, filed Nov. 15, 2011, 11 pages.
Notice of Allowance dated Jan. 22, 2015, issued in connection with U.S. Appl. No. 13/630,565, filed Sep. 28, 2012, 7 pages.
Notice of Allowance dated Sep. 22, 2015, issued in connection with U.S. Appl. No. 13/888,203, filed May 6, 2013, 7 pages.
Notice of Allowance dated May 24, 2017, issued in connection with U.S. Appl. No. 14/806,070, filed Jul. 22, 2015, 5 pages.
Notice of Allowance dated Oct. 24, 2016, issued in connection with U.S. Appl. No. 15/134,761, filed Apr. 21, 2016, 7 pages.
Notice of Allowance dated Oct. 24, 2016, issued in connection with U.S. Appl. No. 15/134,767, filed Apr. 21, 2016, 7 pages.
Notice of Allowance dated Sep. 24, 2015, issued in connection with U.S. Appl. No. 13/705,174, filed Dec. 5, 2012, 7 pages.
Notice of Allowance dated Sep. 24, 2015, issued in connection with U.S. Appl. No. 14/184,935, filed Feb. 20, 2014, 7 pages.
Notice of Allowance dated Sep. 25, 2014, issued in connection with U.S. Appl. No. 14/176,808, filed Feb. 10, 2014, 5 pages.
Notice of Allowance dated Aug. 27, 2015, issued in connection with U.S. Appl. No. 13/705,177, filed Dec. 5, 2012, 34 pages.
Notice of Allowance dated Aug. 27, 2015, issued in connection with U.S. Appl. No. 14/505,027, filed Oct. 2, 2014, 18 pages.
Notice of Allowance dated Dec. 27, 2011, issued in connection with U.S. Appl. No. 10/816,217, filed Apr. 1, 2004, 15 pages.
Notice of Allowance dated Jun. 27, 2017, issued in connection with U.S. Appl. No. 13/458,558, filed Apr. 27, 2012, 8 pages.
Notice of Allowance dated Oct. 27, 2015, issued in connection with U.S. Appl. No. 14/299,847, filed Jun. 9, 2014, 5 pages.
Notice of Allowance dated Oct. 28, 2014, issued in connection withU.S. Appl. No. 13/896,037, filed May 16, 2013, 7 pages.
Notice of Allowance dated Jul. 29, 2015, issued in connection with U.S. Appl. No. 13/359,976, filed Jan 27, 2012, 28 pages.
Notice of Allowance dated Jul. 29, 2015, issued in connection with U.S. Appl. No. 14/186,850, filed Feb. 21, 2014, 9 pages.
Notice of Allowance dated Aug. 30, 2016, issued in connection with U.S. Appl. No. 14/290,493, filed May 29, 2014, 7 pages.
Notice of Allowance dated Jul. 30, 2015, issued in connection with U.S. Appl. No. 13/705,178, filed Dec. 5, 2012, 18 pages.
Notice of Allowance dated Aug. 5, 2015, issued in connection with U.S. Appl. No. 13/435,776, filed Mar. 30, 2012, 26 pages.
Notice of Allowance dated Jul. 6, 2015, issued in connection with U.S. Appl. No. 13/297,000, filed Nov. 15, 2011, 24 pages.
Notice of Allowance dated Apr. 7, 2017, issued in connection with U.S. Appl. No. 14/629,937, filed Feb. 24, 2015, 8 pages.
Notice of Allowance dated Aug. 9, 2017, issued in connection with U.S. Appl. No. 15/343,019, filed Nov. 3, 2016, 5 pages.
Notice of Incomplete Re-Exam Request mailed on May 25, 2017, issued in connection with U.S. Appl. No. 90/013,959, filed Apr. 1, 2016, 10 pages.
Notice of Intent to Issue Re-Examination Certificate mailed on Mar. 24, 2017, issued in connection with U.S. Appl. No. 90/013,859, filed Nov. 4, 2016, 10 pages.
Nutzel et al., "Sharing Systems for Future HiFi Systems," IEEE, 2004, 9 pages.
Breebaart et al., "Multi-Channel Goes Mobile: MPEG Surround Binaural Rendering," AES 29th International Conference, Sep. 2-4, 2006, pp. 1-13.
Bretl W.E., et al., MPEG2 Tutorial [online], 2000 [retrieved on Jan. 31, 2009] Retrieved from the Internet: http://www.bretl.com/mpeghtml/MPEGindex.htm, pp. 1-23.
Buerk et al., "AVTransport:1 Service Template Version 1.01," Contributing Members of the UPnP Forum, Jun. 25, 2002, 67 pages.
Canadian Intellectual Property Office, Canadian Office Action dated Apr. 4, 2016, issued in connection with Canadian Patent Application No. 2,842,342, 5 pages.
Canadian Intellectual Property Office, Canadian Office Action dated Sep. 14, 2015, issued in connection with Canadian Patent Application No. 2,842,342, 2 pages.
Canadian Patent Office, Canadian Office Action dated Aug. 30, 2017, issued in connection with CA Application No. 2947275, 5 pages.
Canadian Patent Office, Office Action dated Apr. 10, 2015, issued in connection with Canadian Patent Application No. 2,832,542, 3 pages.
Cen et al., "A Distributed Real-Time MPEG Video Audio Player," Department of Computer Science and Engineering, Oregon Graduate Institute of Science and Technology, 1995, 12 pages.
Chakrabarti et al., "A Remotely Controlled Bluetooth Enabled Environment," IEEE, 2004, pp. 77-81.
Change Notification: Agere Systems WaveLan Multimode Reference Design (D2 to D3), AVAGO0042, Agere Systems, Nov. 2004, 2 pages.
Chinese Patent Office, Office Action dated Jul. 5, 2016, issued in connection with Chinese Patent Application No. 201380044380.2, 25 pages.
Chinese Patent Office, Office Action dated Nov. 27, 2015, issued in connection with Chinese Patent Application No. 201280028038.9, 26 pages.
Connection Manager: 1 Service Template Version 1.01 for UPnP, Version 1.0 (Jun. 25, 2002) (25 pages).
ContentDirectory:1 Service Template Version 1.01 for UPnP, Version 1.0 (Jun. 25, 2002) (89 pages).
Corrected Notice of Allowance dated Mar. 12, 2015, issued in connection with U.S. Appl. No. 13/630,565, filed Sep. 28, 2012, 4 pages.
Corrected Notice of Allowance dated Aug. 19, 2015, issued in connection with U.S. Appl. No. 13/907,666, filed May 31, 2013, 2 pages.
Corrected Notice of Allowance dated Oct. 30, 2015, issued in connection with U.S. Appl. No. 13/013,740, filed Jan. 25, 2011, 2 pages.
Creative, "Connecting Bluetooth Devices with Creative D200," http://support.creative.com/kb/ShowArticle.aspx?url=http://ask.creative.com:80/SRVS/CGI-BIN/WEBCGI.EXE/,/?St=106,E=0000000000396859016,K=9377,Sxi=8,VARSET=ws:http://us.creative.com,case=63350, available on Nov. 28, 2011, 2 pages.

(56) References Cited

OTHER PUBLICATIONS

Crown PIP Manual available for sale at least 2004, 68 pages.
Dannenberg et al., "A. System Supporting Flexible Distributed Real-Time Music Processing," Proceedings of the 2001 International Computer Music Conference, 2001, 4 pages.
Dannenberg, Roger B., "Remote Access to Interactive Media," Proceedings of the SPIE 1785, 1993, pp. 230-237.
Day, Rebecca, "Going Elan!" Primedia Inc., 2003, 4 pages.
Deep-Sleep Implementation in WL60011 for IEEE 802.11b Applications, AVAGO0020, Agere Systems, Jul. 2004, 22 pages.
Dell, Inc. "Dell Digital Audio Receiver: Reference Guide," Jun. 2000, 70 pages.
Dell, Inc. "Start Here," Jun. 2000, 2 pages.
"Denon 2003-2004 Product Catalog," Denon, 2003-2004, 44 pages.
Denon AV Surround Receiver AVR-1604/684 User's Manual, 2004, 128 pages.
Denon AV Surround Receiver AVR-5800 Operating Instructions, Copyright 2000, 67 pages.
Designing a UPnP AV MediaServer, Nelson Kidd (2003) (SONDM000115062-116) (55 pages).
Dorwaldt, Carl, "EASE 4.1 Tutorial," Renkus-Heinz, Inc., 2004, 417 pages.
"DP-0206 Digital Signal Processor," TOA Electronics, Inc., 2001, pp. 1-12.
Dynaudio Acoustics Air Series, http://www.soundonsound.com/sos/sep02/articles/dynaudioair.asp, 2002, 4 pages.
European Patent Office, European Extended Search Report dated Mar. 7, 2016, issued in connection with EP Application No. 13810340.3, 9 pages.
European Patent Office, European Extended Search Report dated Feb. 28, 2014, issued in connection with EP Application No. 13184747.7, 8 pages.
European Patent Office, European Extended Search Report dated Mar. 31, 2015, issued in connection with EP Application No. 14181454.1, 9 pages.
UPnP Design by Example, A Software Developers Guide to Universal Plug and Play Michael Jeronimo and JackWeast, Intel Press (D+M_0401307-818) (Apr. 2003) (511 pages).
UPnP; "Universal Plug and Play Device Architecture," Jun. 8, 2000; version 1.0; Microsoft Corporation; pp. 1-54.
U.S. Appl. No. 13/083,499, filed Apr. 8, 2011, "Multi-Channel Pairing in a Media System."
WANCommonInterfaceConfig:1 Service Template Version 1.01 for UPnP, Ver. 1.0 (Nov. 12, 2001) (D+M_0401820-43) (24 pages).
WANIPConnection:1 Service Template Version 1.01 for UPnP Ver. 1.0 (Nov. 12, 2001) (D+M_0401844-917) (74 pages).
WANPPPConnection:1 Service Template Version 1.01 for UPnP, Version 1.0 (Nov. 12, 2001) (D+M_0401918-2006) (89 pages).
WaveLan High-Speed Multimode Chip Set, AVAGO0003, Agere Systems, Feb. 2003, 4 pages.
WaveLan High-Speed Multimode Chip Set, AVAGO0005, Agere Systems, Feb. 2003, 4 pages.
WaveLAN Wireless Integration Developer Kit (WI-DK) for Access Point Developers, AVAGO0054, Agere Systems, Jul. 2003, 2 pages.
WaveLAN Wireless Integration-Developer Kit (WI-DK) Hardware Control Function (HCF), AVAGO0052, Agere Systems, Jul. 2003, 2 pages.
"Welcome. You're watching Apple TV." Apple TV 1st Generation Setup Guide, Apr. 8, 2008 http://manuals.info.apple.com/MANUALS/0/MA403/en_US/AppleTV_SetupGuide.pdf Retrieved Oct. 14, 2014, 40 pages.
"Welcome. You're watching Apple TV." Apple TV 2nd Generation Setup Guide, Mar. 10, 2011 Retrieved Oct. 16, 2014, 36 pages.
"Welcome. You're watching Apple TV." Apple TV 3rd Generation Setup Guide, Mar. 16, 2012 Retrieved Oct. 16, 2014, 36 pages.
WI-DK Release 2 WaveLan Embedded Drivers for VxWorks and Linux, AVAGO0056, Agere Systems, Jul. 2003, 2 pages.
WI-DK Release 2 WaveLan END Reference Driver for VxWorks, AVAGO0044, Agere Systems, Jul. 2003, 4 pages.
WI-DK Release 2 WaveLan LKM Reference Drivers for Linux, AVAGO0048, Agere Systems, Jul. 2003, 4 pages.
Windows Media Connect Device Compatibility Specification (Apr. 12, 2004) (16 pages).
WPA Reauthentication Rates, AVAGO0063, Agere Systems, Feb. 2004, 3 pages.
Yamaha DME 32 manual: copyright 2001.
Yamaha DME 64 Owner's Manual; copyright 2004, 80 pages.
Yamaha DME Designer 3.5 setup manual guide; copyright 2004, 16 pages.
Yamaha DME Designer 3.5 User Manual; Copyright 2004, 507 pages.
Yamaha DME Designer software manual: Copyright 2004, 482 pages.
"Symantec pcAnywhere User's Guide," v 10.5.1, 1995-2002, 154 pages.
"Systemline Modular Installation Guide, Multiroom System," Systemline, 2003, pp. 1-22.
"ZR-8630AV MultiZone Audio/Video Receiver, Installation and Operation Guide," Niles Audio Corporation, 2003, 86 pages.
ZX135: Installation Manual,LA Audio, Apr. 2003, 44 pages.
Non-Final Office Action dated Oct. 23, 2014, issued in connection with U.S. Appl. No. 13/864,251, filed Apr. 17, 2013, 11 pages.
Non-Final Office Action dated Oct. 23, 2014, issued in connection with U.S. Appl. No. 13/888,203, filed May 6, 2013, 9 pages.
Non-Final Office Action dated Sep. 23, 2014, issued in connection with U.S. Appl. No. 13/630,565, filed Sep. 28, 2012, 7 pages.
Non-Final Office Action dated Feb. 24, 2017, issued in connection with U.S. Appl. No. 14/619,813, filed Feb. 2015, 9 pages.
Non-Final Office Action dated May 24, 2016, issued in connection with U.S. Appl. No. 15/134,767, filed Apr. 21, 2016, 12 pages.
Non-final Office Action dated Oct. 24, 2014, issued in connection with U.S. Appl. No. 13/435,776, filed Mar. 30, 2012, 14 pages.
Non-Final Office Action dated Feb. 26, 2015, issued in connection with U.S. Appl. No. 14/186,850, filed Feb. 21, 2014, 25 pages.
Non-Final Office Action dated Mar. 26, 2015, issued in connection with U.S. Appl. No. 14/184,528, filed Feb. 19, 2014, 18 pages.
Non-Final Office Action dated Jan. 27, 2015, issued in connection with U.S. Appl. No. 14/465,457, filed Aug. 21, 2014, 11 pages.
Non-Final Office Action dated Jun. 27, 2008, issued in connection with U.S. Appl. No. 10/861,653, filed Jun. 5, 2004, 19 pages.
Non-Final Office Action dated Mar. 27, 2015, issued in connection with U.S. Appl. No. 13/705,178, filed Dec. 5, 2012, 14 pages.
Non-Final Office Action dated Sep. 27, 2013, issued in connection with U.S. Appl. No. 13/013,740, filed Jan. 25, 2011, 12 pages.
Non-Final Office Action dated Sep. 27, 2016, issued in connection with U.S. Appl. No. 15/228,685, filed Aug. 4, 2016, 8 pages.
Non-Final Office Action dated Dec. 28, 2015, issued in connection with U.S. Appl. No. 14/290,493, filed May 29, 2014, 29 pages.
Non-Final Office Action dated Dec. 28, 2016, issued in connection with U.S. Appl. No. 15/343,000, filed Nov. 3, 2016, 11 pages.
Non-Final Office Action dated Jan. 29, 2016, issued in connection with U.S. Appl. No. 14/937,523, filed Nov. 10, 2016, 10 pages.
Non-Final Office Action dated Jun. 29, 2016, issued in connection with U.S. Appl. No. 14/629,937, filed Feb. 24, 2015, 12 pages.
Non-Final Office Action dated Apr. 30, 2012, issued in connection with U.S. Appl. No. 13/204,511, filed Aug. 5, 2011, 16 pages.
Non-Final Office Action dated Jan. 30, 2014, issued in connection with U.S. Appl. No. 14/290,493, filed May 29, 2014, 29 pages.
Non-Final Office Action dated Jan. 30, 2015, issued in connection with U.S. Appl. No. 14/504,812, filed Oct. 2, 2014, 13 pages.
Non-Final Office Action dated Nov. 30, 2016, issued in connection with U.S. Appl. No. 15/243,186, filed Aug. 22, 2016, 12 pages.
Non-Final Office Action dated Sep. 30, 2016, issued in connection with U.S. Appl. No. 13/864,249, filed Apr. 17, 2013, 12 pages.
Non-Final Office Action dated Oct. 31, 2016, issued in connection with U.S. Appl. No. 14/806,070, filed Jul. 22, 2015, 11 pages.
North American MPEG-2 Information, "The MPEG-2 Transport Stream," Retrieved from the Internet: URL: http://www.coolstf.com/mpeg/#ts, 2006, pp. 1-5.
Notice of Allowability dated Apr. 18, 2013, issued in connection with U.S. Appl. No. 11/853,790, filed Sep. 11, 2007, 4 pages.

(56) References Cited

OTHER PUBLICATIONS

Notice of Allowance dated Jan. 31, 2013, issued in connection with U.S. Appl. No. 13/298,090, filed Nov. 16, 2011, 19 pages.
Notice of Allowance dated Dec. 1, 2016, issued in connection with U.S. Appl. No. 15/088,283, filed Apr. 1, 2016, 9 pages.
Notice of Allowance dated Jun. 1, 2017, issued in connection with U.S. Appl. No. 14/808,397, filed Jul. 24, 2015, 5 pages.
Notice of Allowance dated Dec. 2, 2016, issued in connection with U.S. Appl. No. 15/088,532, filed Apr. 1, 2016, 9 pages.
Notice of Allowance dated Dec. 2, 2016, issued in connection with U.S. Appl. No. 15/088,678, filed Apr. 1, 2016, 9 pages.
Notice of Allowance dated Dec. 2, 2016, issued in connection with U.S. Appl. No. 15/089,758, filed Apr. 4, 2016, 9 pages.
Notice of Allowance dated Dec. 2, 2016, issued in connection with U.S. Appl. No. 15/155,149, filed May 16, 2016, 9 pages.
Notice of Allowance dated Jul. 2, 2015, issued in connection with U.S. Appl. No. 13/848,904, filed Mar. 22, 2013, 17 pages.
Notice of Allowance dated Jul. 2, 2015, issued in connection with U.S. Appl. No. 13/888,203, filed May 6, 2013, 19 pages.
Notice of Allowance dated Jul. 2, 2015, issued in connection with U.S. Appl. No. 14/184,935, filed Feb. 20, 2014, 23 pages.
Notice of Allowance dated Jun. 2, 2014, issued in connection with U.S. Appl. No. 13/083,499, filed Apr. 8, 2011, 5 pages.
Notice of Allowance dated Sep. 3, 2015, issued in connection with U.S. Appl. No. 13/705,174, filed Dec. 5, 2012, 4 pages.
Notice of Allowance dated Aug. 4, 2015, issued in connection with U.S. Appl. No. 14/516,867, filed Oct. 17, 2014, 13 pages.
Notice of Allowance dated Dec. 5, 2014, issued in connection with U.S. Appl. No. 14/256,434, filed Apr. 18, 2014, 7 pages.
Notice of Allowance dated Oct. 5, 2012, issued in connection with U.S. Appl. No. 13/204,511, filed Aug. 5, 2011, 11 pages.
Notice of Allowance dated Mar. 6, 2014, issued in connection with U.S. Appl. No. 13/827,653, filed Mar. 14, 2013, 17 pages.
Notice of Allowance dated May 6, 2011, issued in connection with U.S. Appl. No. 11/801,468, filed May 9, 2007, 10 pages.
Notice of Allowance dated Sep. 6, 2013, issued in connection with U.S. Appl. No. 13/619,237, filed Sep. 14, 2012, 10 pages.
Notice of Allowance dated Sep. 6, 2016, issued in connection with U.S. Appl. No. 15/134,767, filed Apr. 21, 2016, 7 pages.
Notice of Allowance dated Apr. 7, 2016, issued in connection with U.S. Appl. No. 13/533,105, filed Jun. 26, 2012, 40 pages.
Notice of Allowance dated Oct. 7, 2015, issued in connection with U.S. Appl. No. 14/184,526, filed Feb. 19, 2014, 7 pages.
Notice of Allowance dated Oct. 9, 2015, issued in connection with U.S. Appl. No. 13/435,739, filed Mar. 30, 2012, 4 pages.
Notice of Allowance dated Sep. 9, 2016, issued in connection with U.S. Appl. No. 15/134,761, filed Apr. 21, 2016, 7 pages.
Notice of Allowance dated Aug. 10, 2015, issued in connection with U.S. Appl. No. 13/848,904, filed Mar. 22, 2013, 9 pages.
Notice of Allowance dated Jul. 10, 2015, issued in connection with U.S. Appl. No. 13/013,740, filed Jan. 25, 2011, 7 pages.
Liu et al., "A synchronization control scheme for real-time streaming multimedia applications," Packet Video, 2003, 10 pages, vol. 2003.
Liu et al., "Adaptive Delay Concealment for Internet Voice Applications with Packet-Based Time-Scale Modification," Information Technologies 2000, pp. 91-102.
Louderback, Jim, "Affordable Audio Receiver Furnishes Homes With MP3," TechTV Vault. Jun. 28, 2000 retrieved Jul. 10, 2014, 2 pages.
Maniactools, "Identify Duplicate Files by Sound," Sep. 28, 2010, http://www.maniactools.com/soft/music-duplicate-remover/identify-duplicate-files-by-sound.shtml.
MediaRenderer:1 Device Template Version 1.01 for UPnP, Version 1.0 (Jun. 25, 2002) (12 pages).
MediaServer:1 Device Template Version 1.01 for UPnP, Version 1.0 (Jun. 25, 2002) (12 pages).
Microsoft, Universal Plug and Play (UPnP) Client Support ("Microsoft UPnP") (Aug. 2001) (D+M_0402007-24) (18 pages).
Microsoft Window's XP Reviewer's Guide (Aug. 2001) (D+M_0402225-85) (61 pages).
"Microsoft Windows XP File and Printer Share with Microsoft Windows" Microsoft Windows XP Technical Article, 2003, 65 pages.
Mills David L., "Network Time Protocol (Version 3) Specification, Implementation and Analysis," Network Working Group, Mar. 1992, 7 pages.
Mills, David L., "Precision Synchronization of Computer Network Clocks," ACM SIGCOMM Computer Communication Review, 1994, pp. 28-43, vol. 24, No. 2.
"Model MRC44 Four Zone—Four Source Audio/Video Controller/ Amplifier System," Xantech Corporation, 2002, 52 pages.
Motorola, "Simplefi, Wireless Digital Audio Receiver, Installation and User Guide," Dec. 31, 2001, 111 pages.
"SMPTE Made Simple: A Time Code Tutor by Timeline," 1996, 46 pages.
Network Time Protocol (NTP), RFC 1305 (Mar. 1992) (D+M_0397417-536) (120 pages).
"NexSys Software v.3 Manual," Crest Audio, Inc., 1997, 76 pages.
Niederst, Jennifer "O'Reilly Web Design in a Nutshell," Second Edition, Sep. 2001, 678 pages.
Nilsson, M., "ID3 Tag Version 2," Mar. 26, 1998, 28 pages.
Non-Final Office Action dated May 1, 2014, issued in connection with U.S. Appl. No. 14/184,522, filed Feb. 19, 2014, 31 pages.
Non-Final Office Action dated Dec. 5, 2013, issued in connection with U.S. Appl. No. 13/827,653, filed Mar. 14, 2013, 28 pages.
Non-Final Office Action dated Jan. 5, 2012, issued in connection with U.S. Appl. No. 13/298,090, filed Nov. 16, 2011, 40 pages.
Non-Final Office Action dated May 6, 2014, issued in connection with U.S. Appl. No. 13/705,176, filed Dec. 5, 2012, 23 pages.
Non-Final Office Action dated Jan. 7, 2012, issued in connection with U.S. Appl. No. 13/896,826, filed May 17, 2013, 11 pages.
Non-Final Office Action dated Sep. 7, 2016, issued in connection with U.S. Appl. No. 13/864,248, filed Apr. 17, 2013, 12 pages.
Non-Final Office Action dated Apr. 10, 2013, issued in connection with U.S. Appl. No. 13/619,237, filed Sep. 14, 2012, 10 pages.
Non-Final Office Action dated Feb. 10, 2014, issued in connection with U.S. Appl. No. 13/083,499, filed Apr. 8, 2011, 12 pages.
Non-Final Office Action dated May 12, 2014, issued in connection with U.S. Appl. No. 14/184,528, filed Feb. 19, 2014, 23 pages.
Non-Final Office Action dated May 14, 2014, issued in connection with U.S. Appl. No. 13/848,932, filed Mar. 22, 2013, 14 pages.
Non-Final Office Action dated Jun. 17, 2014, issued in connection with U.S. Appl. No. 14/176,808, filed Feb. 10, 2014, 6 pages.
Non-Final Office Action dated Dec. 18, 2013, issued in connection with U.S. Appl. No. 13/907,666, filed May 31, 2013, 12 pages.
Non-Final Office Action dated Jan. 18, 2008, issued in connection with U.S. Appl. No. 10/816,217, filed Apr. 1, 2004, 38 pages.
Non-Final Office Action dated Apr. 19, 2014, issued in connection with U.S. Appl. No. 11/801,468, filed May 9, 2007, 16 pages.
Non-Final Office Action dated Mar. 19, 2013, issued in connection with U.S. Appl. No. 13/724,048, filed Dec. 21, 2012, 9 pages.
Non-Final Office Action dated Jun. 21, 2011, issued in connection with U.S. Appl. No. 10/816,217, filed Apr. 1, 2004, 13 pages.
Non-Final Office Action dated Jan. 22, 2009, issued in connection with U.S. Appl. No. 10/816,217, filed Apr. 1, 2004, 18 pages.
Non-Final Office Action dated Jul. 23, 2013, issued in connection with U.S. Appl. No. 14/256,434, filed Apr. 18, 2014, 12 pages.
Non-Final Office Action dated Jul. 25, 2014, issued in connection with U.S. Appl. No. 14/184,526, filed Feb. 19, 2014, 9 pages.
Non-Final Office Action dated Jul. 25, 2014, issued in connection with U.S. Appl. No. 14/184,935, filed Feb. 20, 2014, 11 pages.
Non-Final Office Action dated Jun. 25, 2010, issued in connection with U.S. Appl. No. 10/816,217, filed Apr. 1, 2004, 17 pages.
Non-Final Office Action dated Nov. 25, 2013, issued in connection with U.S. Appl. No. 13/533,105, filed Jun. 26, 2012, 19 pages.
Non-Final Office Action dated May 27, 2014, issued in connection with U.S. Appl. No. 14/186,850, filed Feb. 21, 2014, 13 pages.
Non-Final Office Action dated Feb. 29, 2012, issued in connection with U.S. Appl. No. 13/297,000, filed Nov. 15, 2011, 10 pages.
Non-Final Office Action dated Nov. 29, 2010, issued in connection with U.S. Appl. No. 11/801,468, filed May 9, 2007, 17 pages.

(56) References Cited

OTHER PUBLICATIONS

Non-Final Office Action dated Jul. 30, 2013, issued in connection with U.S. Appl. No. 13/724,048, filed Dec. 21, 2012, 7 pages.
Non-Final Office Action dated Jul. 31, 2014, issued in connection with U.S. Appl. No. 13/533,105, filed Jun. 26, 2012, 31 pages.
Non-Final Office Action dated Dec. 1, 2014, issued in connection with U.S. Appl. No. 14/516,867, filed Oct. 17, 2014, 11 pages.
Non-Final Office Action dated Jun. 1, 2016, issued in connection with U.S. Appl. No. 14/184,522, filed Feb. 19, 2014, 21 pages.
Non-Final Office Action dated Jan. 3, 2017, issued in connection with U.S. Appl. No. 14/808,397, filed Jul. 24, 2015, 11 pages.
Non-Final Office Action dated Jun. 3, 2015, issued in connection with U.S. Appl. No. 14/564,544, filed Dec. 9, 2014, 7 pages.
Non-Final Office Action dated Nov. 3, 2016, issued in connection with U.S. Appl. No. 14/184,528, filed Feb. 19, 2014, 17 pages.
Final Office Action dated Jun. 30, 2008, issued in connection with U.S. Appl. No. 10/816,217, filed Apr. 1, 2004, 30 pages.
Final Office Action dated Jul. 1, 2016, issued in connection with U.S. Appl. No. 13/458,558, filed Apr. 27, 2012, 11 pages.
Final Office Action dated Jul. 2, 2015, issued in connection with U.S. Appl. No. 13/458,558, filed Apr. 27, 2012, 11 pages.
Final Office Action dated Aug. 3, 2015, issued in connection with U.S. Appl. No. 13/848,921, filed Mar. 22, 2013, 13 pages.
Final Office Action dated Dec. 3, 2014, issued in connection with U.S. Appl. No. 14/184,528, filed Feb. 19, 2014, 12 pages.
Final Office Action dated Jul. 3, 2012, issued in connection with U.S. Appl. No. 13/298,090, filed Nov. 16, 2011, 46 pages.
Final Office Action dated Jun. 3, 2016, issued in connection with U.S. Appl. No. 13/705,176, filed Dec. 5, 2012, 24 pages.
Final Office Action dated Mar. 3, 2015, issued in connection with U.S. Appl. No. 13/864,251, filed Apr. 17, 2013, 13 pages.
Final Office Action dated Mar. 4, 2015, issued in connection with U.S. Appl. No. 13/848,904, filed Mar. 22, 2013, 16 pages.
Final Office Action dated Mar. 5, 2015, issued in connection with U.S. Appl. No. 13/888,203, filed May 6, 2013, 13 pages.
Final Office Action dated Jan. 7, 2015, issued in connection with U.S. Appl. No. 13/848,932, filed Mar. 22, 2013, 14 pages.
Final Office Action dated Mar. 9, 2015, issued in connection with U.S. Appl. No. 14/516,867, filed Oct. 17, 2014, 14 pages.
Final Office Action dated Aug. 10, 2015, issued in connection with U.S. Appl. No. 14/290,493, filed May 29, 2014, 26 pages.
Final Office Action dated Feb. 10, 2014, issued in connection with U.S. Appl. No. 13/013,740, filed Jan. 25, 2011, 13 pages.
Final Office Action dated Aug. 11, 2015, issued in connection with U.S. Appl. No. 13/864,247, filed Apr. 17, 2013, 15 pages.
Final Office Action dated Feb. 11, 2015, issued in connection with U.S. Appl. No. 14/184,526, filed Feb. 19, 2014, 13 pages.
Final Office Action dated Feb. 11, 2015, issued in connection with U.S. Appl. No. 14/184,935, filed Feb. 20, 2014, 17 pages.
Final Office Action dated Feb. 12, 2015, issued in connection with U.S. Appl. No. 14/184,522, filed Feb. 19, 2014, 20 pages.
Final Office Action dated Apr. 13, 2017, issued in connection with U.S. Appl. No. 14/563,515, filed Dec. 8, 2014, 13 pages.
Final Office Action dated Dec. 13, 2016, issued in connection with U.S. Appl. No. 14/629,937, filed Feb. 24, 2015, 14 pages.
Final Office Action dated Oct. 13, 2011, issued in connection with U.S. Appl. No. 11/853,790, filed Sep. 11, 2007, 10 pages.
Final Office Action dated Oct. 13, 2011, issued in connection with U.S. Appl. No. 12/035,112, filed Feb. 21, 2008, 10 pages.
Final Office Action dated Jul. 15, 2015, issued in connection with U.S. Appl. No. 14/504,812, filed Oct. 2, 2014, 18 pages.
Final Office Action dated Jun. 15, 2015, issued in connection with U.S. Appl. No. 14/184,522, filed Feb. 19, 2014, 25 pages.
Final Office Action dated Dec. 17, 2014, issued in connection with U.S. Appl. No. 13/533,105, filed Jun. 26, 2012, 36 pages.
Final Office Action dated Oct. 19, 2016, issued in connection with U.S. Appl. No. 13/848,921, filed Mar. 22, 2013, 14 pages.
Final Office Action dated Jan. 21, 2010, issued in connection with U.S. Appl. No. 11/906,702, filed Oct. 2, 2007, 27 pages.
Final Office Action dated Oct. 22, 2014, issued in connection with U.S. Appl. No. 14/186,850, filed Feb. 21, 2014, 12 pages.
Final Office Action dated Oct. 23, 2014, issued in connection with U.S. Appl. No. 13/705,176, filed Dec. 5, 2012, 23 pages.
Final Office Action dated Feb. 24, 2016, issued in connection with U.S. Appl. No. 13/871,795, filed Apr. 26, 2013, 28 pages.
Final Office Action dated May 25, 2016, issued in connection with U.S. Appl. No. 14/290,493, filed May 29, 2014, 33 pages.
Final Office Action dated Jun. 26, 2017, issued in connection with U.S. Appl. No. 15/343,019, filed Nov. 3, 2016, 10 pages.
Final Office Action dated Apr. 28, 2015, issued in connection with U.S. Appl. No. 14/186,850, filed Feb. 21, 2014, 20 pages.
Final Office Action dated Jun. 29, 2015, issued in connection with U.S. Appl. No. 14/465,457, filed Aug. 21, 2014, 13 pages.
Final Office Action dated Nov. 30, 2015, issued in connection with U.S. Appl. No. 13/871,795, filed Apr. 26, 2013, 26 pages.
Final Office Action dated Apr. 6, 2017, issued in connection with U.S. Appl. No. 14/620,937, filed Feb. 12, 2015, 15 pages.
Fireball DVD and Music Manager DVDM-100 Installation and User's Guide, Copyright 2003, 185 pages.
Fireball MP-200 User's Manual, Copyright 2006, 93 pages.
Fireball Remote Control Guide WD006-1-1, Copyright 2003, 19 pages.
Fireball SE-D1 User's Manual, Copyright 2005, 90 pages.
First Action Interview Office Action Summary dated Apr. 15, 2015, issued in connection with U.S. Appl. No. 14/505,027, filed Oct. 2, 2014, 6 pages.
Fober et al., "Clock Skew Compensation over a High Latency Network," Proceedings of the ICMC, 2002, pp. 548-552.
Fries et al. "The MP3 and Internet Audio Handbook: Your Guide to the Digital Music Revolution." 2000, 320 pages.
Fulton et al., "The Network Audio System: Make Your Application Sing (As Well As Dance)!" The X Resource, 1994, 14 pages.
Gaston et al., "Methods for Sharing Stereo and Multichannel Recordings Among Planetariums," Audio Engineering Society Convention Paper 7474, 2008, 15 pages.
General Event Notification Architecture Base: Client to Arbiter (Apr. 2000) (23 pages).
Hans et al., "Interacting with Audio Streams for Entertainment and Communication," Proceedings of the Eleventh ACM International Conference on Multimedia, ACM, 2003, 7 pages.
Herre et al., "The Reference Model Architecture for MPEG Spatial Audio Coding," Audio Engineering Society Convention Paper (Presented at the 118th Convention), May 28-31, 2005, 13 pages.
Home Networking with Universal Plug and Play, IEEE Communications Magazine, vol. 39 No. 12 (Dec. 2001) (D+M_0402025-40) (16 pages).
"Home Theater Control Systems," Cinema Source, 2002, 19 pages.
European Patent Office, European Search Report dated Jul. 5, 2016, issued in connection with European Patent Application No. 16156935.5, 9 pages.
European Patent Office, Examination Report dated Mar. 22, 2016, issued in connection with European Patent Application No. EP14181454.1, 6 pages.
European Patent Office, Examination Report dated Oct. 24, 2016, issued in connection with European Patent Application No. 13808623.6, 4 pages.
European Patent Office, Extended European Search Report dated Jul. 5, 2016, issued in connection with European Patent Application No. 16156940.5, 7 pages.
Falcone, John, "Sonos BU150 Digital Music System review," CNET, CNET [online] Jul. 27, 2009 [retrieved on Mar. 16, 2016], 11 pages Retrieved from the Internet: URL:http://www.cnet.com/products/sonos-bu150-digital-music-system/.
Faller, Christof, "Coding of Spatial Audio Compatible with Different Playback Formats," Audio Engineering Society Convention Paper (Presented at the 117th Convention), Oct. 28-31, 2004, 12 pages.
File History of Re-Examination Application No. 90/013,423 (Sonos Ref. No. 12-0902-REX) retrieved from the U.S. Patent Office (PAIR) on Dec. 5, 2016, 313 pages.
Final Office Action dated Jun. 5, 2014, issued in connection with U.S. Appl. No. 13/907,666, filed May 31, 2013, 12 pages.

(56) References Cited

OTHER PUBLICATIONS

Final Office Action dated Jul. 13, 2009, issued in connection with U.S. Appl. No. 10/816,217, filed Apr. 1, 2004, 16 pages.
Final Office Action dated Sep. 13, 2012, issued in connection with U.S. Appl. No. 13/297,000, filed Nov. 15, 2011, 17 pages.
Final Office Action dated Nov. 18, 2015, issued in connection with U.S. Appl. No. 13/533,105, filed Jun. 26, 2012, 56 pages.
Final Office Action dated Oct. 21, 2011, issued in connection with U.S. Appl. No. 10/816,217, filed Apr. 31, 2004, 19 pages.
Final Office Action dated Jul. 23, 2014, issued in connection with U.S. Appl. No. 13/896,037, filed May 16, 2013, 12 pages.
Final Office Action dated Mar. 27, 2014, issued in connection with U.S. Appl. No. 13/533,105, filed Jun. 26, 2012, 29 pages.
Final Office Action dated Jan. 28, 2011, issued in connection with U.S. Appl. No. 10/816,217, filed Apr. 1, 2004, 21 pages.
Non-Final Office Action dated Jan. 4, 2017, issued in connection with U.S. Appl. No. 14/825,961, filed Aug. 13, 2015, 11 pages.
Non-Final Office Action dated Jun. 4, 2015, issued in connection with U.S. Appl. No. 13/871,795, filed Apr. 26, 2013, 16 pages.
Non-Final Office Action dated Mar. 4, 2015, issued in connection with U.S. Appl. No. 13/435,776, filed Mar. 30, 2012, 16 pages.
Non-Final Office Action dated Oct. 4, 2016, issued in connection with U.S. Appl. No. 15/089,758, filed Apr. 4, 2016, 9 pages.
Non-Final Office Action dated Oct. 5, 2016, issued in connection with U.S. Appl. No. 13/864,250, filed Apr. 17, 2013, 10 pages.
Non-Final Office Action dated Oct. 5, 2016, issued in connection with U.S. Appl. No. 13/864,252, filed Apr. 17, 2013, 11 pages.
Non-Final Office Action dated Oct. 6, 2016, issued in connection with U.S. Appl. No. 15/088,678, filed Apr. 1, 2016, 9 pages.
Non-Final Office Action dated Jul. 7, 2015, issued in connection with U.S. Appl. No. 14/174,244, filed Feb. 6, 2014, 9 pages.
Non-Final Office Action dated Oct. 7, 2016, issued in connection with U.S. Appl. No. 15/156,392, filed May 17, 2016, 8 pages.
Non-Final Office Action dated Mar 8, 2011, issued in connection with U.S. Appl. No. 14/853,790, filed Sep. 11, 2007, 10 pages.
Non-Final Office Action dated Mar. 8, 2016, issued in connection with U.S. Appl. No. 13/848,921, filed Mar. 22, 2013, 13 pages.
Non-Final Office Action dated Aug. 9, 2016, issued in connection with U.S. Appl. No. 13/871,795, filed Apr. 26, 2013, 31 pages.
Non-Final Office Action dated May 9, 2014, issued in connection with U.S. Appl. No. 13/892,230, filed May 10, 2013, 10 pages.
Non-Final Office Action dated Feb. 10, 2016, issued in connection with U.S. Appl. No. 14/937,571, filed Nov. 10, 2015, 9 pages.
Non-Final Office Action dated Mar. 10, 2011, issued in connection with U.S. Appl. No. 12/035,112, filed Feb. 21, 2008, 12 pages.
Non-Final Office Action dated May 10, 2016, issued in connection with U.S. Appl. No. 14/504,812, filed Oct. 2, 2014, 22 pages.
Non-Final Office Action dated Nov. 10, 2016, issued in connection with U.S. Appl. No. 15/243,355, filed Aug. 22, 2016, 11 pages.
Non-Final Office Action dated Dec. 12, 2016, issued in connection with U.S. Appl. No. 15/343,019, filed Nov. 3, 2016, 8 pages.
Non-Final Office Action dated Jun. 12, 2015, issued in connection with U.S. Appl. No. 13/848,932, filed Mar. 22, 2013, 16 pages.
Non-Final Office Action dated Mar. 12, 2015, issued in connection with U.S. Appl. No. 13/705,174, filed Dec. 5, 2012, 13 pages.
Non-Final Office Action dated Oct. 12, 2016, issued in connection with U.S. Appl. No. 14/505,966, filed Oct. 3, 2014, 10 pages.
Non-Final Office Action dated Feb. 13, 2014, issued in connection with U.S. Appl. No. 13/896,037, filed May 16, 2013, 10 pages.
Non-Final Office Action dated Feb. 13, 2015, issued in connection with U.S. Appl. No. 13/013,740, filed Jan. 25, 2011, 14 pages.
Non-Final Office Action dated Jan. 13, 2016, issued in connection with U.S. Appl. No. 14/184,528, filed Feb. 19, 2014, 14 pages.
Non-Final Office Action dated Jun. 13, 2016, issued in connection with U.S. Appl. No. 14/620,937, filed Feb. 12, 2015, 12 pages.
Non-Final Office Action dated Jun. 13, 2016, issued in connection with U.S. Appl. No. 15/134,761, filed Apr. 21, 2016, 10 pages.
Non-Final Office Action dated Mar. 13, 2015, issued in connection with U.S. Appl. No. 13/705,177, filed Dec. 5, 2012, 15 pages.
Non-Final Office Action dated Nov. 14, 2017, issued in connection with U.S. Appl. No. 14/620,937, filed Feb. 12, 2015, 13 pages.
Non-Final Office Action dated Dec. 15, 2016, issued in connection with U.S. Appl. No. 13/458,558, filed Apr. 27, 2012, 12 pages.
Non-Final Office Action dated Jul. 15, 2015, issued in connection with U.S. Appl. No. 14/174,253, filed Feb. 6, 2014, 9 pages.
Non-Final Office Action dated Nov. 16, 2016, issued in connection with U.S. Appl. No. 15/228,639, filed Aug. 4, 2016, 15 pages.
Non-Final Office Action dated Dec. 17, 2015, issued in connection with U.S. Appl. No. 13/458,558, filed Apr. 27, 2012, 10 pages.
Non-Final Office Action dated Nov. 17, 2014, issued in connection with U.S. Appl. No. 13/864,247, filed Apr. 17, 2013, 11 pages.
Non-Final Office Action dated Nov. 17, 2016, issued in connection with U.S. Appl. No. 14/620,937, filed Feb. 12, 2015, 14 pages.
Non-Final Office Action dated Feb. 18, 2009, issued in connection with U.S. Appl. No. 10/861,653, filed Jun. 5, 2004, 18 pages.
Non-Final Office Action dated Nov. 18, 2014, issued in connection with U.S. Appl. No. 13/357,739, filed Mar. 30, 2012, 10 pages.
Non-Final Office Action dated Jun. 19, 2015, issued in connection with U.S. Appl. No. 13/533,105, filed Jun. 26, 2012, 38 pages.
Non-Final Office Action dated Nov. 19, 2014, issued in connection with U.S. Appl. No. 13/848,921, filed Mar. 22, 2013, 9 pages.
Non-Final Office Action dated Aug. 20, 2009, issued in connection with U.S. Appl. No. 11/906,702, filed Oct. 2, 2007, 27 pages.
Non-Final Office Action dated Oct. 20, 2016, issued in connection with U.S. Appl. No. 14/563,515, filed Dec. 8, 2014, 10 pages.
Non-Final Office Action dated Sep. 21, 2016, issued in connection with U.S. Appl. No. 15/080,591, filed Mar. 25, 2016, 9 pages.
Non-Final Office Action dated Sep. 21, 2016, issued in connection with U.S. Appl. No. 15/080,716, filed Mar. 25, 2016, 8 pages.
Non-Final Office Action dated Sep. 21, 2016, issued in connection with U.S. Appl. No. 15/088,283, filed Apr. 1, 2016, 9 pages.
Non-Final Office Action dated Sep. 21, 2016, issued in connection with U.S. Appl. No. 14/088,532, filed Apr. 1, 2016, 9 pages.
Non-Final Office Action dated Dec. 22, 2014, issued in connection with U.S. Appl. No. 13/458,558, filed Apr. 27, 2012, 11 pages.
Non-Final Office Action dated Sep. 22, 2014, issued in connection with U.S. Appl. No. 15/088,906, filed Apr. 1, 2016, 9 pages.
Non-Final Office Action dated Sep. 22, 2014, issued in connection with U.S. Appl. No. 15/155,149, filed May 16, 2016, 7 pages.
Non-Final Office Action dated Jun. 23, 2015, issued in connection with U.S. Appl. No. 13/705,176, filed Dec. 5, 2012, 30 pages.
Non-Final Office Action dated Mar. 23, 2015, issued in connection with U.S. Appl. No. 14/299,847, filed Jun. 9, 2014, 14 pages.
Non-Final Office Action dated Oct. 23, 2014, issued in connection with U.S. Appl. No. 13/848,904, filed Mar. 22, 2013, 11 pages.
Palm, Inc., "Handbook for the Palm VII Handheld," May 2000, 311 pages.
Parasound Zpre2 Zone Preamplifier with PTZI Remote Control, 2005, 16 pages.
Park et al., "Group Synchronization in MultiCast Media Communications," Proceedings of the 5th Research on Multicast Technology Workshop, 2003, 5 pages.
Pillai et al., "A Method to Improve the Robustness of MPEG Video Applications over Wireless Networks," Kent Ridge Digital Labs, 2000, 15 pages.
Polycom Conference Composer User Guide, copyright 2001, 29 pages.
Postel, J., "User Datagram Protocol," RFC: 768, USC/Information Sciences Institute, Aug. 1980, 3 pages.
Preinterview First Office Action dated Jun. 8, 2016, issued in connection with U.S. Appl. No. 14/619,813, filed Feb. 11, 2015, 4 pages.
Pre-Interview First Office Action dated Mar. 10, 2015, issued in connection with U.S. Appl. No. 14/505,027, filed Oct. 2, 2014, 4 pages.
Presentations at WinHEC 2000, May 2000, 138 pages.
PRISMIQ, Inc., "PRISMIQ Media Player User Guide," 2003, 44 pages.
Proficient Audio Systems M6 Quick Start Guide, 2011, 5 pages.
Proficient Audio Systems: Proficient Editor Advanced Programming Guide, 2007, 40 pages.

(56) References Cited

OTHER PUBLICATIONS

Programming Interface for WL54040 Dual-Band Wireless Transceiver, AVAGO0066, Agere Systems, May 2004, 16 pages.
Radio Shack, "Auto-Sensing 4-Way Audio/Video Selector Switch," 2004, 1 page.
RadioShack, Pro-2053 Scanner, 2002 Catalog, part 1, 100 pages.
RadioShack, Pro-2053 Scanner, 2002 Catalog, part 2, 100 pages.
RadioShack, Pro-2053 Scanner, 2002 Catalog, part 3, 100 pages.
RadioShack, Pro-2053 Scanner, 2002 Catalog, part 4, 100 pages.
RadioShack, Pro-2053 Scanner, 2002 Catalog, part 5, 46 pages.
Rane: DragNet software; available for sale at least 2006.
Rangan et al., "Feedback Techniques for Continuity and Synchronization in Multimedia Information Retrieval," ACM Transactions on Information Systems, 1995, pp. 145-176, vol. 13, No. 2.
Real Time Control Protocol (RTCP) and Realtime Transfer Protocol (RTP), RFC 1889 (Jan. 1996) (D+M_0397810-84) (75 pages).
Realtime Streaming Protocol (RTSP), RFC 2326 (Apr. 1998) (D+M_0397945-8036) (92 pages).
Realtime Transport Protocol (RTP), RFC 3550 (Jul. 2003) (D+M_0398235-323) (89 pages).
Re-Exam Final Office Action dated Aug. 5, 2015, issued in connection with U.S. Appl. No. 90/013,423, filed Jan. 5, 2015, 25 pages.
Reexam Non-Final Office Action dated Oct. 17, 2016, issued in connection with U.S. Appl. No. 90/013,756, filed May 25, 2016, 31 pages.
Re-Exam Non-Final Office Action dated Apr. 22, 2015, issued in connection with U.S. Appl. No. 90/013,423, filed Jan. 5, 2015, 16 pages.
Reid, Mark, "Multimedia conferencing over ISDN and IP networks using ITU-T H-series recommendations: architecture, control and coordination," Computer Networks, 1999, pp. 225-235, vol. 31.
RenderingControl:1 Service Template Version 1.01 for UPnP, Version 1.0, (Jun. 25, 2002) (SONDM000115187-249) (63 pages).
Renkus Heinz Manual; available for sale at least 2004, 6 pages.
Request for Ex Parte Reexamination submitted in U.S. Pat. No. 9,213,357 on May 22, 2017, 85 pages.
"Residential Distributed Audio Wiring Practices," Leviton Network Solutions, 2001, 13 pages.
Ritchie et al., "MediaServer:1 Device Template Version 1.01," Contributing Members of the UPnP Forum, Jun. 25, 2002, 12 pages.
Ritchie et al., "UPnP AV Architecture:1, Version 1.0," Contributing Members of the UPnP Forum, Jun. 25, 2002, 22 pages.
Ritchie, John, "MediaRenderer:1 Device Template Version 1.01," Contributing Members of the UPnP Forum, Jun. 25, 2002, 12 pages.
Roland Corporation, "Roland announces BA-55 Portable PA System," press release, Apr. 6, 2011, 2 pages.
Rothermel et al., "An Adaptive Protocol for Synchronizing Media Streams," Institute of Parallel and Distributed High-Performance Systems (IPVR), 1997, 26 pages.
Rothermel et al., "An Adaptive Stream Synchronization Protocol," 5th International Workshop on Network and Operating System Support for Digital Audio and Video, 1995, 13 pages.
Rothermel et al., "An Adaptive Stream Synchronization Protocol," 5th International Workshop on Network and Operating System Support for Digital Audio and Video, Apr. 18-21, 1995, 12 pages.
Rothermel et al., "Clock Hierarchies—An Abstraction for Grouping and Controlling Media Streams," University of Stuttgart Institute of Parallel and Distributed High-Performance Systems, Jan. 1996, 23 pages.
Rothermel et al., "Synchronization in Joint-Viewing Environments," University of Stuttgart Institute of Parallel and Distributed High-Performance Systems, 1992, 13 pages.
Rothermel, Kurt, "State-of-the-Art and Future Research in Stream Synchronization," University of Stuttgart, 3 pages.
"RVL-6 Modular Multi-Room Controller, Installation & Operation Guide," Nile Audio Corporations, 1999, 46 pages.
Schmandt et al., "Impromptu: Managing Networked Audio Applications for Mobile Users," 2004, 11 pages.
Schulzrinne et al., "RTP: A Transport Protocol for Real-Time Applications," Network Working Group, RFC: 3550, Standards Track, Jul. 2003, 104 pages.
Schulzrinne H., et al., "RTP: A Transport Protocol for Real-Time Applications, RFC 3550," Network Working Group, 2003, pp. 1-89.
Simple Network Time Protocol (SNTPI), RFC 1361 (Aug. 1992) (D+M_0397537-46) (10 pages).
Simple Network Time Protocol (SNTPII), RFC 1769 (Mar. 1995) (D+M_0397663-76) (14 pages).
Simple Service Discovery Protocol/1.0 Operating without an Arbiter (Oct. 28, 1999) (24 pages).
Sonos Controller for iPad Product Guide; copyright 2004-2013; 47 pages.
Sonos Digital Music System User Guide, Version: 050801, Aug. 2005, 114 pages.
*Sonos, Inc.* v *D&M Holdings*, D&M Supp Opposition Brief including Exhibits, Mar. 17, 2017, 23 pages.
*Sonos, Inc.* v *D&M Holdings*, Expert Report of Jay P. Kesan including Appendices A-P, Feb. 20, 2017, 776 pages.
*Sonos, Inc.* v *D&M Holdings Inc. et al.*, Complaint for Patent Infringement, filed Oct. 21, 2014, 20 pages.
*Sonos, Inc.* v. *D&M Holdings Inc. et al.*, Defendant's Amended Invalidity Contentions, filed Sep. 14, 2016, 100 pages.
*Sonos, Inc.* v. *D&M Holdings Inc. et al.*, Defendant's Initial Invalidity Contentions, filed Apr. 15, 2016, 97 pages.
*Sonos, Inc.* v. *D&M Holdings Inc. et al.*, Defendant's Preliminary Identification of Indefinite Terms, provided Jul. 29, 2016, 8 pages.
*Sonos, Inc.* v. *D&M Holdings Inc. et al.*, Defendants' Amended Answer, Defenses, and Counterclaims for Patent Infringement, filed Nov. 30, 2015, 47 pages.
*Sonos, Inc.* v. *D&M Holdings Inc. et al.*, Defendants' Answer to Plaintiff's Second Amended Complaint, filed Apr. 30, 2015, 19 pages.
*Sonos, Inc.* v. *D&M Holdings Inc. et al.*, Defendants' First Amended Answer to Plaintiffs' Third Amended Complaint, filed Sep. 7, 2016, 23 pages.
*Sonos, Inc.* v. *D&M Holdings Inc. et al.*, Defendants' Reply in Support of Partial Motion for Judgment on the Pleadings, filed Jun. 10, 2016, 15 pages.
*Sonos, Inc.* v. *D&M Holdings Inc. et al.*, Exhibit A: Defendants' First Amended Answer to Plaintiffs' Third Amended Complaint, provided Aug. 1, 2016, 26 pages.
*Sonos, Inc.* v. *D&M Holdings Inc. et al.*, Exhibit A: Defendants' Second Amended Answer to Plaintiffs' Third Amended Complaint, filed Sep. 9, 2016, 43 pages.
*Sonos, Inc.* v. *D&M Holdings Inc. et al.*, Exhibit A: Defendants' Second Amended Answer to Plaintiffs' Third Complaint, provided Sep. 9, 2016, 88 pages.
*Sonos, Inc.* v. *D&M Holdings Inc. et al.*, First Amended Complaint for Patent Infringement, filed Dec. 17, 2014, 26 pages.
*Sonos, Inc.* v. *D&M Holdings Inc. et al.*, Joint Claim Construction Chart, vol. 1 of 3 with Exhibits A-O, filed Aug. 17, 2016, 30 pages.
*Sonos, Inc.* v. *D&M Holdings Inc. et al.*, Opening Brief in Support of Defendants' Partial Motion for Judgment on the Pleadings for Lack of Patent-Eligible Subject Matter, filed May 6, 2016, 27 pages.
*Sonos, Inc.* v. *D&M Holdings Inc. et al.*, Plaintiff Sonos, Inc.'s Opening Claim Construction Brief, filed Sep. 9, 2016, 26 pages.
*Sonos, Inc.* v. *D&M Holdings Inc. et al.*, Plaintiff Sonos, Inc.'s Response in Opposition to Defendants' Partial Motion for Judgment on the Pleadings, filed May 27, 2016, 24 pages.
*Sonos, Inc.* v. *D&M Holdings Inc. et al.*, Second Amended Complaint for Patent Infringement, filed Feb. 27, 2015, 49 pages.
*Sonos, Inc.* v. *D&M Holdings Inc. et al.*, Sono's Motion to Strike Defendants' New Amended Answer Submitted with Their Reply Brief, provided Sep. 15, 2016, 10 pages.
*Sonos, Inc.* v. *D&M Holdings Inc. et al.*, Sonos's Opposition to Defendants' Motion for Leave to Amend Their Answer to Add the Defense of Inequitable Conduct, provided Oct. 31, 2016, 26 pages.
*Sonos, Inc.* v. *D&M Holdings Inc. et al.*, Third Amended Complaint for Patent Infringement, filed Jan. 29, 2016, 47 pages.
*Sonos, Inc.* v. *D&M Holdings Inc.* Defendants' Final Invalidity Contentions (Jan. 18, 2017) (106 pages).

(56) References Cited

OTHER PUBLICATIONS

*Sonos, Inc.* v. *D&M Holdings* , DI 226, Opinion Denying Inequitable Conduct Defenses, Feb. 6, 2017, updated, 5 pages.
*Sonos, Inc.* v. *D&M Holdings* , DI 242, US District Judge Andrews 101 Opinion, Mar. 13, 2017, 16 pages.
*Sonos, Inc.* v. *D&M Holdings*, Sonos Supp Opening Markman Brief including Exhibits, Mar. 3, 2017, 17 pages.
*Sonos, Inc.* v. *D&M Holdings*, Sonos Supp Reply Markman Brief including Exhibits, Mar. 29, 2017, 36 pages.
*Sonos, Inc.* v. *D&M Holdings Inc. et al.*, Declaration of Steven C. Visser, executed Sep. 9, 2016, 40 pages.
*Sonos, Inc.* v. *D&M Holdings Inc. et al.*, Defendant's Amended Invalidity Contentions Exhibit 1: Defendants' Invalidity Contentions for U.S. Pat. No. 7,571,014 filed Sep. 16, 2016, 270 pages.
*Sonos, Inc.* v. *D&M Holdings Inc. et al.*, Defendant's Amended Invalidity Contentions Exhibit 10: Defendants' Invalidity Contentions for U.S. Pat. No. 9,219,959 filed Sep. 27, 2016, 236 pages.
*Sonos, Inc.* v. *D&M Holdings Inc. et al.*, Defendant's Amended Invalidity Contentions Exhibit 11: Defendants' Invalidity Contentions for U.S. Design Patent No. D559,197 filed Sep. 27, 2016, 52 pages.
*Sonos, Inc.* v. *D&M Holdings Inc. et al.*, Defendant's Amended Invalidity Contentions Exhibit 2: Defendants' Invalidity Contentions for U.S. Pat. No. 8,588,949 filed Sep. 27, 2016, 224 pages.
*Sonos, Inc.* v. *D&M Holdings Inc. et al.*, Defendant's Amended Invalidity Contentions Exhibit 3: Defendants' Invalidity Contentions for U.S. Pat. No. 8,843,224 filed Sep. 27, 2016, 147 pages.
*Sonos, Inc.* v. *D&M Holdings Inc. et al.*, Defendant's Amended Invalidity Contentions Exhibit 4: Defendants' Invalidity Contentions for U.S. Pat. No. 8,938,312 filed Sep. 27, 2016, 229 pages.
*Sonos, Inc.* v. *D&M Holdings Inc. et al.*, Defendant's Amended Invalidity Contentions Exhibit 5: Defendants' Contentions for U.S. Pat. No. 8,938,637 filed Sep. 27, 2016, 213 pages.
*Sonos, Inc.* v. *D&M Holdings Inc. et al.*, Defendant's Amended Invalidity Contentions Exhibit 6: Defendants' Contentions for U.S. Pat. No. 9,042,556 filed Sep. 27, 2016, 162 pages.
*Sonos, Inc.* v. *D&M Holdings Inc. et al.*, Defendant's Amended Invalidity Contentions Exhibit 7: Defendants' Invalidity Contentions for U.S. Pat. No. 9,195,258 filed Sep. 27, 2016, 418 pages.
*Sonos, Inc.* v. *D&M Holdings Inc. et al.*, Defendant's Amended Invalidity Contentions Exhibit 8: Defendants' Invalidity Contentions for U.S. Pat. No. 9,202,509 filed Sep. 27, 2016, 331 pages.
*Sonos, Inc.* v. *D&M Holdings Inc. et al.*, Defendant's Amended Invalidity Contentions Exhibit 9: Defendants' Invalidity Contentions for U.S. Pat. No. 9,213,357 filed Sep. 27, 2016, 251 pages.
*Sonos, Inc.* v. *D&M Holdings Inc. et al.*, Defendant's Initial Invalidity Contentions Exhibit 1: Defendants' Invalidity Contentions for U.S. Pat. No. 7,571,014 filed Apr. 15, 2016, 161 pages.
*Sonos, Inc.* v. *D&M Holdings Inc. et al.*, Defendant's Initial Invalidity Contentions Exhibit 10: Defendants' Contentions for U.S. Pat. No. 9,213,357 filed Apr. 15, 2016, 244 pages.
*Sonos, Inc.* v. *D&M Holdings Inc. et al.*, Defendant's Initial Invalidity Contentions Exhibit 11: Defendants' Invalidity Contentions for U.S. Pat. No. 9,219,959 filed Apr. 15, 2016, 172 pages.
*Sonos, Inc.* v. *D&M Holdings Inc. et al.*, Defendant's Initial Invalidity Contentions Exhibit 12: Defendants' Invalidity Contentions for U.S. Design Patent No. D559,197 filed Apr. 15, 2016, 36 pages.
*Sonos, Inc.* v. *D&M Holdings Inc. et al.*, Defendant's Initial Invalidity Contentions Exhibit 2: Defendants' Invalidity Contentions for U.S. Pat. No. 8,588,949 filed Apr. 15, 2016, 112 pages.
*Sonos, Inc.* v. *D&M Holdings Inc. et al.*, Defendant's Initial Invalidity Contentions Exhibit 3: Defendants' Invalidity Contentions for U.S. Pat. No. 8,843,224 filed Apr. 15, 2016, 118 pages.
*Sonos, Inc.* v. *D&M Holdings Inc. et al.*, Defendant's Initial Invalidity Contentions Exhibit 4: Defendants' Invalidity Contentions for U.S. Pat. No. 8,938,312 filed Apr. 15, 2016, 217 pages.
*Sonos, Inc.* v. *D&M Holdings Inc. et al.*, Defendant's Initial Invalidity Contentions Exhibit 5: Defendants' Invalidity Contentions for U.S. Pat. No. 8,938,637 filed Apr. 15, 2016, 177 pages.
*Sonos, Inc.* v. *D&M Holdings Inc. et al.*, Defendant's Initial Invalidity Contentions Exhibit 6: Defendants' Invalidity Contentions for U.S. Pat. No. 9,042,556 filed Apr. 15, 2016, 86 pages.
*Sonos, Inc.* v. *D&M Holdings Inc. et al.*, Defendant's Initial Invalidity Contentions Exhibit 7: Defendants' Invalidity Contentions for U.S. Pat. No. 9,130,771 filed Apr. 15, 2016, 203 pages.
*Sonos, Inc.* v. *D&M Holdings Inc. et al.*, Defendant's Initial Invalidity Contentions Exhibit 8: Defendants' Invalidity Contentions for U.S. Pat. No. 9,195,258 filed Apr. 15, 2016, 400 pages.
*Sonos, Inc.* v. *D&M Holdings Inc. et al.*, Defendant's Initial Invalidity Contentions Exhibit 9: Defendants' Invalidity Contentions for U.S. Pat. No. 9,202,509 filed Apr. 15, 2016, 163 pages.
*Sonos, Inc.* v. *D&M Holdings Inc. et al.*, Defendant's Preliminary Identification of Prior Art References, provided Jul. 29, 2016, 5 pages.
*Sonos, Inc.* v. *D&M Holdings Inc. et al.*, Defendants' Brief in Support of Their Motion for Leave to Amend Their Answer to Add the Defense of Inequitable Conduct, provided Oct. 12, 2016, 24 pages.
*Sonos, Inc.* v. *D&M Holdings Inc. et al.*, Defendants' Opposition to Sonos's Motion to Strike Defendants' New Amended Answer Submitted With Their Reply, provided Oct. 3, 2016, 15 pages.
*Sonos, Inc.* v. *D&M Holdings Inc. et al.*, Exhibit A: Defendants' Second Amended Answer to Plaintiffs' Third Amended Complaint, provided Oct. 12, 2016, 43 pages.
*Sonos, Inc.* v. *D&M Holdings Inc. et al.*, Exhibit B: Defendants' Second Amended Answer to Plaintiffs' Third Amended Complaint, provided Oct. 12, 2016, 43 pages.
*Sonos, Inc.* v. *D&M Holdings Inc. et al.*, Opening Brief in Support of Defendants' Motion for Leave to Amend Their Answer to Add the Defense of Inequitable Conduct, provided Aug. 1, 2016, 11 pages.
*Sonos, Inc.* v. *D&M Holdings Inc. et al.*, Order, provided Oct. 7, 2016, 2 pages.
*Sonos, Inc.* v. *D&M Holdings Inc. et al.*, Plaintiff's Opposition to Defendants' Motion for Leave to Amend Their Answer to Add the Defense of Inequitable Conduct, provided Aug. 26, 2016, 25 pages.
*Sonos, Inc.* v. *D&M Holdings Inc. et al.*, Redlined Exhibit B: Defendants' First Amended Answer to Plaintiffs' Third Amended Complaint, provided Aug. 1, 2016, 27 pages.
*Sonos, Inc.* v. *D&M Holdings Inc. et al.*, Reply Brief in Support of Defendants' Motion for Leave to Amend Their Answer to Add the Defense of Inequitable Conduct, provided Nov. 10, 2016, 16 pages.
*Sonos, Inc.* v. *D&M Holdings Inc. et al.*, Reply Brief in Support of Defendants' Motion for Leave to Amend Their Answer to Add the Defense of Inequitable Conduct, provided Sep. 9, 2016, 16 pages.
*Sonos, Inc.* v. *D&M Holdings*, DI 206-1, Transcript of 101 Hearing (Nov. 28, 2016) (28 pages).
*Sonos, Inc.* v. *D&M Holdings*, DI 207, Public Joint Claim Construction Brief (Nov. 30, 2016) (88 pages).
*Sonos, Inc.* v. *D&M Holdings*, DI 214, D&M Post-Markman Letter (Dec. 22, 2016) (13 pages).
*Sonos, Inc.* v. *D&M Holdings*, DI 215, Sonos Post-Markman Letter (Dec. 22, 2016) (15 pages).
*Sonos, Inc.* v. *D&M Holdings*, DI 219, Claim Construction Opinion (Jan. 12, 2017) (24 pages).
*Sonos, Inc.* v. *D&M Holdings*, DI 221, Claim Construction Order (Jan. 18, 2017) (2 pages).
*Sonos, Inc.* v. *D&M Holdings*, Markman Hearing Transcript (Dec. 14, 2016) (69 pages).
Sonos Multi-Room Music System User Guide, Version: 091001, 2009, 299 pages.
Sonos Play:3 Product Guide; copyright 2004-2011; 2 pages.
Sonos Play:3 Product Guide; copyright 2004-2012; 14 pages.
Sonos Play:3 Product Guide; copyright 2004-2013; 15 pages.
Sonos Play:3 Teardown; https://www.ifixit.com/Teardown/Sonos+Play%3A3+Teardown/12475; 11 pages.
Sony: AIR-SA 50R Wireless Speaker, Copyright 2009, 2 pages.
Sony: Altus Quick Setup Guide ALT-SA32PC, Copyright 2009, 2 pages.
Sony: BD/DVD Home Theatre System Operating Instructions for BDV-E300, E301 and E801, Copyright 2009, 115 pages.

(56) References Cited

OTHER PUBLICATIONS

Sony: BD/DVD Home Theatre System Operating Instructions for BDV-IT1000/BDV-IS1000, Copyright 2008, 159 pages.
Sony: Blu-ray Disc/DVD Home Theatre System Operating Instructions for BDV-IZ1000W, Copyright 2010, 88 pages.
Sony: DVD Home Theatre System Operating Instructions for DAV-DZ380W/DZ680W/DZ880W, Copyright 2009, 136 pages.
Sony: DVD Home Theatre System Operating Instructions for DAV-DZ870W, Copyright 2008, 128 pages.
Sony Ericsson MS500 User Guide, Copyright 2009, 2 pages.
Sony: Home Theatre System Operating Instructions for HT-IS100, Copyright 2008, 168 pages.
Sony: HT-IS100, 5.1 Channel Audio System, last updated Nov. 2009, 2 pages.
Sony: Multi Channel AV Receiver Operating Instructions, 2007, 80 pages.
Sony: Multi Channel AV Receiver Operating Instructions for STR-DN1000, Copyright 2009, 136 pages.
Sony: STR-DN1000, Audio Video Receiver, last updated Aug. 2009, 2 pages.
Sony: Wireless Surround Kit Operating Instructions for WHAT-SA2, Copyright 2010, 56 pages.
Taylor, Marilou, "Long Island Sound," Audio Video Interiors, Apr. 2000, 8 pages.
Third Party Request for Ex Parte Re-Examination, U.S. Appl. No. 90/013,859, filed Nov. 4, 2016, 424 pages.
TOA Corporation, Digital Processor DP-0206 DACsys2000 Version 2.00 Software Instruction Manual, Copyright 2001, 67 pages.
Understanding Universal Plug and Play, Microsoft White Paper (Jun. 2000) (D+M_0402074-118) (45 pages).
U.S. Appl. No. 60/490,768, filed Jul. 28, 2003, entitled "Method for synchronizing audio playback between multiple networked devices," 13 pages.
U.S. Appl. No. 60/825,407, filed Sep. 12, 2006, entitled "Controlling and manipulating groupings in a multi-zone music or media system," 82 pages.
Universal Plug and Play Device Architecture V. 1.0, (Jun. 8, 2000) (54 pages).
Universal Plug and Play in Windows XP, Tom Fout. Microsoft Corporation (Jul. 2001) (D+M_0402041-73) (33 pages).
Universal Plug and Play ("UPnP") AV Architecture:1 for UPnP, Version 1.0, (Jun. 25, 2002) (D+M_0298151-72) (22 pages).
Universal Plug and Play Vendor's Implementation Guide (Jan. 5, 2000) (7 pages).
UPnP AV Architecture:0.83 (Jun. 12, 2002) (SONDM000115483-504) (22 pages).
Horwitz, Jeremy, "Logic3 i-Station25," retrieved from the Internet: http://www.ilounge.com/index.php/reviews/entry/logic3-i-station25/, last visited Dec. 17, 2013, 5 pages.
Huang C.M., et al., "A Synchronization Infrastructure for Multicast Multimedia at the Presentation Layer," IEEE Transactions on Consumer Electronics, 1997, pp. 370-380, vol. 43, No. 3.
IBM Home Director Installation and Service Manual, Copyright1998, 124 pages.
IBM Home Director Owner's Manual, Copyright 1999, 67 pages.
ID3 tag version 2.4.0—Native Frames, Draft Specification, copyright 2000, 41 pages.
Integra Audio Network Receiver NAC 2.3 Instruction Manual, 68 pages.
Integra Audio Network Server NAS 2.3 Instruction Manual, pp. 1-32.
Integra Service Manual, Audio Network Receiver Model NAC-2.3, Dec. 2002, 44 pages.
Intel Designing a UPnP AV Media Renderer, v. 1.0 ("Intel AV Media Renderer") (May 20, 2003) (SONDM000115117-62) (46 pages).
Intel Media Renderer Device Interface ("Intel Media Renderer") (Sep. 6, 2002) (62 pages).
Intel SDK for UPnP Devices Programming Guide, Version 1.2.1, (Nov. 2002) (30 pages).

International Bureau, International Preliminary Report on Patentability dated Jan. 8, 2015, issued in connection with International Application No. PCT/US2013/046372, filed Jun. 18, 2013, 6 pages.
International Bureau, International Preliminary Report on Patentability, dated Jan. 8, 2015, issued in connection with International Application No. PCT/US2013/046386, filed on Jun. 18, 2013, 8 pages.
International Bureau, International Preliminary Report on Patentability, dated Oct. 17, 2013, issued in connection with International Application No. PCT/IB2012/052071, filed on Apr. 26, 2012, 7 pages.
International Bureau, International Preliminary Report on Patentability dated Jan. 30, 2014, issued in connection with International Application No. PCT/US2012/045894, filed on Jul. 9, 2012, 6 pages.
International Searching Authority, International Search Report dated Aug. 1, 2008, in connection International Application No. PCT/US2004/023102, 5 pages.
International Searching Authority, International Search Report dated Aug. 23, 2012, issued in connection with International Application No. PCT/IB2012/052071, filed on Apr. 26, 2012, 3 pages.
International Searching Authority, International Search Report dated Aug. 26, 2013, issued in connection with International Application No. PCT/US2013/046372, filed on Jun. 18, 2013, 3 pages.
International Searching Authority, International Search Report dated Dec. 26, 2012, issued in connection with International Application No. PCT/US2012/045894, filed on Jul. 9, 2012, 3 pages.
International Searching Authority, International Search Report dated Sep. 30, 2013, issued in connection with International Application No. PCT/US2013/046386, filed on Jun. 18, 2013, 3 pages.
International Searching Authority, Written Opinion dated Aug. 23, 2012, issued in connection with International Application No. PCT/IB2012/052071, filed on Apr. 26, 2012, 6 pages.
International Searching Authority, Written Opinion dated Aug. 26, 2013, issued in connection with International Application No. PCT/US2013/046372, filed on Jun. 18, 2013, 4 pages.
International Searching Authority, Written Opinion dated Dec. 26, 2012, issued in connection with International Application No. PCT/US2012/045894, filed on Jul. 9, 2012, 4 pages.
International Searching Authority, Written Opinion dated Sep. 30, 2013, issued in connection with International Application No. PCT/US2013/046386, filed on Jun. 18, 2013, 6 pages.
Ishibashi et al., "A Comparison of Media Synchronization Quality Among Reactive Control Schemes," IEEE Infocom, 2001, pp. 77-84.
Ishibashi et al., "A Group Synchronization Mechanism for Live Media in Multicast Communications," IEEE Global Telecommunications Conference, 1997, pp. 746-752, vol. 2.
Ishibashi et al., "A Group Synchronization Mechanism for Stored Media in Multicast Communications," IEEE Information Revolution and Communications, 1997, pp. 692-700, vol. 2.
Issues with Mixed IEEE 802.b/802.11g Networks, AVAGO0058, Agere Systems, Feb. 2004, 5 pages.
Japanese Patent Office, Decision of Rejection dated Jul. 8, 2014, issued in connection with Japanese Patent Application No. 2012-178711, 3 pages.
Japanese Patent Office, Notice of Rejection, dated Feb. 3, 2015, issued in connection with Japanese Patent Application No. 2014-521648, 7 pages.
Japanese Patent Office, Notice of Rejection dated Sep. 15, 2015, issued in connection with Japanese Patent Application No. 2014-220704, 7 pages.
Japanese Patent Office, Office Action dated Nov. 1, 2016, issued in connection with Japanese Application No. 2015-238682, 7 pages.
Japanese Patent Office, Office Action dated Jan. 6, 2015, issued in connection with Japanese Patent Application No. 2014-503273, 5 pages.
Japanese Patent Office, Office Action dated May 24, 2016, issued in connection with Japanese Patent Application No. 2014-220704, 7 pages.
Japanese Patent Office, Office Action dated Mar. 29, 2016, issued in connection with Japanese Patent Application No. JP2015-520288, 12 pages.

(56) References Cited

OTHER PUBLICATIONS

Japanese Patent Office, Office Action Summary dated Feb. 2, 2016, issued in connection with Japanese Patent Application No. 2015-520286, 6 pages.
Japanese Patent Office, Office Action Summary dated Sep. 8, 2015, issued in connection with Japanese Patent Application No. 2014-503273, 4 pages.
Japanese Patent Office, Office Action Summary dated Nov. 19, 2013, issued in connection with Japanese Patent Application No. 2012-178711, 5 pages.
Jo et al., "Synchronized One-to-many Media Streaming with Adaptive Playout Control," Proceedings of SPIE, 2002, pp. 71-82, vol. 4861.
Jones, Stephen, "Dell Digital Audio Receiver: Digital upgrade for your analog stereo," Analog Stereo, Jun. 24, 2000 http://www.reviewsonline.com/articles/961906864.htm retrieved Jun. 18, 2014, 2 pages.
Kou et al., "RenderingControl:1 Service Template Verion 1.01," Contributing Members of the UPnP Forum, Jun. 25, 2002, 63 pages.
Lake Processors: Lake® LM Series Digital Audio Processors Operation Manual, 2011, 71 pages.
Levergood et al., "AudioFile: A Network-Transparent System for Distributed Audio Applications," Digital Equipment Corporation, 1993, 109 pages.
LG: RJP-201M Remote Jack Pack Installation and Setup Guide, 2010, 24 pages.
Lienhart et al., "On the Importance of Exact Synchronization for Distributed Audio Signal Processing," Session L: Poster Session II—ICASSP'03 Papers, 2002, 1 page.
LinkSys by Cisco, Wireless Home Audio Controller, Wireless-N Touchscreen Remote DMRW1000 Datasheet, copyright 2008, 2 pages.
LinkSys by Cisco, Wireless Home Audio Controller, Wireless-N Touchscreen Remote DMRW1000 User Guide, copyright 2008, 64 pages.
LinkSys by Cisco, Wireless Home Audio Player, Wireless-N Music Extender DMP100 Quick Installation Guide, copyright 2009, 32 pages.
LinkSys by Cisco, Wireless Home Audio Player, Wireless-N Music Extender DMP100 User Guide, Copyright 2008, 65 pages.
Linux SDK for UPnP Devices v. 1.2 (Sep. 6, 2002) (101 pages).

\* cited by examiner

INTELLIGENTLY MODIFYING THE GAIN PARAMETER OF A PLAYBACK DEVICE

CROSS-REFERENCE TO RELATED APPLICATIONS

The present application is a continuation of U.S. patent application Ser. No. 13/458,558 filed on Apr. 27, 2012, the entire contents of which are hereby incorporated by reference.

BACKGROUND

The presently described technology is directed towards technology for use in the area of consumer electronics. In particular, certain embodiments described herein are directed to intelligently increasing the sound level of a player when combined to play with another player.

Music is very much a part of our everyday lives. And thanks to the advancement of technology, music content is now more accessible than ever. The same can be said of other types of media, such as television, movies, and other audio and video content. In fact, now a user can readily access content over the Internet through an online store, an Internet radio station, online music service, online movie service, and the like, in addition to the more traditional means of accessing audio and video content.

The demand for such audio and video content continues to surge. Given the high demand over the years, technology used to access and play such content has likewise improved. Even still, technology used in accessing the content and/or the playback of such content can be significantly improved or developed in ways that the market or end users do not anticipate.

BRIEF DESCRIPTION OF THE DRAWINGS

Features, aspects, and advantages of the presently described technology will become better understood by a person skilled in the art with regard to the following description, appended claims, and accompanying drawings where:

DETAILED DESCRIPTION

I. Overview

Figure 1:
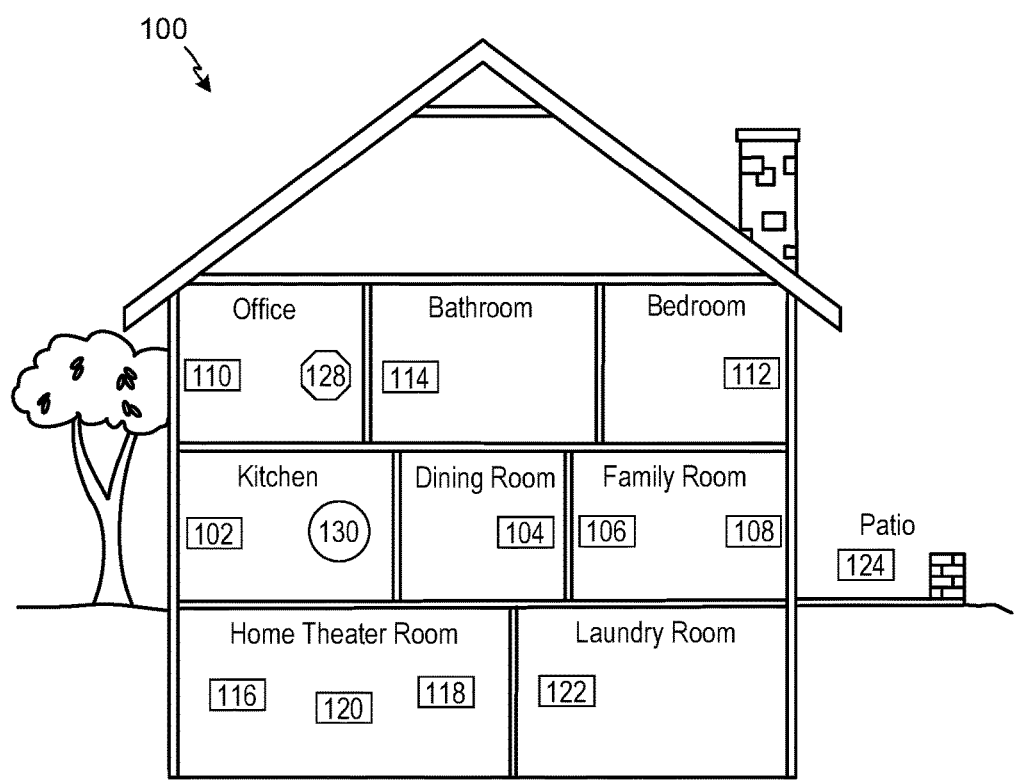
FIG. 1 shows an example configuration in which certain embodiments may be practiced.

The embodiments described herein relate to new technology for increasing the sound level of a player by an automatic configuration adjustment when combined to play, or not play, with another audio output device. The embodiments are particularly useful in a loudspeaker system in which an audio output device, like a subwoofer, is added or removed. The embodiments may also find utility, for example, in connection with any environment and audio system for which an increased sound level is desired.

In an embodiment, for example, an audio signal is received that contains a range of audio frequencies. The audio signal may be an analog or digital representation of sound. The range of audio frequencies might include 20 to 20,000 Hz, for example, or some other range (small or large) audible to the average human. The audio signal is amplified according to a gain parameter. The gain parameter may be stored in memory or some other storage medium. The gain parameter is increased responsive to a determination that no more than a portion of the range of audio frequencies is to be reproduced. The audio signal, containing a portion of the range of audio frequencies, is amplified according to the higher gain parameter.

In another embodiment, for example, a high-pass filter is applied to a full-range audio signal. In some embodiments, the high-pass filer is applied to the full-range audio signal at the player. In alternative embodiments, the high-pass filter is applied before the signal reaches the player. Irrespective of where the signal filtering occurs, it may be determined, such as during zone setup or configuration, that only a portion of the range of audio frequencies is to be reproduced by the player, such as the mid and high frequencies. The bass frequencies may be sent to a subwoofer player. The crossover frequency may be determined based on the player characteristics. With the high pass filter being applied, the maximum sound pressure level (SPL) capability of the player can be greater. To utilize the potential increase in output capability, the amplifier gain of the player is automatically increased. The adjustment of SPL may be reflected in the loudness or volume output of the player, the zone for which the player is a part of, or both.

In another embodiment, for example, a user can pair a subwoofer with another player or players over a wireless network. The subwoofer may be dedicated to the reproduction of low audio frequencies (sometimes referred to as "bass"). The subwoofer can augment the low frequency range of the player(s) covering the mid to high frequency bands. Using a controller, such as described below, the pairing initiates a process for automatically adjusting the performance of the player or players, and in some embodiments adjusts the performance of the subwoofer, if the subwoofer is so programmed.

In some embodiments, a gain parameter may be automatically decreased back to a previous gain setting when it is determined that the player is configured to handle a wider bandwidth signal (e.g., when a subwoofer is removed from the system). For example, the gain setting of the player may dynamically switch to different setting levels based on the setup of the player with additional players in a particular zone or zones or the removal of players from the particular zone or zones.

In some embodiments, gain parameters, including the higher gain parameter, are stored in memory or storage medium at the player. Accordingly, the gain parameters may be accessed when a dynamic switch from one gain parameter to another gain parameter is to occur. More than two gain parameters may be stored, such as in a table of gain parameters, where each gain parameter corresponds to a particular setup.

In some embodiments, the gain parameter is stored in memory or storage medium and the higher (and in some cases, the lower) gain parameter is determined in real-time. Accordingly, the gain new gain parameter is computed or determined responsive to setup of the system or some other dynamic event. In some embodiments, the gain parameters may be computed by a device separate from the player and subsequently sent to the player.

In some embodiments, any of three actions can trigger an SPL change: zone players are bonded (e.g., paired) or removed from a bonded zone, a configuration change is made in the user interface (e.g., the user selects/deselects a "sub" option), and based on the content (e.g., the SPL of the midrange may be increased with 2.1 audio which includes stereo left and right channels and a low-frequency channel, but not with just 2-channel audio which only includes stereo left and right channels).

The description discloses example systems, methods, apparatus, and articles of manufacture including, among other components, firmware and/or software executed on hardware. It should be noted that such systems, methods, apparatus, and/or articles of manufacture are merely illustrative and should not be considered as limiting. For example, it is contemplated that any or all of these firmware, hardware, and/or software components could be embodied exclusively in hardware, exclusively in software, exclusively in firmware, or in any combination of hardware, software, and/or firmware. Accordingly, while the following describes example systems, methods, apparatus, and/or articles of manufacture, the examples provided are not the only way(s) to implement such systems, methods, apparatus, and/or articles of manufacture.

When any of the appended claims are read to cover a purely software and/or firmware implementation, at least one of the elements in at least one example is hereby expressly defined to include a tangible medium such as a memory, DVD, CD, Blu-ray, and so on, storing the software and/or firmware.

Furthermore, reference herein to "embodiment" means that a particular feature, structure, or characteristic described in connection with the embodiment can be included in at least one example embodiment of the invention. The appearances of this phrase in various places in the specification are not necessarily all referring to the same embodiment, nor are separate or alternative embodiments mutually exclusive of other embodiments. As such, the embodiments described herein, explicitly and implicitly understood by one skilled in the art, can be combined with other embodiments.

II. Example Environment

Referring now to the drawings, in which like numerals may refer to like parts throughout the figures. FIG. 1 shows an example system configuration 100 in which certain embodiments described herein may be practiced. By way of illustration, the system configuration 100 represents a home with multiple zones. Each zone, for example, represents a different room or space, such as an office, bathroom, bedroom, kitchen, dining room, family room, home theater room, utility or laundry room, and patio. While not shown here, a single zone may cover more than one room or space. One or more of the zone players 102 to 124 are shown in each respective zone. A controller 130 (e.g., shown in the kitchen for purposes of illustration) provides control to the system configuration 100. It is understood that multiple controllers may operate in system configuration 100, and each controller may be used, for example, to control any zone player or group of zone players or a subset of zone players or group of zone players. The system configuration 100 illustrates an example whole house audio system, though it is understood that the technology described herein is not limited to its particular place of application or to an expansive system like a whole house audio system.

Figure 2A:
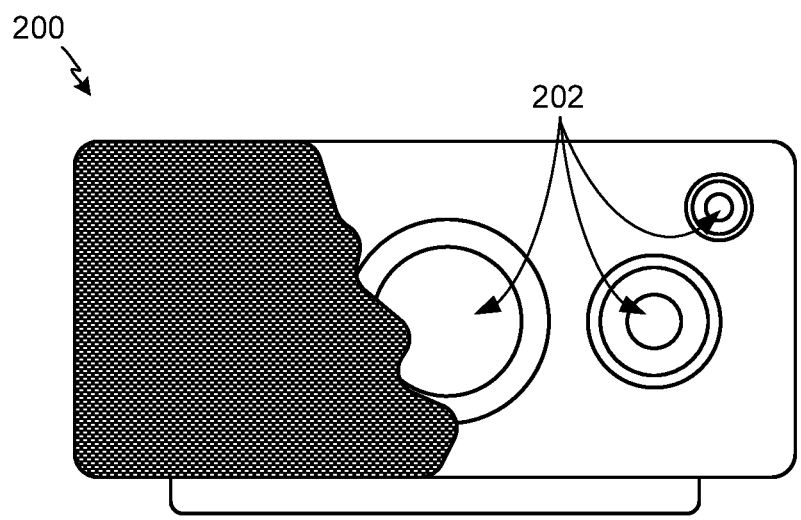
FIG. 2A shows an illustration of an example zone player having a built-in amplifier and speakers.
Figure 2B:
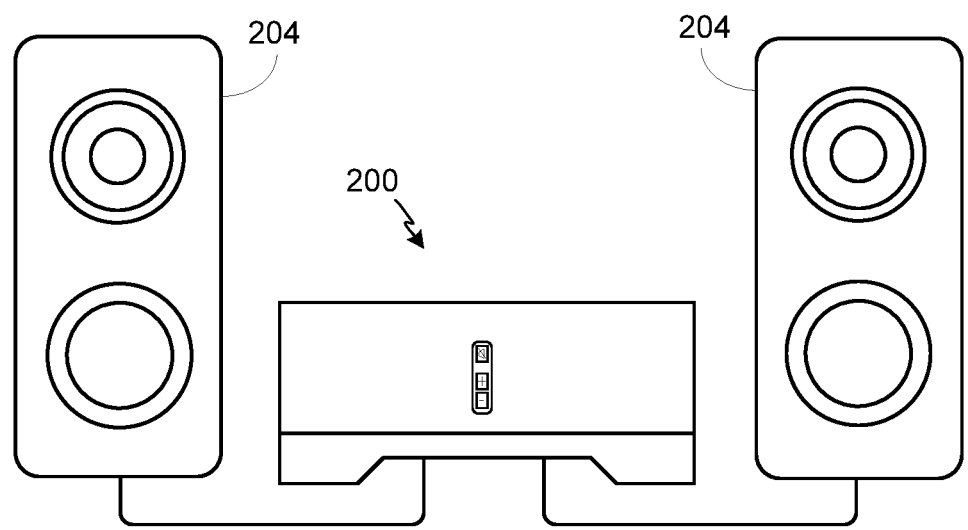
FIG. 2B shows an illustration of an example zone player having a built-in amplifier and connected to external speakers.
Figure 2C:
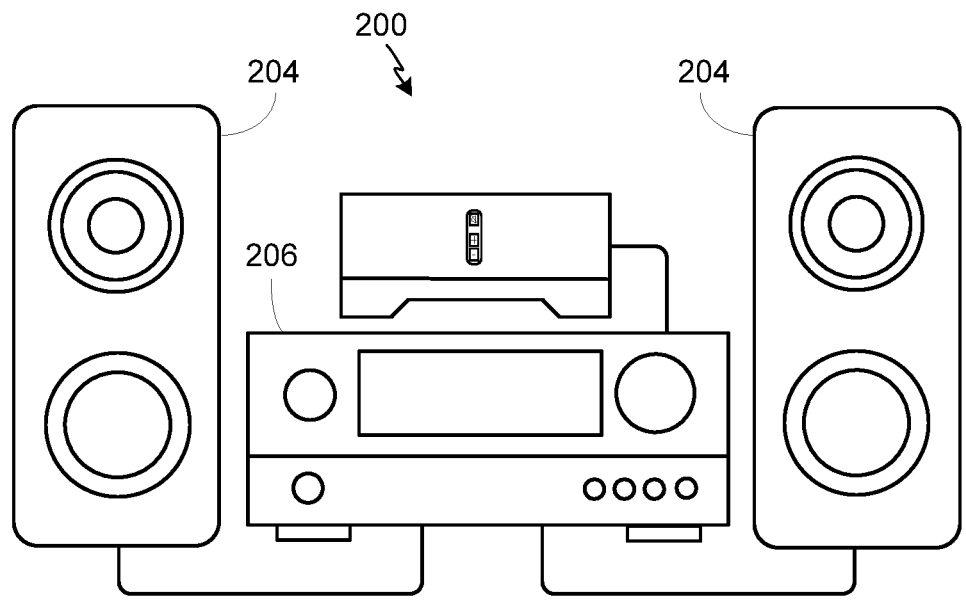
FIG. 2C shows an illustration of an example zone player connected to an A/V receiver and speakers.

FIGS. 2A, 2B, and 2C show example illustrations of a zone player 200. The zone player 200 may correspond to any of zone players 102 to 124. With respect to FIG. 2A, the example zone player 200 includes a built-in amplifier to power speakers 202. A particular speaker might include a tweeter, mid-range driver, or subwoofer. In certain embodiments, the zone player 200 of FIG. 2A may be configured to play stereophonic audio or monaural audio. With respect to FIG. 2B, the example zone player 200 includes a built-in amplifier to power a set of detached speakers 204. Speakers 204 might include any type of loudspeaker. With respect to FIG. 2C, the example zone player 200 does not include an amplifier, but allows a receiver 206, or another audio and/or video type device with built-in amplification, to connect to a data network 128 and play audio received over the data network 128 via receiver 206 and speakers 204. Example zone players include a "PLAY:5", "PLAY:3", "CONNECT", and "CONNECT:AMP," which are offered by Sonos, Inc. of Santa Barbara, Calif. A zone player may also be referred to herein as a "playback device" or a "player", and a zone player is not limited to the particular examples illustrated in FIGS. 2A, 2B, and 2C. For example, a zone player may include a wired or wireless headphone. In another example, a zone player might include a subwoofer. In yet another example, a zone player might include a television.

Figure 3:
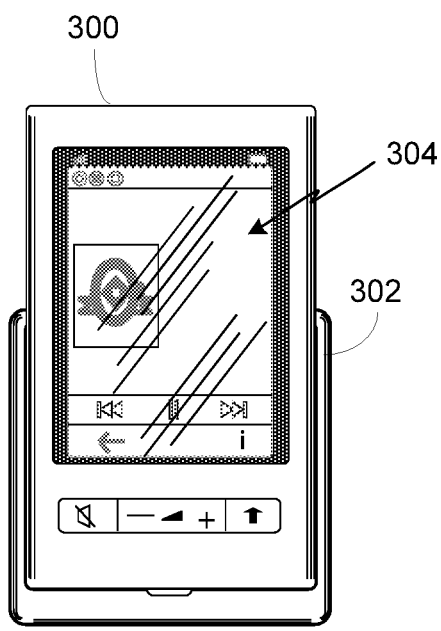
FIG. 3 shows an illustration of an example controller.

FIG. 3 shows an example illustration of a wireless controller 300 in a docking station 302. The controller 300 may correspond to the controlling device 130 of FIG. 1. The controller 300 is provided with a touch screen 304 that allows a user to interact with the controller 300, for example, to retrieve and navigate a playlist of audio items, control operations of one or more zone players, and provide overall control of the system configuration 100. In certain embodiments, any number of controllers may be used to control the system configuration 100. The controllers might be wireless like wireless controller 300 or wired to the data network 128. Furthermore, an application running on any network-enabled portable devices, such as an iPhone, iPad, Android powered phone, or any other smart phone or network-enabled device may be used as a controller by connecting to the data network 128 and/or directly to one or more zone players 102 to 124 or to some other configured device in system configuration 100. An application running on a laptop or desktop PC or Mac may also be used as a controller. Example controllers include a "Sonos CONTROL", "Sonos Controller CR100," "Sonos Controller for iPhone," "Sonos Controller for iPad," "Sonos Controller for Android", "Sonos Controller for Mac or Pc," which are offered by Sonos, Inc. of Santa Barbara, Calif. Those skilled in the art will appreciate the flexibility of such an application and its ability to be ported to a new type of portable device.

Referring back to the system configuration 100 of FIG. 1, a particular zone may contain one or more zone players. For example, the family room contains two zone players 106 and 108, while the kitchen is shown with one zone player 102. Zones may be dynamically configured by positioning a zone player in a room or space and assigning via the controller 130 the zone player to a new or existing zone. As such, zones may be created, combined with another zone, removed, and given a specific name (e.g., "Kitchen"), if so programmed. The zone players 102 to 124 are coupled directly or indirectly to a data network, represented in the figure by 128. The data network 128 is represented by an octagon in the figure to stand out from other components shown in the figure. While the data network 128 is shown in a single location, it is understood that such a network may be distributed in and around the system configuration 100.

Particularly, the data network 128 may be a wired network, a wireless network, or a combination of both. In one example, one or more of the zone players 102 to 124 are wirelessly coupled to the data network 128 based on a proprietary mesh network. In another example, one or more of the zone players 102 to 124 are wirelessly coupled to the data network 128 using a non-mesh topology. In yet another example, one or more of the zone players 102 to 124 are coupled via a wire to the data network 128 using Ethernet or similar technology. In addition to the one or more zone players 102 to 124 connecting to the data network 128, the data network 128 may further allow access to a wide area network, such as the Internet.

In certain embodiments, the data network 128 may be created by connecting any of zone players 102 to 124, or some other connecting device, to a broadband router. Other zone players 102 to 124 may then be added wired or wirelessly to the data network 128. For example, a zone player (e.g., any of zone players 102 to 124) may be added to the system configuration 100 by simply pressing a button on the zone player itself, which enables a connection to be made to the data network 128. The broadband router may be connected to an Internet Service Provider (ISP), for example. The broadband router may be used to form another data network within the system configuration 100, which may be used in other applications (e.g., web surfing). The data network 128 may also be used in other applications, if so programmed. Further, in certain embodiments, the data network 128 is the same network used for other applications in the household, for example.

In certain embodiments, each zone can play from the same audio source as another zone or each zone can play from a different audio source. For example, someone can be grilling on the patio and listening to jazz music via zone player 124, while someone is preparing food in the kitchen and listening to classical music via zone player 102. Further, someone can be in the office listening to the same jazz music via zone player 110 that is playing on the patio via zone player 124. In some embodiments, the jazz music played via zone players 110 and 124 is played in synchrony. Synchronizing playback amongst zones allows for someone to pass through zones while seamlessly listening to the audio. Further, zones may be put into a "party mode" such that all associated zones will play audio in synchrony.

In certain embodiments, a zone contains two or more zone players. For example, the family room contains two zone players 106 and 108, and the home theater room contains at least zone players 116, 118, and 120. A zone may be configured to contain as many zone players as desired, and for example, the home theater room might contain additional zone players to play audio from a 5.1 channel or greater audio source (e.g., a movie encoded with 5.1 or greater audio channels). If a zone contains two or more zone players, such as the two zone players 106 and 108 in the family room, then the two zone players 106 and 108 may be configured to play the same audio source in synchrony, or the two zone players 106 and 108 may be paired to play two separate sounds in left and right channels, for example. In other words, the stereo effects of a sound may be reproduced or enhanced through the two zone players 106 and 108, one for the left sound and the other for the right sound. In certain embodiments, paired zone players may play audio in synchrony with other zone players. A zone with paired players may also be referred to as a "bonded zone."

In certain embodiments, three or more zone players may be configured to play various channels of audio that is encoded with three channels or more sound. For example, the home theater room shows zone players 116, 118, and 120. If the sound is encoded as 2.1 channel audio, then the zone player 116 may be configured to play left channel audio, the zone player 118 may be configured to play right channel audio, and the zone player 120 may be configured to play bass frequencies. Other configurations are possible and depend on the number of zone players and the type of audio. Further, a particular zone may be configured to play a 5.1 channel audio in one instance, such as when playing audio from a movie, and then dynamically switch to play stereo, such as when playing audio from a two channel source.

In certain embodiments, two or more zone players may be sonically consolidated to form a single, consolidated zone player. A consolidated zone player (though comprised of multiple, separate devices) may be configured to process and reproduce sound differently than an unconsolidated zone player or zone players that are paired, because a consolidated zone player will have additional speaker drivers from which sound may be passed. The consolidated zone player may further be paired with a single zone player or yet another consolidated zone player. Each playback device of a consolidated playback device is preferably set in a consolidated mode.

According to some embodiments, one can continue to do any of: group, consolidate, and pair zone players until a desired configuration is complete. The actions of grouping, consolidation, and pairing are preferably performed through a control interface, such as using controller 130, and not by physically connecting and re-connecting speaker wire, for example, to individual, discrete speakers to create different configurations. As such, certain embodiments described herein provide a more flexible and dynamic platform through which sound reproduction can be offered to the end-user.

Sources of audio content to be played by zone players 102 to 124 are numerous. Music from a personal library stored on a computer or networked-attached storage (NAS) may be accessed via the data network 128 and played. Internet radio stations, shows, and podcasts may be accessed via the data network 128. Music services that let a user stream and download music and audio content may be accessed via the data network 128. Further, music may be obtained from traditional sources, such as a turntable or CD player, via a line-in connection to a zone player, for example. Audio content may also be accessed through AirPlay™ wireless technology by Apple, Inc. Audio content received from one or more sources may be shared amongst the zone players 102 to 124 via the data network 128 and controller 130.

III. Example Playback Device

Figure 4:
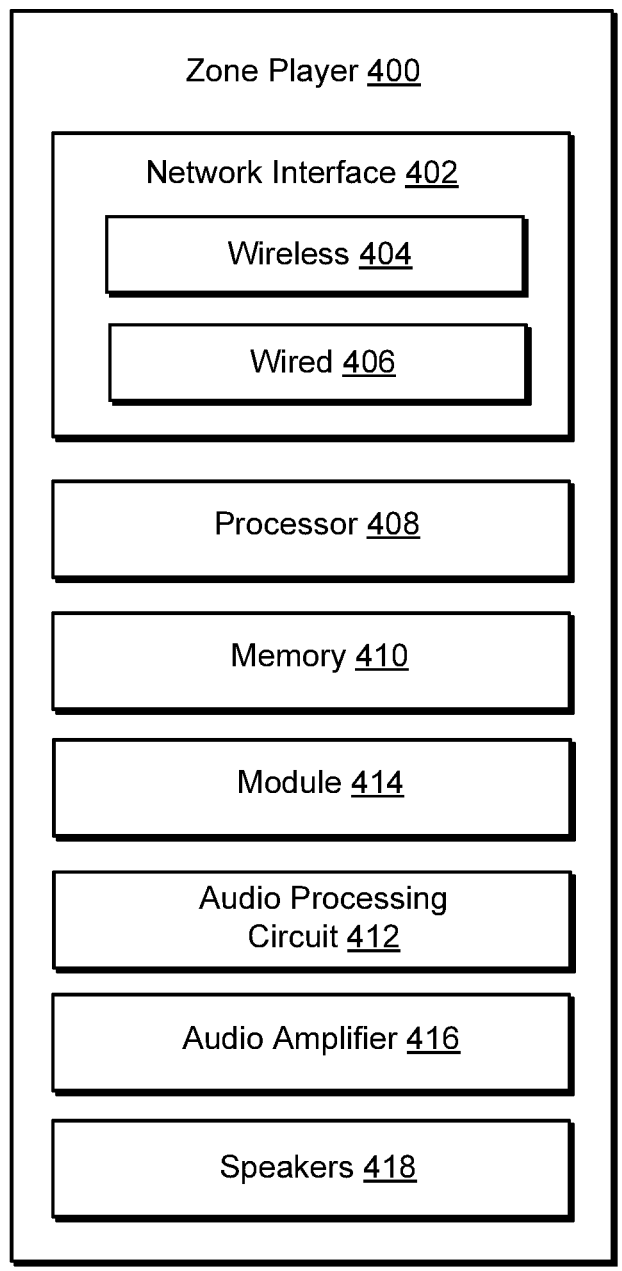
FIG. 4 shows an internal functional block diagram of an example zone player.

Referring now to FIG. 4, there is shown an example functional block diagram of a zone player 400 in accordance with an embodiment. The zone player 400 contains a network interface 402, a processor 408, a memory 410, an audio processing component 412, a module 414, an audio amplifier 416, and a speaker unit 418 connected to the audio amplifier 416. FIG. 2A shows an example illustration of the front side of such a zone player. Other types of zone players may not include the speaker unit 418 (e.g., such as shown in FIG. 2B) or the audio amplifier 416 (e.g., such as shown in FIG. 2C). Further, it is contemplated that the zone player 400 may be integrated into another component. For example, the zone player 400 could be constructed as part of a lamp for indoor or outdoor use. Additionally it is understood that the zone player 400 could be constructed as part of a video reproducing device such as a television or some other device that reproduces sound Referring back to FIG. 4, the network interface 402 facilitates a data flow between zone players and other devices on a data network (e.g., the data network 128 of FIG. 1) and the zone player 400. In some embodiments, the network interface 402 may manage the assembling of an audio source or file into smaller packets that are to be transmitted over the data network or reassembles received packets into the original source or file. In some embodiments, the network interface 402 may further handle the address part of each packet so that it gets to the right destination or intercepts packets destined for the zone player 400. Accordingly, in certain embodiments, each of the packets includes an IP-based source address as well as an IP-based destination address.

In certain embodiments, the network interface 402 may include one or both of a wireless interface 404 and a wired interface 406. The wireless interface 404, also referred to as an RF interface, provides network interface functions for the zone player 400 to wirelessly communicate with other devices in accordance with a communication protocol (e.g., any of the wireless standards IEEE 802.11a, 802.11b, 802.11g, 802.11n, or 802.15). The wired interface 406 provides network interface functions for the zone player 400 to communicate over a wire with other devices in accordance with a communication protocol (e.g., IEEE 802.3 or IEEE 1901). In some embodiments, a zone player includes both of the interfaces 404 and 406. In some embodiments, a zone player 400 includes only the wireless interface 404 or the wired interface 406.

In certain embodiments, the processor 408 is a clock-driven electronic device that is configured to process input data according to instructions stored in memory 410. The memory 410 is data storage that may be loaded with one or more software modules 414, which can be executed by the processor 408 to achieve certain tasks. In one example, a task might be for the zone player 400 to retrieve audio data from another zone player or a device on a network. In a second example, a task might be for the zone player 400 to send audio data to another zone player or device on a network. In a third example, a task might be for the zone player 400 to synchronize playback of audio with one or more additional zone players. In a fourth example, a task might be to pair the zone player 400 with one or more zone players to create a multi-channel audio environment. In a fifth example, a task might be to shape the sound output from zone player 400 based on an orientation of zone player 400, a different zone player, or a group of zone players including zone player 400. Other tasks, such as those described herein, may be achieved via the one or more software modules 414 and the processor 408.

The audio processing component 412 may include one or more digital-to-analog converters (DAC), an audio preprocessing component, an audio enhancement component or a digital signal processor, and so on. In certain embodiments, the audio that is retrieved via the network interface 402 is processed and/or intentionally altered by the audio processing component 412. Further, the audio processing component 412 may produce analog audio signals. The processed analog audio signals are then provided to the audio amplifier 416 for play back through speakers 418. In addition, the audio processing component 412 may include necessary circuitry to process analog or digital signals as inputs to play from zone player 400, send to another zone player on a network, or both play and send to another zone player on the network. An example input includes a line-in connection (e.g., an auto-detecting 3.5 mm audio line-in connection).

The audio amplifier 416 is a device that amplifies audio signals to a level for driving one or more speakers 418. The one or more speakers 418 may include an individual transducer (e.g., a "driver") or a complete speaker system that includes an enclosure including one or more drivers. A particular driver might be a subwoofer (for low frequencies), a mid-range driver (middle frequencies), and a tweeter (high frequencies). An enclosure might be sealed or ported.

A zone player 400 may also be referred to herein as a playback device. An example playback device includes a Sonos PLAY:5, which is manufactured by Sonos, Inc. of Santa Barbara, Calif. The PLAY:5 is an example zone player with a built-in amplifier and speakers. In particular, the PLAY:5 is a five-driver speaker system that includes two tweeters, two mid-range drivers, and one woofer. When playing audio content via the PLAY:5, the left audio data of a track is sent out of the left tweeter and left mid-range driver, the right audio data of a track is sent out of the right tweeter and the right mid-range driver, and mono bass is sent out of the woofer. Further, both mid-range drivers and both tweeters have the same equalization (or substantially the same equalization). That is, they are both sent the same frequencies, just from different channels of audio. Audio from Internet radio stations, online music and video services, downloaded music, analog audio inputs, television, DVD, and so on may be played from a Sonos PLAY:5. While the PLAY:5 is an example of a zone player with speakers, it is understood that a zone player with speakers is not limited to one with a certain number of speakers (e.g., five speakers as in the PLAY:5), but rather can contain one or more speakers. Further, a zone player may be part of another device, which might even serve a purpose different than audio (e.g., a lamp or television).

IV. Example Controller

Figure 5:
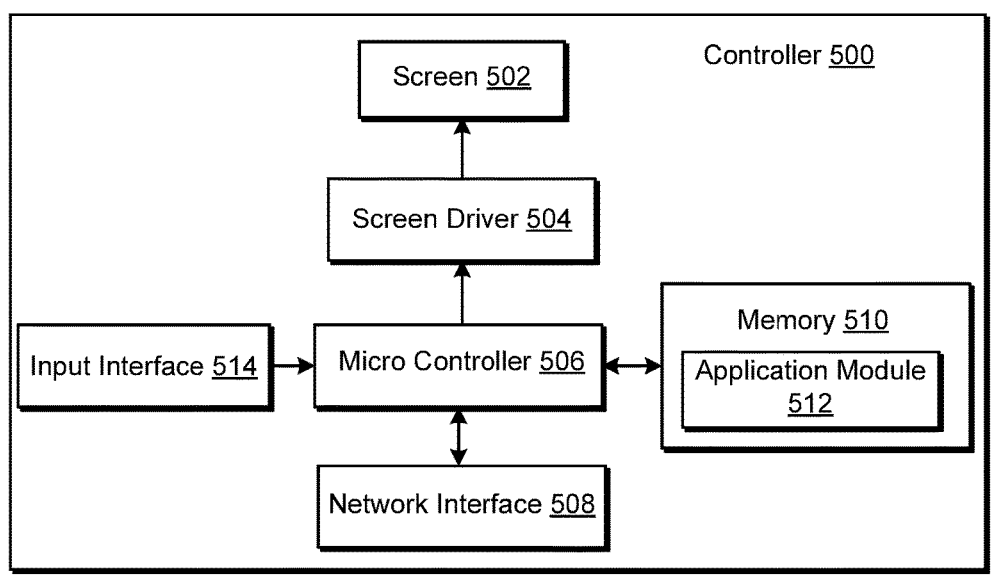
FIG. 5 shows an internal functional block diagram of an example controller.

Referring now to FIG. 5, there is shown an example controller 500, which may correspond to the controlling device 130 in FIG. 1. The controller 500 may be used to facilitate the control of multi-media applications, automation and others in a system. In particular, the controller 500 is configured to facilitate a selection of a plurality of audio sources available on the network and enable control of one or more zone players (e.g., the zone players 102 to 124 in FIG. 1) through a wireless network interface 508. According to one embodiment, the wireless communications is based on an industry standard (e.g., infrared, radio, wireless standards IEEE 802.11a, 802.11b 802.11g, 802.11n, or 802.15). Further, when a particular audio is being accessed via the controller 500 or being played via a zone player, a picture (e.g., album art) or any other data, associated with the audio source may be transmitted from a zone player or other electronic device to the controller 500 for display.

The controller 500 is provided with a screen 502 and an input interface 514 that allows a user to interact with the controller 500, for example, to navigate a playlist of many multimedia items and to control operations of one or more zone players. The screen 502 on the controller 500 may be an LCD screen. The screen 500 communicates with and is commanded by a screen driver 504 that is controlled by a microcontroller (e.g., a processor) 506. The memory 510 may be loaded with one or more application modules 512 that can be executed by the microcontroller 506 with or without a user input via the user interface 514 to achieve certain tasks. In one example, an application module 512 is configured to facilitate grouping a number of selected zone players into a zone group and synchronizing the zone players for audio play back. In another example, an application module 512 is configured to control the audio sounds (e.g., volume) of the zone players in a zone group. In operation, when the microcontroller 506 executes one or more of the application modules 512, the screen driver 504 generates control signals to drive the screen 502 to display an application specific user interface accordingly.

The controller 500 includes a network interface 508 that facilitates wireless communication with a zone player. In one embodiment, the commands such as volume control and audio playback synchronization are sent via the network interface 508. In another embodiment, a saved zone group configuration is transmitted between a zone player and a controller via the network interface 508. The controller 500 may control one or more zone players, such as 102 to 124 of FIG. 1. There may be more than one controller for a particular system. Further, a controller may be integrated into a zone player.

It should be noted that other network-enabled devices such as an iPhone, iPad or any other smart phone or network-enabled device (e.g., a networked computer such as a PC or Mac) may be used as a controller to interact or control zone players in a particular environment. According to one embodiment, a software application or upgrade may be downloaded onto a network enabled device to perform the functions described herein.

In certain embodiments, a user may create a zone group including at least two zone players from the controller 500. The zone players in the zone group may play audio in a synchronized fashion, such that all of the zone players in the zone group play back an identical audio source or a list of identical audio sources in a synchronized manner such that no (or substantially no) audible delays or hiccups could be heard. Similarly, in one embodiment, when a user increases the audio volume of the group from the controller 500, the signals or data of increasing the audio volume for the group are sent to one of the zone players and causes other zone players in the group to be increased together in volume.

A user via the controller 500 may group zone players into a zone group by activating a "Link Zones" or "Add Zone" soft button, or de-grouping a zone group by activating an "Unlink Zones" or "Drop Zone" button. For example, one mechanism for 'joining' zone players together for audio play back is to link a number of zone players together to form a group. To link a number of zone players together, a user may manually link each zone player or room one after the other. For example, assume that there is a multi-zone system that includes the following zones: Bathroom, Bedroom, Den, Dining Room, Family Room, and Foyer.

In certain embodiments, a user can link any number of the six zone players, for example, by starting with a single zone and then manually linking each zone to that zone.

In certain embodiments, a set of zones can be dynamically linked together using a command to create a zone scene or theme (subsequent to first creating the zone scene). For instance, a "Morning" zone scene command may link the Bedroom, Office, and Kitchen zones together in one action. Without this single command, the user would need to manually and individually link each zone. The single command might include a mouse click, a double mouse click, a button press, a gesture, or some other programmed action. Other kinds of zone scenes may be programmed.

In certain embodiments, a zone scene may be triggered based on time (e.g., such as an alarm clock function). For instance, a zone scene may be set to apply at 8:00 am. The system could link appropriate zones automatically, set specific music to play, and then stop the music after a defined duration. Although any particular zone may be triggered to an On or Off state based on time, for example, a zone scene enables any zones linked to the scene to play a predefined audio (e.g., a favorable song, a predefined playlist) at a specific time and/or for a specific duration. If, for any reason, the scheduled music failed to be played (e.g., an empty playlist, no connection to a share, failed UPnP, no Internet connection for an Internet Radio station), a backup buzzer may be programmed to sound. This buzzer may include a sound file that is stored in a zone player.

V. Maximizing System Performance

Figure 6:
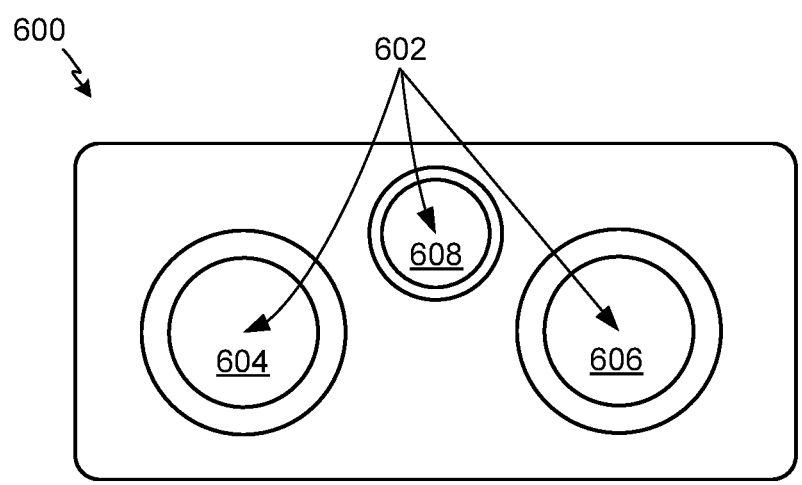
FIG. 6 shows an illustration of an example zone player.

FIG. 6 shows an illustration of an example zone player 600 (or "player") having a built-in amplifier and speakers 602. The zone player 600 may reproduce a stereophonic signal, for example, such that the left channel audio may be routed to the left speaker 604 and the right channel audio may be routed to the right speaker 606. A monaural signal may be routed to the tweeter 608. Other frequency routing configurations are possible in zone player 600 and/or with other types of zone players.

Let us assume that zone player 600 is designed to be a full-range player. Accordingly, zone player 600 is designed to reproduce as much of the audible frequency as possible in a given audio input signal, such as low, mid, and high frequency signals. Zone player 600 may be placed in a zone (e.g., an area or location) to wirelessly receive (or via a wire) an audio signal and play the full-range of that audio signal in that area. If so desired, a user may also pick up and move zone player 600 to a different zone and play the full-range of the audio signal in the new zone.

Such as described above, it is understood that zone player 600 contains, among other components, (1) speaker components, such as one or more acoustic transducers (e.g., speakers 602), and (2) amplifier components, such as one or more amplifiers to power the speaker components. Given its particular design, zone player 600 has a maximum sound pressure level (SPL) output. The maximum SPL output for zone player 600 may be based on, for example, the cone area and excursion limits of the speaker components, in addition to the available amplifier power. In other words, the maximum SPL may be the highest output the zone player 600 can manage short of damage, not exceeding a particular distortion level, or short of an artificial limiter. Players of different sizes and capabilities can exhibit a different SPL output.

In addition, the spectral content of an audio input signal can have significant affect on the excursion and heating of the speaker components and amplifier power being used by zone player 600. For instance, a wider bandwidth signal input into zone player 600 may generally push the zone player 600 to its limits at a lower SPL output. Reaching its limit at a lower SPL output is more likely given that zone player 600 is currently configured to be a full-range player and is configured to play low frequency sound.

Figure 7:
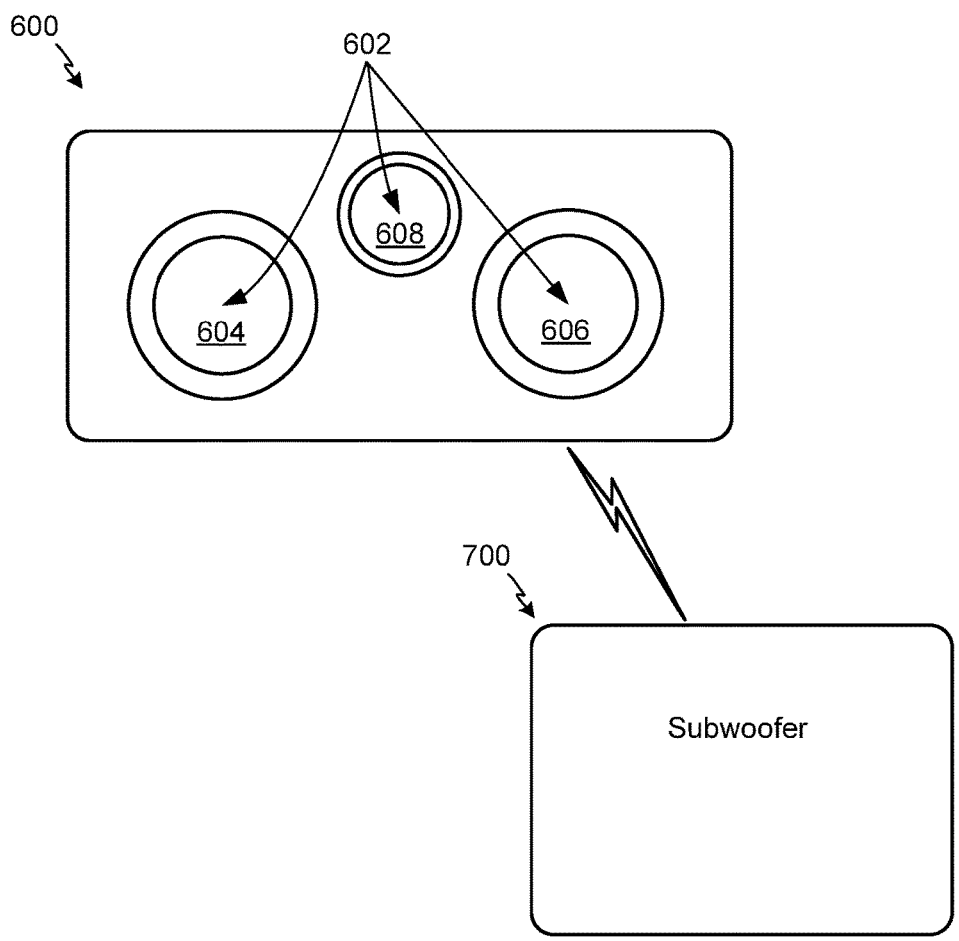
FIG. 7 shows an illustration of the example zone player in FIG. 6, but with the addition of a second zone player.

FIG. 7 shows zone player 600 from FIG. 6 combined with (bonded to) subwoofer 700. Subwoofer 700 is also player like zone player 600, but designed to reproduce low frequency sound. Subwoofer 700 may be added to the zone or area of zone player 600 to play the lower frequency components while zone player 600 plays the midrange to higher frequency components. Alternatively, zone player 600 may be moved to or added to the zone or area that contains subwoofer 700. Subwoofer 700 may be paired to operate with zone player 600 via a wired or wireless network, such as described above. The process of adding subwoofer 700 to a zone and/or pairing it to a player like zone player 600 can be performed by a set up wizard-like software program that guides the user through the set up process. For example, the subwoofer 700 may be plugged into a standard wall outlet for electrical power and then joined to zone player 600 wirelessly or wired using a wireless controller, such as described above, and the set up wizard-like program. A similar process may be performed to add (or bond) zone player 600 to subwoofer 700.

In some embodiments, once subwoofer 700 is added by the user to the system, zone player 600 and subwoofer 700 may each store an updated state variable that indicates the two have been set up to play audio together. For example, zone player 600 knows that it is paired with subwoofer 700 based on its stored state variable. Similarly, subwoofer 700 knows that it is paired with zone player 600 based on its stored state variable.

In some embodiments, only zone player 600 contains an updated state variable that identifies it has been paired with subwoofer 700, and therefore zone player 600 may pass certain kinds of information to subwoofer 700 over the network connection, like crossover filter characteristics (e.g., frequency and Q) to subwoofer 700 in order to optimize the system performance based on the parameters of zone player 600, subwoofer 700, or both zone player 600 and subwoofer 700. In some embodiments, the opposite may be true where it is subwoofer 700, instead of zone player 600, which contains the updated state variable.

In some embodiments, zone player 600 may be configured to send the lower frequency signal to subwoofer 700 over the network connection, and therefore subwoofer 700 may not need to update its configuration. In some embodiments, the opposite may be true where it is subwoofer 700 that sends the midrange and higher frequency signal to zone player 600, and therefore zone player 600 may not need to update its configuration. In some embodiments, the full-frequency signal is received at both zone player 600 and subwoofer 700, and each device (e.g., zone player 600 and subwoofer 700) filters the full-frequency signal according to its playback capabilities and/or settings.

When subwoofer 700 is configured for use with a full-range player, such as zone player 600, the zone player 600 automatically makes adjustments to its settings to optimize performance. The adjustments are made automatically by the system and responsive to pairing such players, usually at the time of setting up the system. In one embodiment, the crossover filter characteristics (e.g., frequency and Q) are determined automatically based on the parameters of zone player 600 and subwoofer 700. In another embodiment, a time delay is determined and added to the audio output of zone player 600, subwoofer 700, or both zone player 600 and subwoofer 700. The time delay can provide improved synchronous time arrival of signals sent out from zone player 600 and subwoofer 700. In another embodiment, upmixing is automatically enabled for content that does not natively support the configuration (e.g., stereo content can be upmixed to 2.1 to support the subwoofer). In another embodiment, a dynamic range compressor or limiter function may be disabled. In yet another embodiment, the amplifier gain for zone player 600 is automatically increased. Particularly, a high-pass filter is applied to the input audio signal going to zone player 600, so that the lower frequency sound can be sent over the wired or wireless network to be played by subwoofer 700. Zone player 600 is no longer configured to be a full-range player, but instead is configured to play midrange and high frequency aspects of the audio signal. As such, there will be a smaller amount of excursion required of the low frequency speaker components and the maximum SPL capability of zone player 600 can be greater. To take advantage of the potential increase in output capability, the gain for zone player 600 is automatically increased. In some embodiments, the new gain value is stored at zone player 600.

Additionally, in some embodiments, when subwoofer 700 is configured for use with a full-range player, such as zone player 600, the subwoofer 700 automatically makes one or more adjustments to optimize performance. The adjustments are made automatically and responsive to pairing the subwoofer 700 to another player. Particularly, in some embodiments, the crossover filter characteristics (e.g., frequency and Q) may be determined based on the parameters of the pair player or players. In some embodiments, a time delay may be determined. In some embodiments, the gain may be adjusted to optimize subwoofer performance.

The example above illustrates a number of advantages that may apply to one or more of the above embodiments. First, a zone that contains at least one player is optimized for its current configuration, and such configuration is automatically adjusted when an additional player, such as a subwoofer is added to the zone. An adjustment might include, for example, a crossover adjustment, an EQ adjustment, a timing delay adjustment, and a gain adjustment to play louder. As such, each part of the zone, and the zone as a whole, is optimized for better performance. Second, by reducing the low frequency output of a player, the software can make an automatic adjustment to its gain and play louder (e.g., up to 3 dB in some embodiments, or more depending on the system). Third, pairing between two or more players can be automatically optimized based on the parameters of the players themselves. Such parameters are made known, for example, during the set up process. Fourth, the system is optimized based on its current configuration. For example, a zone may be optimized if it only includes a full-range single player, a full-range single player with a subwoofer, a stereo pair between two players, a stereo pair between two players and a subwoofer, a multi-channel pairing between three or more players as in home theater, and so on. Such optimization may be triggered at set up of the zone.

Furthermore, it is understood that the above example is not limited to the addition of a subwoofer or to a full-range player, but is applicable for all players that can be used to amplify and reproduce a portion of the full audio content (even players without a speaker, such as the Sonos CONNECT:AMP product may benefit from the technology described herein). For example, if a zone includes a first player that is designed to play mid and high frequencies and it is paired with a second player that is designed to play mid frequencies, then the described technology may be used to play only the high frequencies from the first player and increase its SPL output by an automatic gain adjustment, for example.

In some embodiments, a person using a product without an amp, like the Sonos CONNECT product, may also benefit from the described technology if, for example, the amplifier that amplifiers the signal output of the product is configured to receive and/or use adjustable gain parameters. As such, it is not required that the various components that perform the described technology be contained in a single product or device (e.g., amplifier and speakers are not required to be a part of the same product), but rather the various components may be interconnected in such a way so as to be considered a "player" such as described herein to intelligently increase the loudness of the player. An example interconnected system may include a Sonos CONNECT product wired to an A/V receiver in which the amplifier of the A/V receiver is configured to use different gain parameters based on the setup or configuration of a zone or zones in order to optimize the loudness of such system. Another example interconnected system may include a Sonos CONNECT product wired to an active speaker or speakers in which the amplifier contained with the speaker(s) is able to use different gain a parameters based on the setup or configuration of a zone or zones in order to optimize the loudness of such system.

Figure 8:
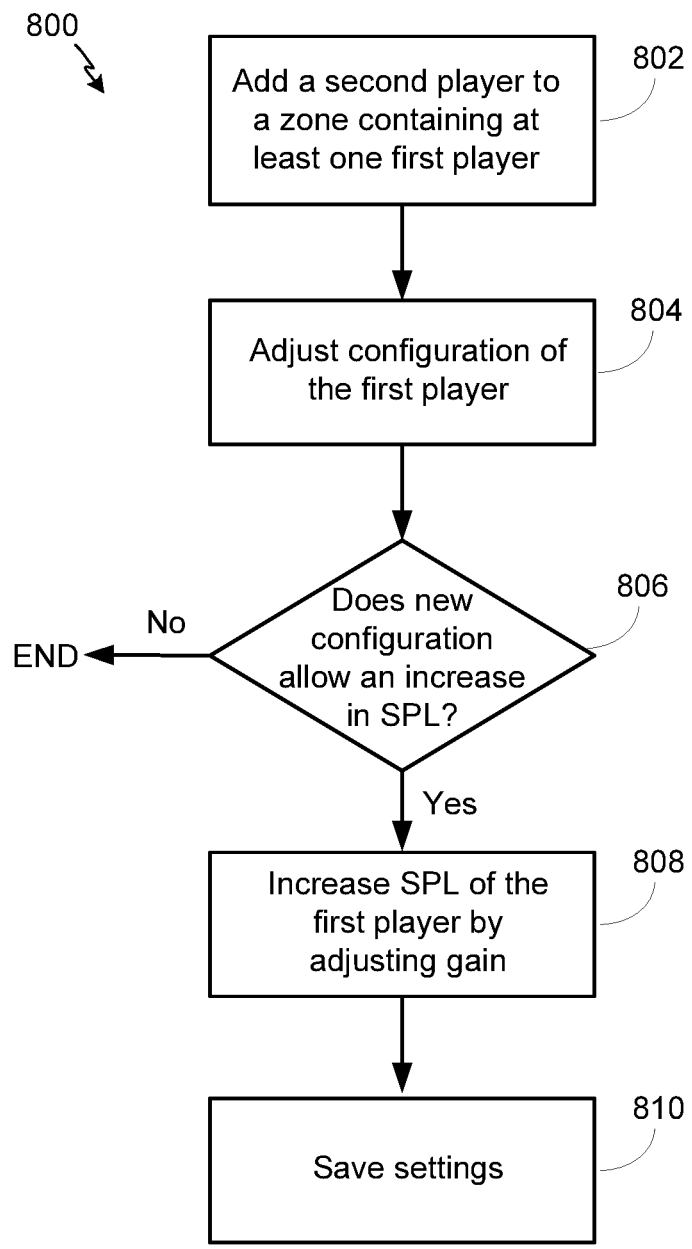
FIG. 8 shows a flowchart illustrating an example method for intelligently adjusting a sound level of a first player when combined to play with a second player.

FIG. 8 shows a flowchart illustrating a method 800 for dynamically adjusting a sound level of a first player when combined with a second player. Method 800 includes adding a second player to a zone that contains at least one first player per block 802.

Block 802 may include pairing the two or more players such that they play audio in synchrony, but they play various portions of the audio including different frequency components of the signal. Initial pairing or bonding occurs during set up of the zone when the second player is added to the zone. The second player may operate wirelessly to receive the audio signal from the first player or from a different player in the zone or not in the zone. In some embodiments, both players receive the audio content wirelessly.

Block 804 calls for adjusting the configuration of the first player. In some embodiments, any of three actions can trigger the configuration of the player: zone players are bonded (e.g., paired) or removed from a bonded zone, a configuration change is made in the user interface (e.g., the user selects/deselects a "sub" option), and based on the content (e.g., the SPL of the midrange may be increased with 2.1 audio which includes stereo left and right channels and a low-frequency channel, but not with just 2-channel audio which only includes stereo left and right channels). When the second player is added to the zone, for example, the configuration of the first player is automatically adjusted to optimize the performance of the first player and the zone itself. In the example described above, the first player can be configured in different ways. One such way is by applying a high-pass filter to the input audio signal if, for example, the second player contains a subwoofer. With the high-pass filter being applied to the input audio signal of the first player, the maximum SPL capability of the first player can be greater because it no longer has to reproduce the lower frequency part of the signal. To take advantage of the potential increase in output capability, the gain for the first player is automatically increased. In some embodiments, the gain may be increased for one or more (or all) amplifiers in the first player if more than one amplifier is used. In some embodiments, the gain may be increased only for those amplifiers that power the speaker components whose burden has been reduced because of the addition of the second player.

In some embodiments, for example, a signal processing filter is applied to an audio signal at the player. In alternative embodiments, the signal-processing filter is applied by a device or component before the signal reaches the player.

Block 806 calls for determining whether the new configuration of the first player allows an increase in SPL. In some embodiments, this determination is made by the first player. It might be based on the application of a signal processing filter, the type of input signal, or some other indication. In some embodiments, this determination is made by another device and the result is sent to the first player.

Block 808 calls for increasing the gain of one or more amplifiers in the first player if the new configuration allows an increase in SPL. In some embodiments, the gain may be determined by the first player. In some embodiments, the gain may be determined by another device and then sent to the first player. The increase in gain may be noticed by a user through increased loudness of the first player or the loudness of the first and second player together, for example.

In some embodiments, the process includes determining in real-time the higher gain parameter based on the portion of the range of audio frequencies to be reproduced by the first player. For example, if the lower frequencies will be handled by the second player, then the gain can go higher than if the second player handles a different range of frequencies.

In some embodiments, the higher gain parameter is defined prior to the determination that no more than the portion of the range of audio frequencies is to be reproduced by the first player. In other words, the higher gain parameter is not determined in real-time.

Block 810 calls for saving the new settings. The first player reproduces its audio signal using the new, saved settings. The settings may change when the configuration is no longer optimized due to, for example, removal of the second player from the zone.

VI. Conclusion

The example embodiments described herein provide for numerous ways to increase the sound level of a player when combined to play audio with another player. Technology described herein may be used in any application where optimized sound is desired, such as in residential or commercial settings, motorized vehicles, boats, airplanes, and in outdoor locations. Technology described herein may also be used in centralized networked audio systems instead of mesh network or peer-to-peer type network systems.

For example, a device contains an amplifier for receiving an audio signal containing a range of audio frequencies and amplifying, according to a gain parameter, the audio signal to be reproduced by at least one speaker; and a processor for automatically increasing the gain parameter to a higher gain parameter responsive to a determination that no more than a portion of the range of audio frequencies is to be reproduced by the at least one speaker; wherein the amplifier amplifies, according to the higher gain parameter, the audio signal containing no more than the portion of the range of audio frequencies to be reproduced by the at least one speaker.

In another example, a method includes receiving an audio signal containing a range of audio frequencies; amplifying, according to a gain parameter, the audio signal to be reproduced by at least one speaker; automatically increasing the gain parameter to a higher gain parameter responsive to a determination that no more than a portion of the range of audio frequencies is to be reproduced by the at least one speaker; and amplifying, according to the higher gain parameter, the audio signal containing no more than the portion of the range of audio frequencies to be reproduced by the at least one speaker.

In yet another example, a computer readable storage medium including instructions for execution by a processor, the instructions, when executed, cause the processor to implement a method comprising: receiving an audio signal containing a range of audio frequencies; enabling amplification, according to a gain parameter, the audio signal to be reproduced by at least one speaker; automatically increasing the gain parameter to a higher gain parameter responsive to a determination that no more than a portion of the range of audio frequencies is to be reproduced by the at least one speaker; and enabling amplification, according to the higher gain parameter, the audio signal containing no more than the portion of the range of audio frequencies to be reproduced by the at least one speaker.

While example manners of implementing the example systems have been illustrated in the accompanying Figures, one or more of the elements, processes and/or devices illustrated in the Figures may be combined, divided, re-arranged, omitted, eliminated and/or implemented in any other way. Further, the examples illustrated in the Figures may be implemented by hardware, software, firmware and/or any combination of hardware, software and/or firmware. Thus, for example, the depicted elements may be implemented by one or more circuit(s), programmable processor(s), application specific integrated circuit(s) (ASIC(s)), programmable logic device(s) (PLD(s)) and/or field programmable logic device(s) (FPLD(s)), etc. When any of the apparatus or system claims of this patent are read to cover a purely software and/or firmware implementation, at least one of the example elements is hereby expressly defined to include hardware and/or a tangible computer readable medium such as a memory, DVD, CD, etc. storing the software and/or firmware. Further still, the example systems shown in the Figures may include one or more elements, processes and/or devices in addition to, or instead of, those illustrated in the accompanying Figures and/or may include more than one of any or all of the illustrated elements, processes and devices.

FIG. 8 is a flowchart representative of example machine-readable instructions that may be executed to implement the example systems shown and described herein. In the example of FIG. 8, the machine-readable instructions include a program for execution by a processor or micro controller. The program may be embodied in software stored on a tangible computer readable medium such as a CD-ROM, a floppy disk, a hard drive, a digital versatile disk (DVD), or a memory associated with a processor, but the entire program and/or parts thereof could alternatively be executed by a device other than the processor and/or embodied in firmware or dedicated hardware. Further, although the example program is described with reference to the flowchart illustrated in FIG. 8, many other methods of implementing the example systems may alternatively be used. For example, the order of execution of the blocks may be changed, and/or some of the blocks described may be changed, eliminated, or combined.

As mentioned above, the example processes of FIG. 8 may be implemented using coded instructions (e.g., computer readable instructions) stored on a tangible computer readable medium such as a hard disk drive, a flash memory, a read-only memory (ROM), a compact disk (CD), a digital versatile disk (DVD), a cache, a random-access memory (RAM) and/or any other storage media in which information is stored for any duration (e.g., for extended time periods, permanently, brief instances, for temporarily buffering, and/or for caching of the information). As used herein, the term tangible computer readable medium is expressly defined to include any type of computer readable storage and to exclude propagating signals. Additionally or alternatively, the example processes of FIG. 8 may be implemented using coded instructions (e.g., computer readable instructions) stored on a non-transitory computer readable medium such as a hard disk drive, a flash memory, a read-only memory, a compact disk, a digital versatile disk, a cache, a random-access memory and/or any other storage media in which information is stored for any duration (e.g., for extended time periods, permanently, brief instances, for temporarily buffering, and/or for caching of the information). As used herein, the term non-transitory computer readable medium is expressly defined to include any type of computer readable medium and to exclude propagating signals.

Various inventions have been described in sufficient detail with a certain degree of particularity. It is understood to those skilled in the art that the present disclosure of embodiments has been made by way of examples only and that numerous changes in the arrangement and combination of parts can be resorted without departing from the spirit and scope of the present disclosure as claimed. While the embodiments discussed herein can appear to include some limitations as to the presentation of the information units, in terms of the format and arrangement, the embodiments have applicability well beyond such embodiment, which can be appreciated by those skilled in the art. Accordingly, the scope of the present disclosure is defined by the appended claims rather than the forgoing description of embodiments.

We claim:

1. Tangible, non-transitory computer-readable medium having stored thereon instructions that, when executed by one or more processors of a first playback device, cause the first playback device to perform functions comprising:
    entering a playback zone with a second playback device, wherein entering the playback zone comprises:
        determining a first maximum sound pressure level (SPL) capability of the first playback device while in the playback zone based on (i) an output frequency characteristic of the first playback device, and (ii) an output frequency range characteristic of the second playback device; and
        determining a first gain parameter for the first playback device while in the playback zone based on the first maximum SPL capability;
    after entering the playback zone, receiving a first audio signal comprising a first audio frequency channel corresponding to the output frequency range of the second playback device and a second audio frequency channel different from the first audio frequency channel;
    based on receiving the first audio signal (i) applying the first gain parameter to the second audio frequency channel of the first audio signal when playing the first audio frequency channel, and (ii) transmitting the first audio frequency channel of the first audio signal to the second playback device for playback by the second playback device in synchrony with playback of the first audio frequency channel by the first playback device;
    leaving the playback zone such that the first playback device is no longer in the playback zone with the second playback device, wherein leaving the playback zone comprises:
        determining a second maximum SPL capability of the first playback device based on the output frequency characteristic of the first playback device, wherein the second maximum SPL capability is lower than the first maximum SPL capability; and
        determining a second gain parameter for the first playback device based on the second maximum SPL capability;
    after leaving the playback zone, receiving a second audio signal; and
    based on receiving the second audio signal, applying the second gain parameter to the second audio signal when playing the second audio signal.

2. The tangible, non-transitory computer-readable medium of claim 1, wherein the second audio signal is the same as the first audio signal.

3. The tangible, non-transitory computer-readable medium of claim 1, wherein the second audio signal comprises a third audio frequency channel and a fourth audio frequency channel different from the third audio frequency channel, and wherein applying the second gain parameter to the second audio signal when playing the second audio signal comprises applying the second gain parameter to both the third audio frequency channel and the fourth audio frequency channel.

4. The tangible, non-transitory computer-readable medium of claim 1, wherein the first playback device is a full-range playback device and the second playback device is a subwoofer device.

5. The tangible, non-transitory computer-readable medium of claim 1, wherein the first playback device comprises a plurality of transducers, and wherein determining the first SPL capability of the first playback device comprises determining the first SPL capability further based on characteristics of each of the plurality of transducers.

6. The tangible, non-transitory computer-readable medium of claim 1, wherein the playback zone further comprises a third playback device, and wherein leaving the playback zone further comprises determining the second maximum SPL capability of the first playback device based further on an output frequency characteristic of the third playback device.

7. The tangible, non-transitory computer-readable medium of claim 1, wherein transmitting the first audio frequency channel of the first audio signal to the second playback device comprises transmitting the first audio frequency channel of the first audio signal to the second playback device via a wireless connection.

8. The tangible, non-transitory computer-readable medium of claim 1, wherein the functions further comprise:
prior to entering the playback zone, receiving via a wireless connection from a controller device, a command to form the playback zone, wherein the command identifies the first playback device and the second playback device, and wherein entering the playback zone comprises entering the playback zone in response to receiving the command.

9. The tangible, non-transitory computer-readable medium of claim 1, wherein receiving the first audio signal comprises:
receiving via a wireless connection from a controller device, data indicating a network address from which the first audio signal is to be retrieved; and
receiving the first audio signal from the network address.

10. A first playback device comprising:
one or more processors; and
tangible, non-transitory computer-readable medium having stored thereon instructions that, when executed by the one or more processors of the first playback device, cause the first playback device to perform functions comprising:
entering a playback zone with a second playback device, wherein entering the playback zone comprises:
determining a first maximum sound pressure level (SPL) capability of the first playback device while in the playback zone based on (i) an output frequency characteristic of the first playback device, and (ii) an output frequency range characteristic of the second playback device; and
determining a first gain parameter for the first playback device while in the playback zone based on the first maximum SPL capability;
after entering the playback zone, receiving a first audio signal comprising a first audio frequency channel corresponding to the output frequency range of the second playback device and a second audio frequency channel different from the first audio frequency channel;
based on receiving the first audio signal (i) applying the first gain parameter to the second audio frequency channel of the first audio signal when playing the first audio frequency channel, and (ii) transmitting the first audio frequency channel of the first audio signal to the second playback device for playback by the second playback device in synchrony with playback of the first audio frequency channel by the first playback device;
leaving the playback zone such that the first playback device is no longer in the playback zone with the second playback device, wherein leaving the playback zone comprises:
determining a second maximum SPL capability of the first playback device based on the output frequency characteristic of the first playback device, wherein the second maximum SPL capability is lower than the first maximum SPL capability; and
determining a second gain parameter for the first playback device based on the second maximum SPL capability;
after leaving the playback zone, receiving a second audio signal; and
based on receiving the second audio signal, applying the second gain parameter to the second audio signal when playing the second audio signal.

11. The first playback device of claim 10, wherein the second audio signal is the same as the first audio signal.

12. The first playback device of claim 10, wherein the second audio signal comprises a third audio frequency channel and a fourth audio frequency channel different from the third audio frequency channel, and wherein applying the second gain parameter to the second audio signal when playing the second audio signal comprises applying the second gain parameter to both the third audio frequency channel and the a fourth audio frequency channel.

13. The first playback device of claim 10, wherein the first playback device is a full-range playback device and the second playback device is a subwoofer device.

14. The first playback device of claim 10, wherein the first playback device comprises a plurality of transducers, and wherein determining the first SPL capability of the first playback device comprises determining the first SPL capability further based on characteristics of each of the plurality of transducers.

15. The first playback device of claim 10, wherein the playback zone further comprises a third playback device, and wherein leaving the playback zone further comprises determining the second maximum SPL capability of the first playback device based further on an output frequency characteristic of the third playback device.

16. The first playback device of claim 10, wherein transmitting the first audio frequency channel of the first audio signal to the second playback device comprises transmitting the first audio frequency channel of the first audio signal to the second playback device via a wireless connection.

17. A method comprising:
entering, by a first playback device, a playback zone with a second playback device, wherein entering the playback zone comprises:
determining, by the first playback device, a first maximum sound pressure level (SPL) capability of the first playback device while in the playback zone based on (i) an output frequency characteristic of the first playback device, and (ii) an output frequency range characteristic of the second playback device; and determining, by the first playback device, a first gain parameter for the first playback device while in the playback zone based on the first maximum SPL capability;

after entering the playback zone, receiving, by the first playback device, a first audio signal comprising a first audio frequency channel corresponding to the output frequency range of the second playback device and a second audio frequency channel different from the first audio frequency channel;

based on receiving the first audio signal (i) applying, by the first playback device, the first gain parameter to the second audio frequency channel of the first audio signal when playing the first audio frequency channel, and (ii) transmitting, by the first playback device, the first audio frequency channel of the first audio signal to the second playback device for playback by the second playback device in synchrony with playback of the first audio frequency channel by the first playback device;

leaving, by the first playback device, the playback zone such that the first playback device is no longer in the playback zone with the second playback device, wherein leaving the playback zone comprises:

determining, by the first playback device, a second maximum SPL capability of the first playback device based on the output frequency characteristic of the first playback device, wherein the second maximum SPL capability is lower than the first maximum SPL capability; and determining, by the first playback device, a second gain parameter for the first playback device based on the second maximum SPL capability;

after leaving the playback zone, receiving, by the first playback device, a second audio signal; and based on receiving the second audio signal, applying, by the first playback device, the second gain parameter to the second audio signal when playing the second audio signal.

18. The method of claim 17, wherein the second audio signal comprises a third audio frequency channel and a fourth audio frequency channel different from the third audio frequency channel, and wherein applying, by the first playback device, the second gain parameter to the second audio signal when playing the second audio signal comprises applying, by the first playback device, the second gain parameter to both the third audio frequency channel and the fourth audio frequency channel.

19. The method of claim 17, wherein the first playback device is a full-range playback device and the second playback device is a subwoofer device.

20. The method of claim 17, wherein the playback zone further comprises a third playback device, and wherein leaving, by the first playback device, the playback zone further comprises determining, by the first playback device, the second maximum SPL capability of the first playback device based further on an output frequency characteristic of the third playback device.

* * * * *